(12) United States Patent
Kim

(10) Patent No.: US 8,490,678 B2
(45) Date of Patent: Jul. 23, 2013

(54) SILICON-BASED THERMAL ENERGY TRANSFER DEVICE AND APPARATUS

(76) Inventor: Gerald Ho Kim, Carlsbad, CA (US)

( * ) Notice: Subject to any disclaimer, the term of this patent is extended or adjusted under 35 U.S.C. 154(b) by 1026 days.

(21) Appl. No.: 12/476,246

(22) Filed: Jun. 1, 2009

(65) Prior Publication Data

US 2010/0000718 A1    Jan. 7, 2010

Related U.S. Application Data

(60) Provisional application No. 61/130,676, filed on Jun. 2, 2008, provisional application No. 61/176,472, filed on May 7, 2009.

(51) Int. Cl.
*F28F 7/00* (2006.01)
*F28F 3/14* (2006.01)
*H05K 7/20* (2006.01)

(52) U.S. Cl.
USPC .......... 165/80.2; 165/80.4; 165/170; 361/699

(58) Field of Classification Search
USPC .................. 165/170, 169, 80.4, 104.33, 80.2, 165/168; 361/699
See application file for complete search history.

(56) References Cited

U.S. PATENT DOCUMENTS

| | | | |
|---|---|---|---|
| 3,522,530 A * | 8/1970 | Muller | 324/694 |
| 4,897,711 A | 1/1990 | Blonder et al. | |
| 5,081,639 A | 1/1992 | Snyder et al. | |
| 5,099,910 A * | 3/1992 | Walpole et al. | 165/80.4 |
| 5,181,216 A | 1/1993 | Ackerman et al. | |
| 5,270,870 A | 12/1993 | O'Brien et al. | |
| 5,592,363 A * | 1/1997 | Atarashi et al. | 361/689 |
| 5,828,683 A | 10/1998 | Freitas | |
| 5,907,151 A | 5/1999 | Gramann et al. | |
| 5,963,577 A | 10/1999 | Snyder et al. | |
| 5,977,785 A * | 11/1999 | Burward-Hoy | 324/750.09 |
| 6,230,791 B1 * | 5/2001 | Van Dine et al. | 165/80.4 |
| 6,295,307 B1 | 9/2001 | Hoden et al. | |
| 6,396,857 B1 | 5/2002 | Labranche et al. | |
| 6,625,188 B2 | 9/2003 | Ono et al. | |
| 6,647,035 B1 * | 11/2003 | Freitas et al. | 372/36 |
| 6,942,019 B2 * | 9/2005 | Pikovsky et al. | 165/80.4 |
| 7,227,753 B2 * | 6/2007 | Weber et al. | 361/700 |
| 7,508,065 B2 | 3/2009 | Sherrer et al. | |
| 7,589,898 B2 | 9/2009 | Shigemura et al. | |
| 7,836,940 B2 * | 11/2010 | Campbell et al. | 165/80.4 |

(Continued)

OTHER PUBLICATIONS

USPTO, Notice of Allowability in U.S. Appl. No. 12/546,287, Apr. 2, 2012, pp. 2-3.

*Primary Examiner* — Allen Flanigan
*Assistant Examiner* — Jason Thompson
(74) *Attorney, Agent, or Firm* — Han IP Law PLLC

(57) ABSTRACT

A thermal energy transfer device attached to an object to dissipate thermal energy from the object is provided. The thermal energy transfer device includes a non-metal base plate and a first non-metal fin structure. The base plate has a first primary surface and a second primary surface opposite the first primary surface, and includes at least one groove on the first primary surface. The fin structure has a first primary surface, a second primary surface opposite the first primary surface, and a plurality of edges that are between the first and the second primary surfaces including a first edge. The first fin structure is attached to the base plate with the first edge received in a first groove of the at least one groove of the base plate.

15 Claims, 56 Drawing Sheets

U.S. PATENT DOCUMENTS

| | | |
|---|---|---|
| 7,864,825 B2 | 1/2011 | Thiagarajan et al. |
| 7,900,692 B2 * | 3/2011 | Miyahara ............... 165/104.26 |
| 8,018,656 B2 | 9/2011 | Ito |
| 2001/0011585 A1 * | 8/2001 | Cassidy et al. ............... 165/46 |
| 2004/0013140 A1 | 1/2004 | Ono et al. |
| 2004/0160675 A1 | 8/2004 | Nemoto et al. |
| 2005/0167085 A1 * | 8/2005 | Chu et al. ................. 165/80.3 |
| 2005/0201063 A1 * | 9/2005 | Lee et al. ................... 361/715 |
| 2006/0001055 A1 | 1/2006 | Ueno et al. |
| 2006/0138455 A1 * | 6/2006 | Saxler ........................ 257/194 |
| 2007/0158050 A1 * | 7/2007 | Norley et al. .............. 165/80.4 |
| 2007/0238219 A1 * | 10/2007 | Bennett et al. ............. 438/106 |
| 2008/0029244 A1 * | 2/2008 | Gilliland et al. ........... 165/80.4 |
| 2008/0217640 A1 | 9/2008 | Suzuki et al. |
| 2009/0121253 A1 | 5/2009 | Abe |
| 2009/0309116 A1 | 12/2009 | Kato et al. |
| 2010/0046569 A1 | 2/2010 | Kim |

* cited by examiner

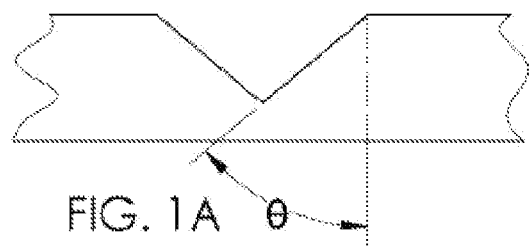
FIG. 1A θ
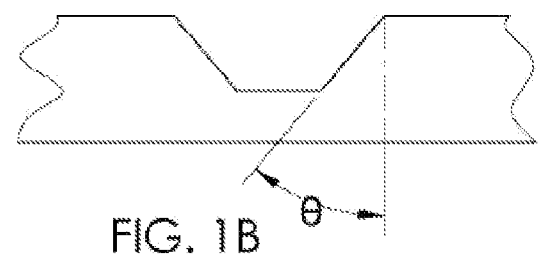
FIG. 1B θ
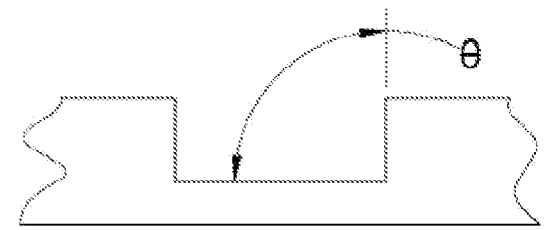
FIG. 1C
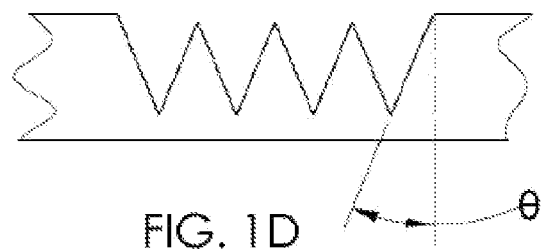
FIG. 1D θ

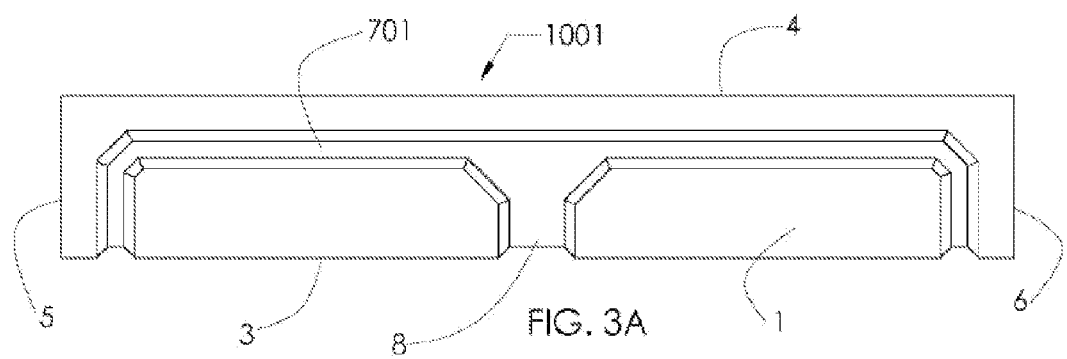
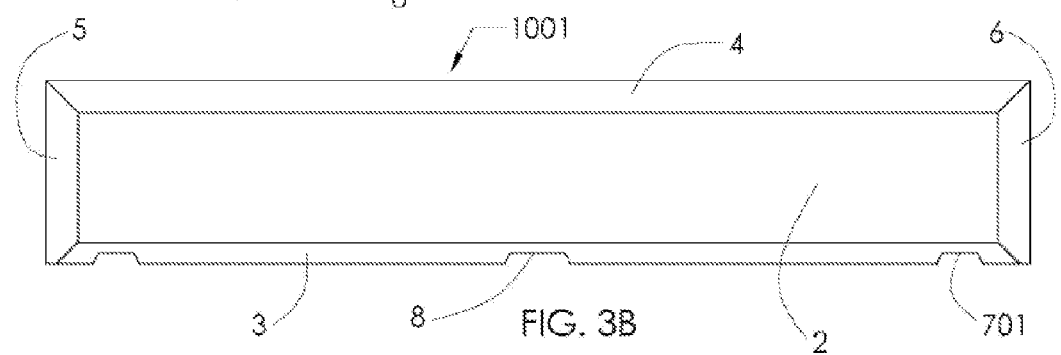
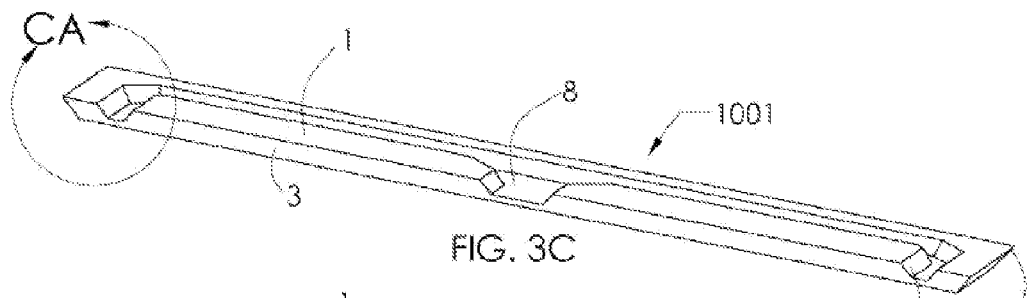
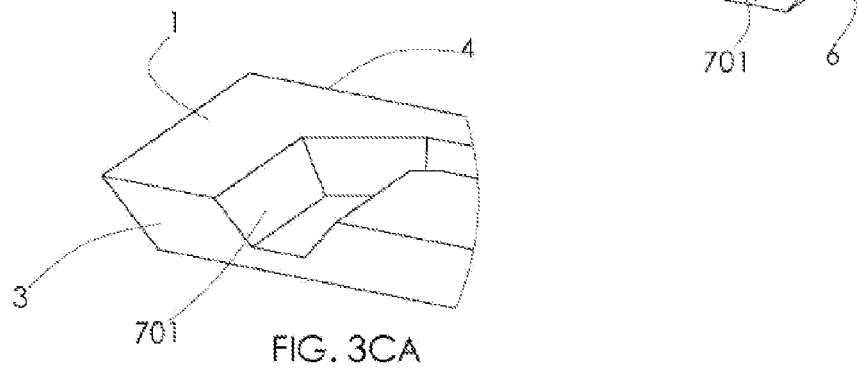

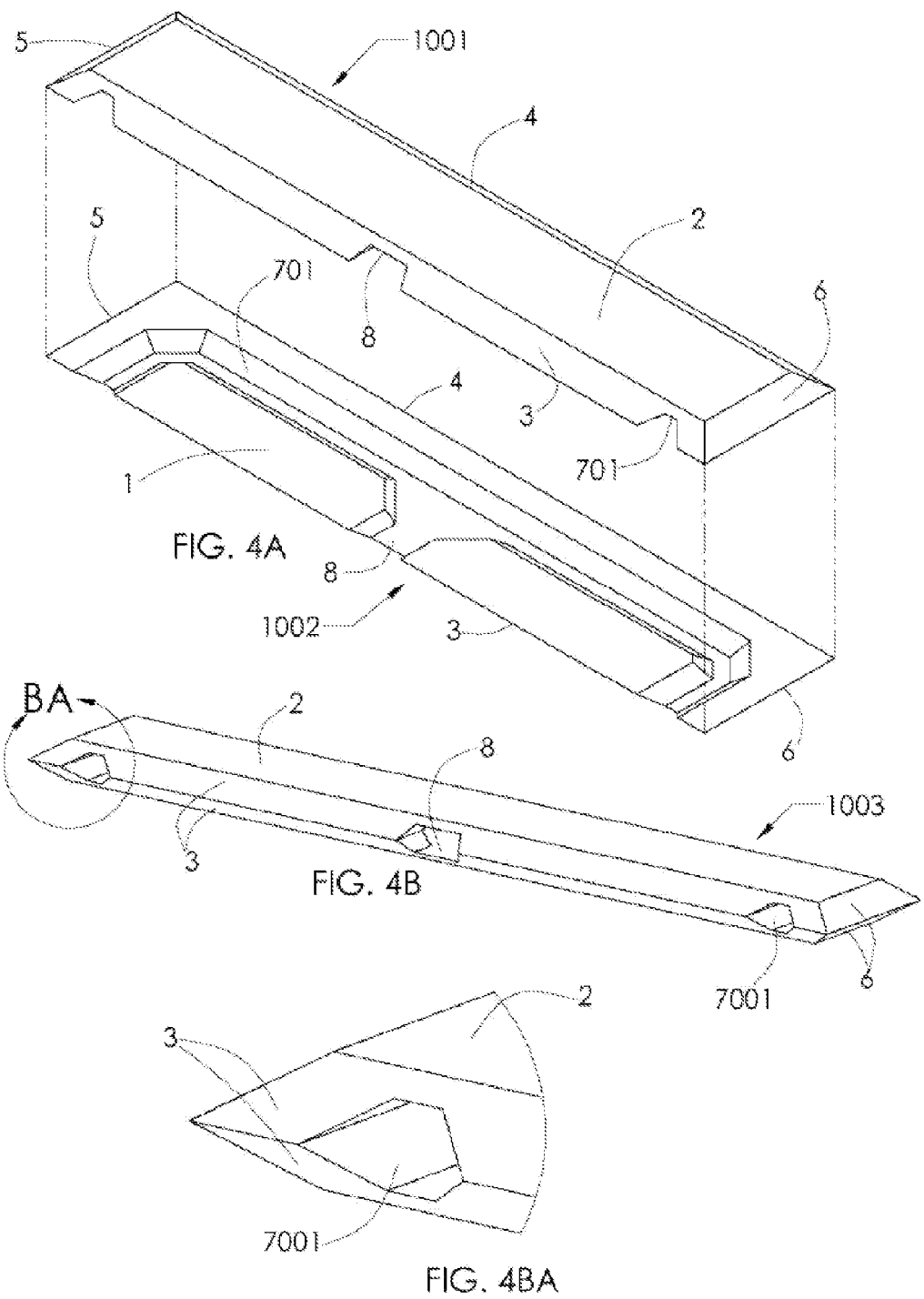

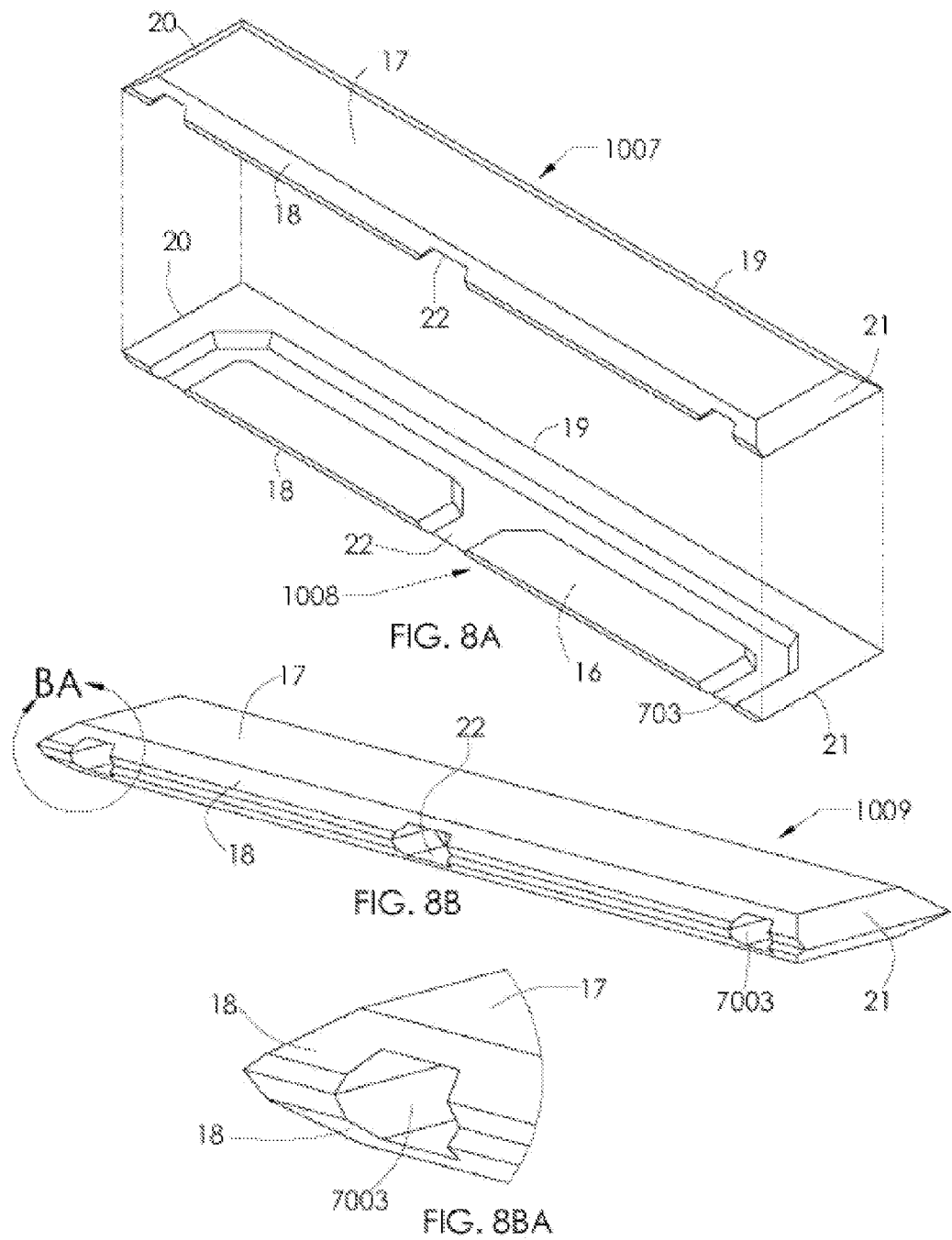

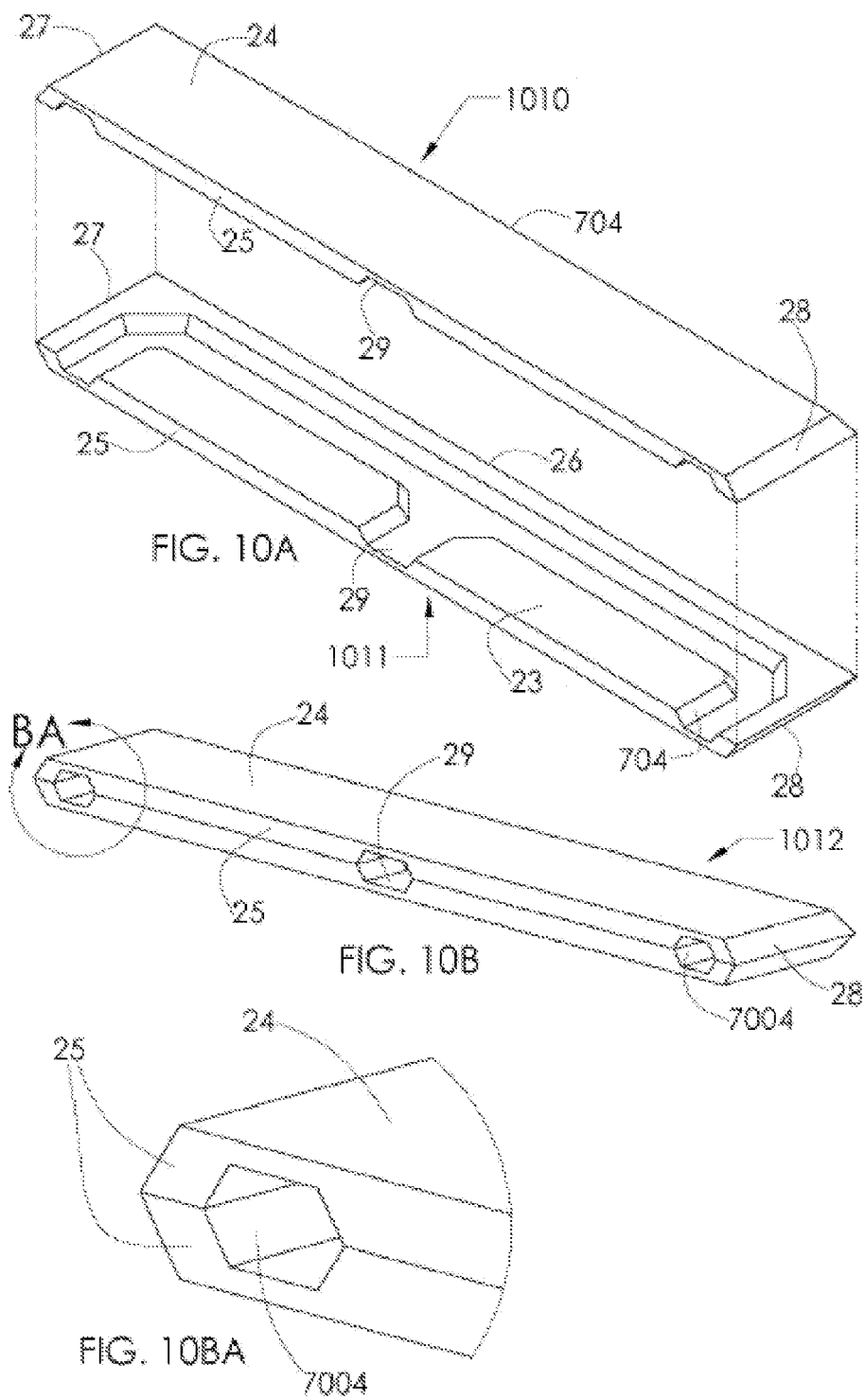

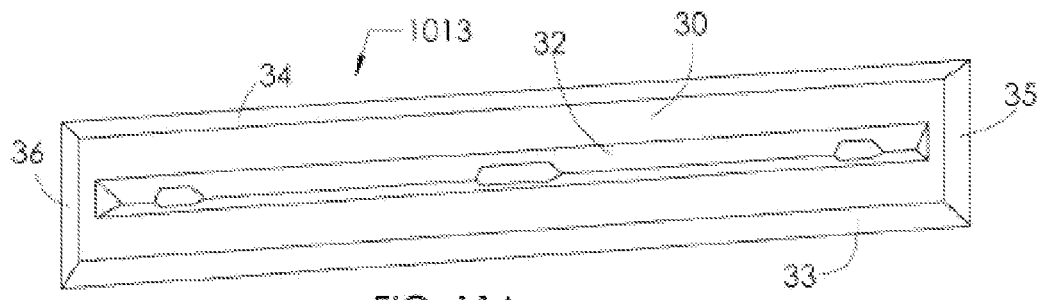
FIG. 11A
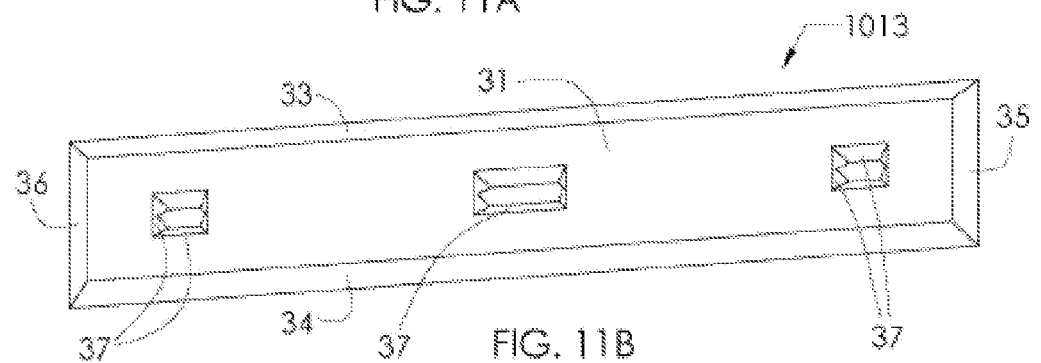
FIG. 11B
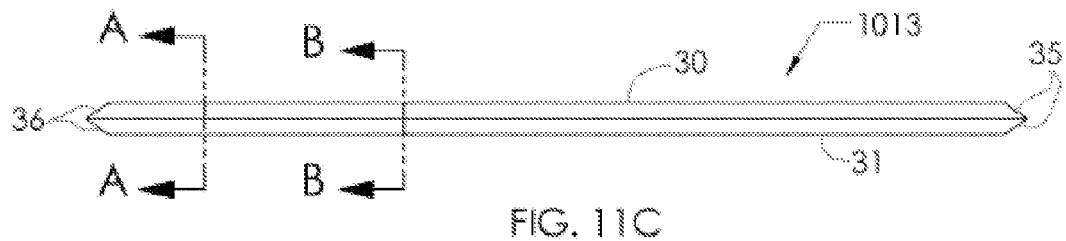
FIG. 11C
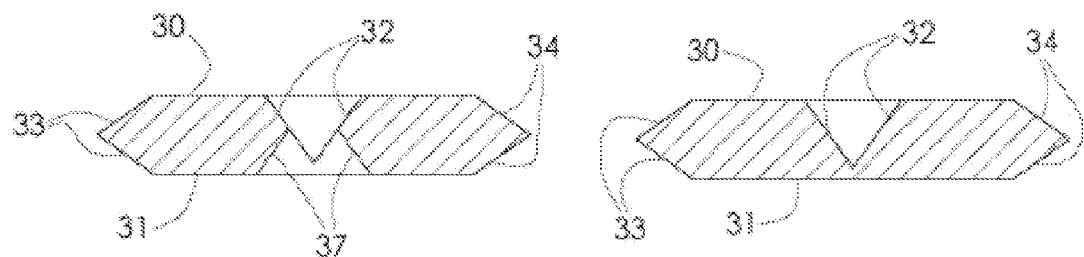
FIG. 11CA
FIG. 11CB

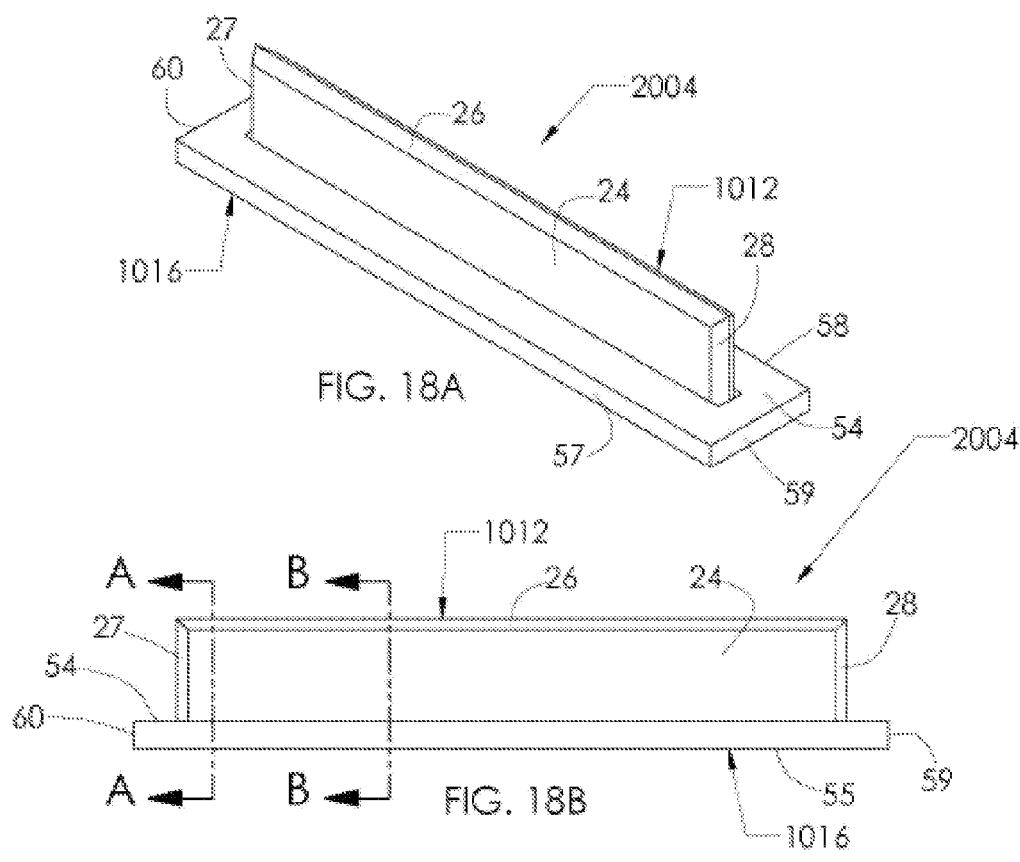
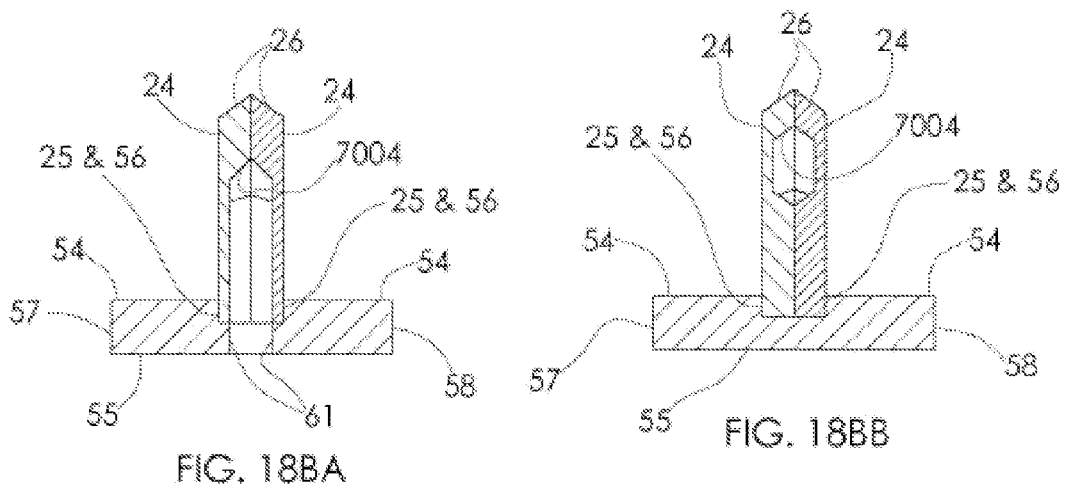

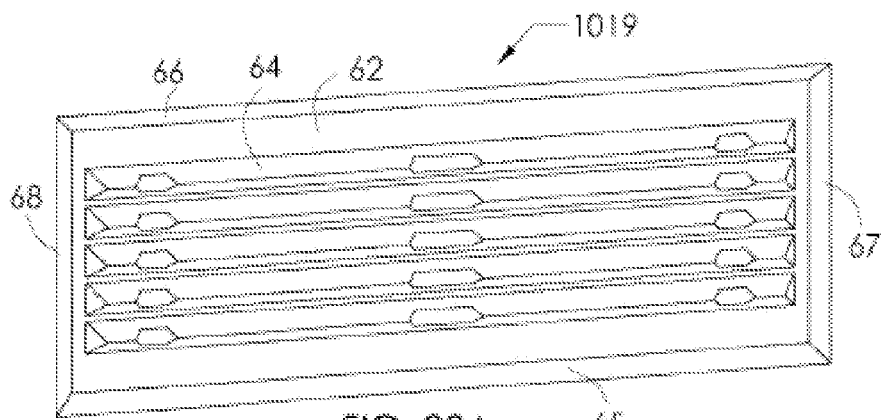
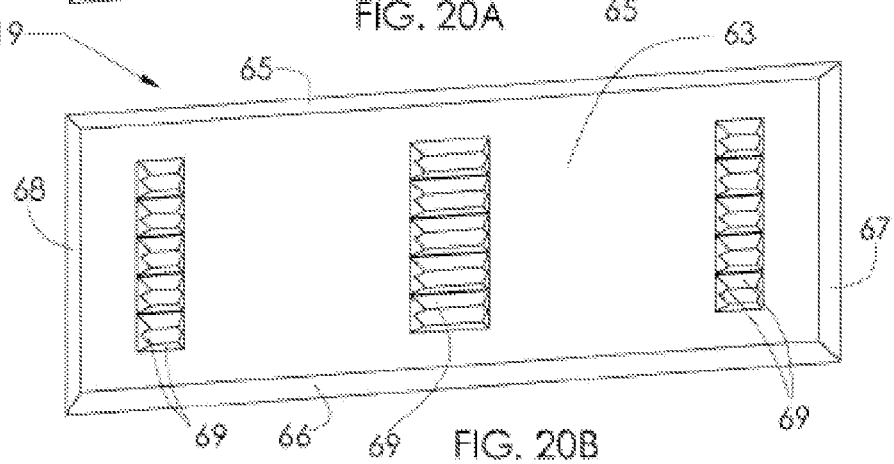
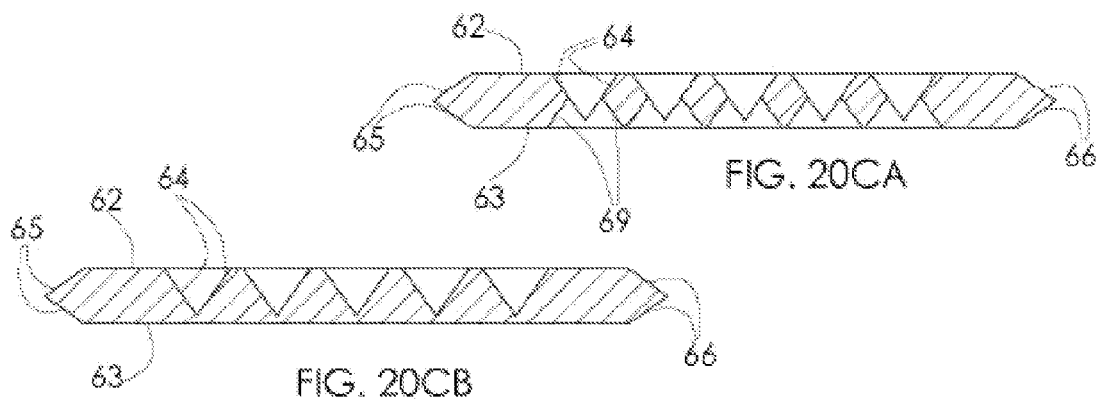

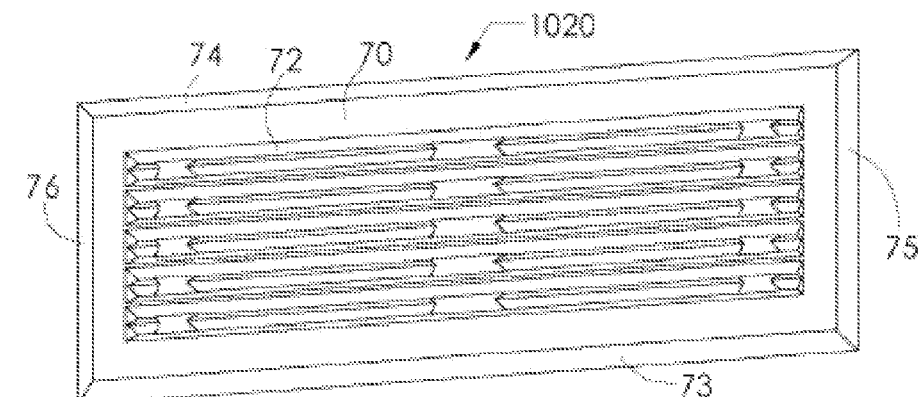
FIG. 21A
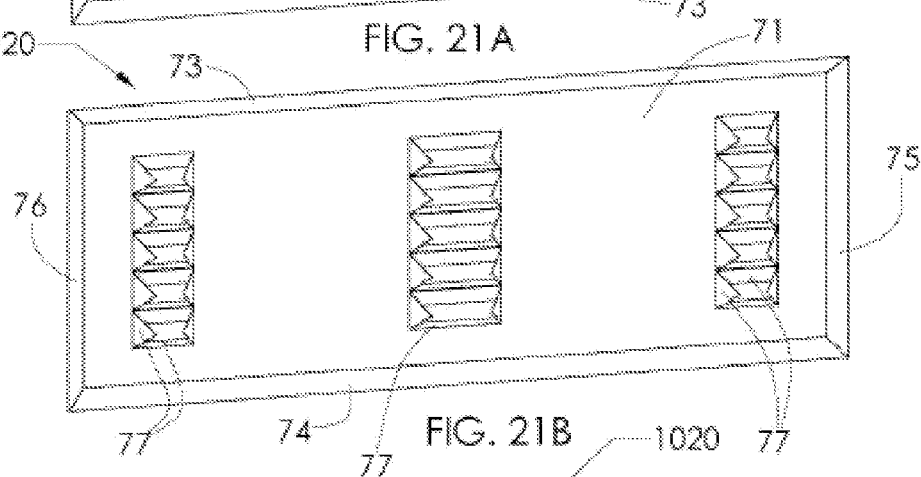
FIG. 21B
FIG. 21C
FIG. 21CA
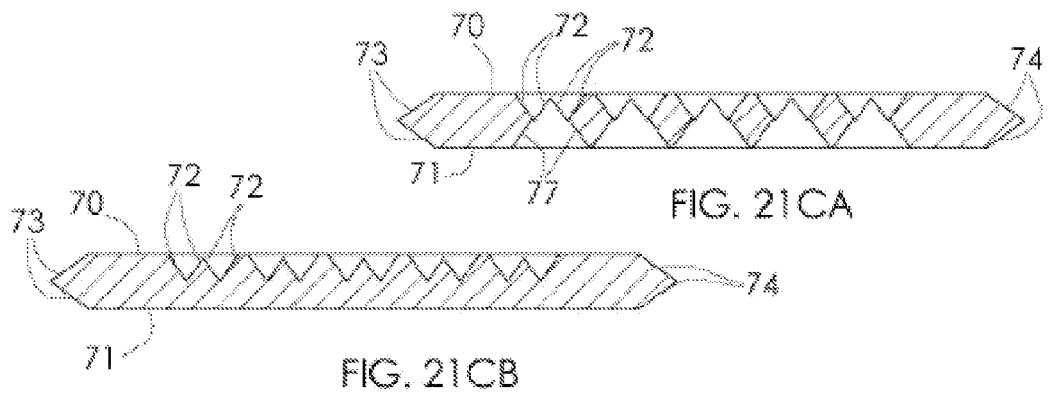
FIG. 21CB

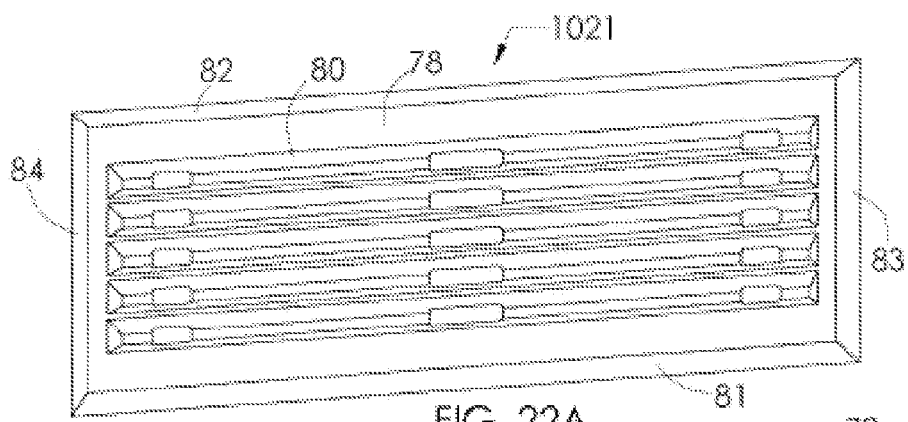
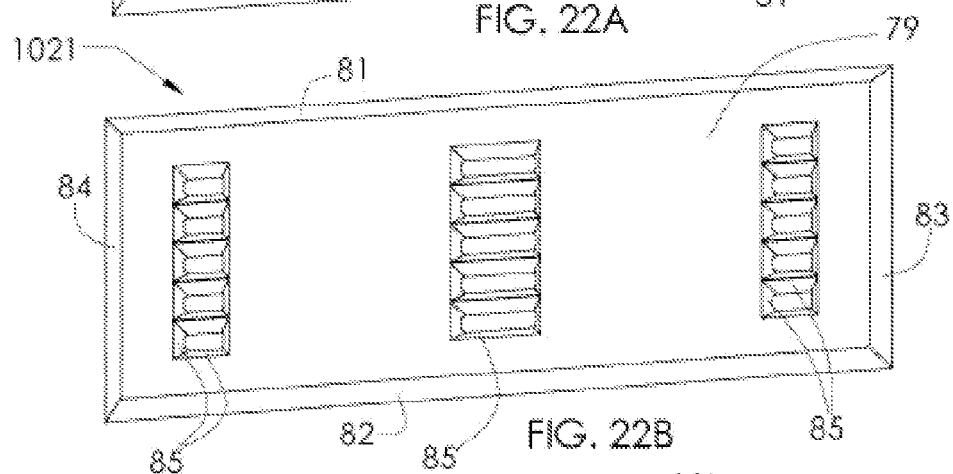
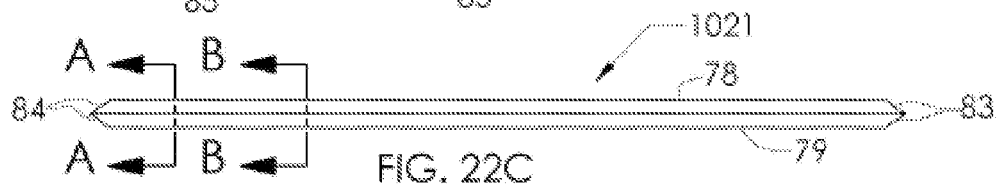
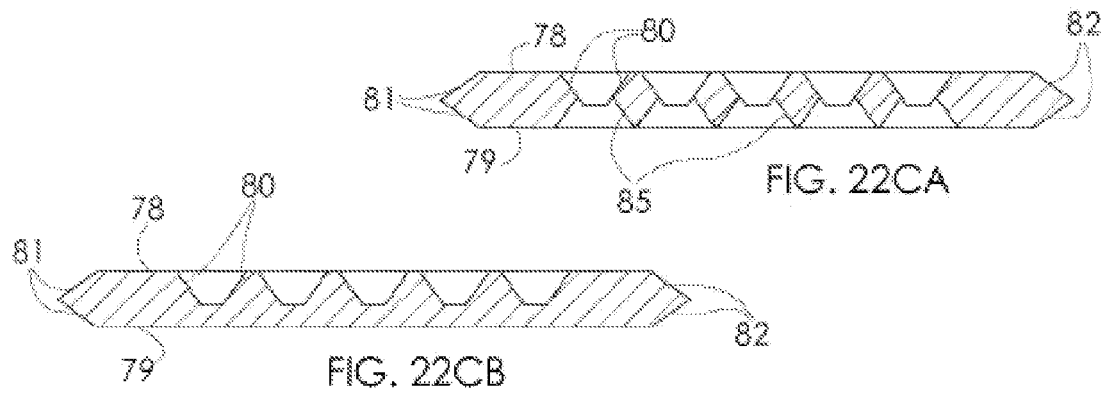

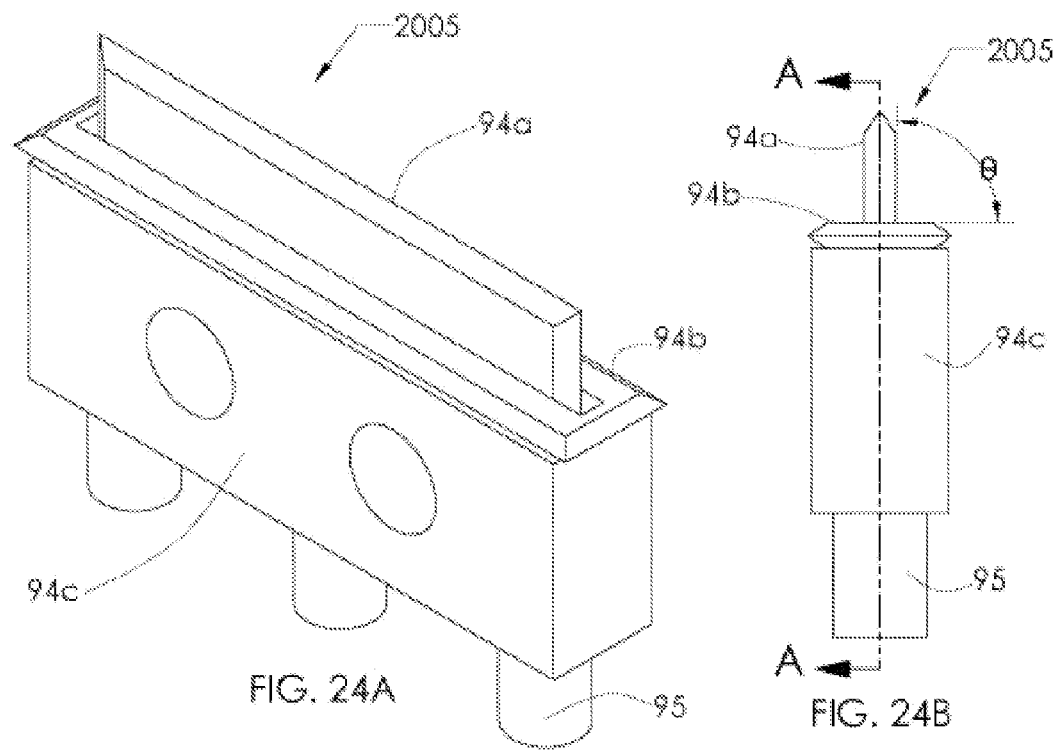
FIG. 24A
FIG. 24B
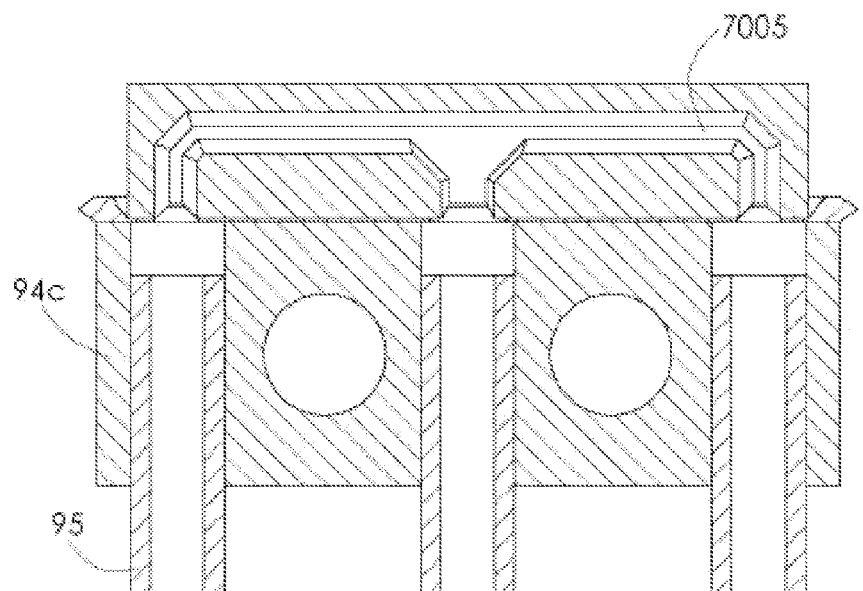
FIG. 24BA

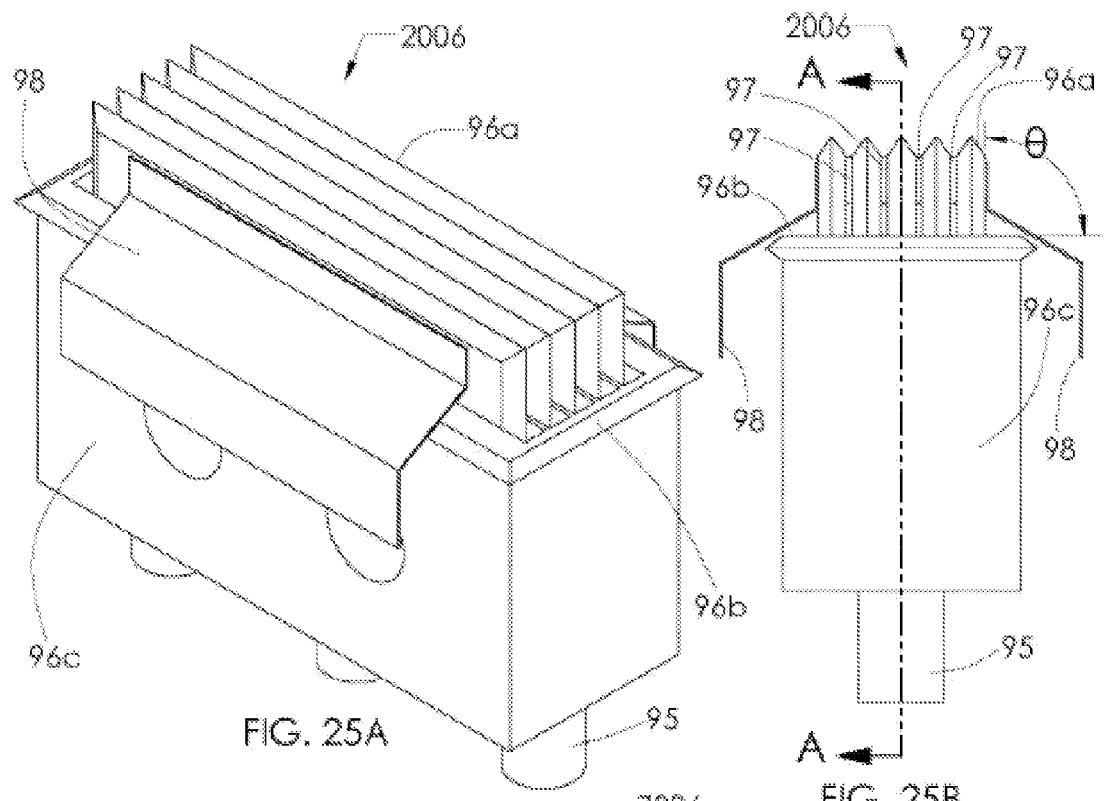
FIG. 25A
FIG. 25B
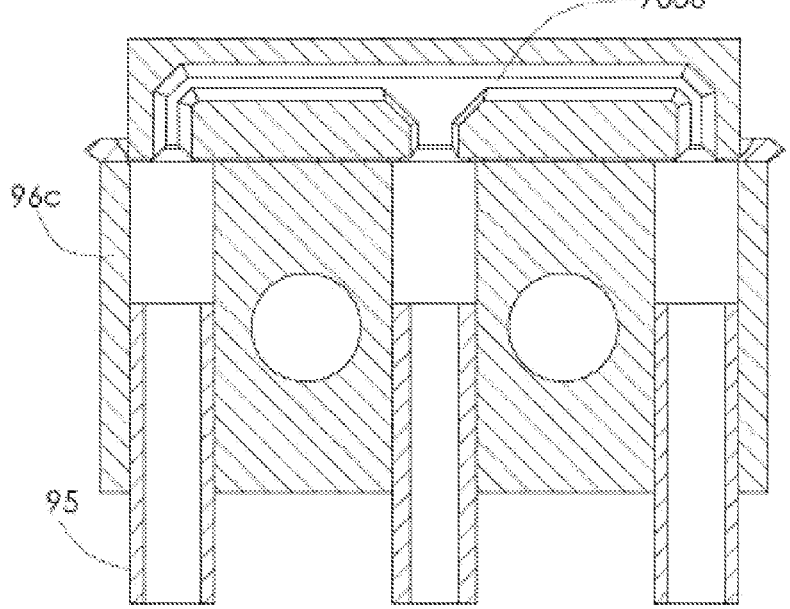
FIG. 25BA

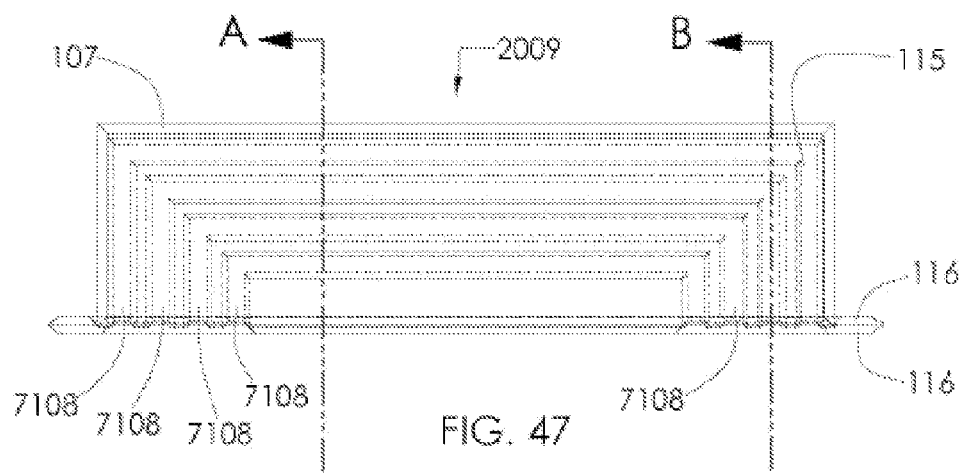
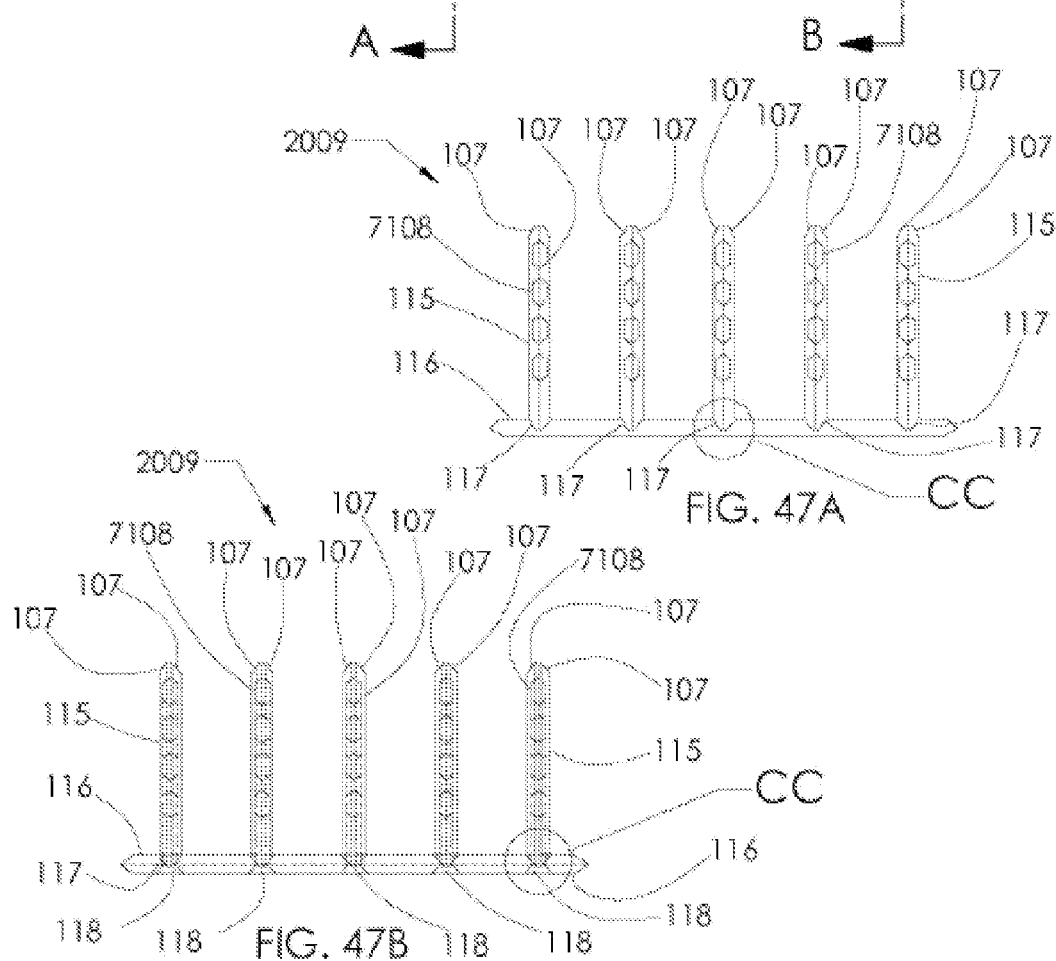

SILICON-BASED THERMAL ENERGY TRANSFER DEVICE AND APPARATUS

CROSS-REFERENCE TO RELATED APPLICATION

This application claims the benefit under 35 U.S.C. .sctn.119(e) of U.S. Provisional Patent Application Ser. No. 61/130,676, filed Jun. 2, 2008, entitled "Silicon V-Groove Interlocked Macro Liquid Channel Cooling Device", and U.S. Provisional Patent Application Ser. No. 61/176,472, filed May 7, 2009, entitled "Silicon-Based Heat Exchanger Devices and Construction Methods Thereof", which are incorporated herein by reference in their entirety.

BACKGROUND

1. Technical Field

The present disclosure generally relates to the field of transfer of thermal energy and, more particularly, to removal of thermal energy from compact, high-density heat-generating components.

2. Description of the Related Art

In general, electronic components generate thermal energy, or heat, when in operation. Such electronic components may include, for example, microprocessors, memory chips, graphic chips, application-specific integrated circuit (ASIC) chips, laser diodes, solar cells and the like. This heat must be removed, or dissipated, in order to achieve optimum performance and keep the electronic components within their safe operating temperature. With the form factor of electronic components and the applications they are implemented in becoming ever more compact, it is imperative to dissipate the high-density heat generated in a small footprint area to ensure safe operation of such heat-generating electronic components.

In applications that involve lasers, for example, significant challenges exist in the development of a highly efficient and compact package design of a heat dissipation mechanism to dissipate more than 1 kilowatt per squared centimeter (1 kW/cm.sup.2). As another example, in solar cell panels, where solar cells are exposed to sunlight and from which solar energy is extracted, the amount of solar energy produced by each solar cell is limited by the heat dissipation mechanism of the design of the solar cell panel. That is, a solar cell needs to be kept within a certain temperature range in order to maintain optimum energy conversion efficiency.

Many metal-based water-cooled and air-cooled heat dissipation packages have been developed for use in compact packages to dissipate heat generated by electronic components. For instance, heat exchangers and heat pipes made of a material with high thermal conductivity, such as copper, aluminum or iron, are commercially available. However, most metal-based heat exchangers and heat pipes experience oxidation, corrosion and/or crystallization after long periods of operation. Such fouling factors significantly reduce the heat transfer efficiency of metal-based heat exchangers and heat pipes. Other problems associated with the use of metal-based heat dissipation packages include, for example, difficulty in precision alignment in mounting bar laser diodes in laser diode cooling applications, issues with overall compactness of the package, corrosion of the metallic material in water-cooled applications, difficulty in manufacturing, etc. Yet, increasing demand for higher power density in small packages motivates the production of a compact cooling package with fewer or none of the aforementioned issues.

BRIEF SUMMARY

In one aspect, a thermal energy transfer device attached to an object to dissipate thermal energy from the object may be summarized as including a non-metal base plate having a first primary surface and a second primary surface opposite the first primary surface, the base plate including at least one groove on the first primary surface; and a first non-metal fin structure having a first primary surface, a second primary surface opposite the first primary surface, and a plurality of edges that are between the first and the second primary surfaces including a first edge, the first fin structure attached to the base plate with the first edge received in a first groove of the at least one groove of the base plate. The thermal energy transfer device may further include a second non-metal fin structure having a first primary surface, a second primary surface opposite the first primary surface, and a plurality of edges that are between the first and the second primary surfaces including a first edge, the second fin structure attached to the base plate with the first edge received in a second groove of the at least one groove of the base plate. The first fin structure and the second fin structure may be spaced apart by a distance when attached to the base plate that allows the object to be sandwiched between and in contact with one of the primary surfaces of the first fin structure and one of the primary surfaces of the second fin structure.

The first fin structure may be attached to the base plate by metal soldering, epoxy boding, eutectic bonding, anodic bonding, or diffusion bonding. At least one of the base plate and the first fin structure may be made from a silicon-based material. Alternatively, at least one of the base plate and the first fin structure may be made from a ceramic material. At least one of the first edge of the first fin structure and the first groove of the base plate may be at least partially metalized. At least one of the first primary surface, the second primary surface, and one of the edges of the first fin structure may be at least partially metalized.

The first groove of the base plate may have a cross-sectional contour resembling a V-notch, a trapezoid, a rectangle, a square, or multiple V-notches. The first edge of the first fin structure may have a cross-sectional contour that is substantially complementary to the cross-sectional contour of the first groove.

The first primary surface and the second primary surface of the first fin structure are substantially parallel to one another. The first fin structure may be attached to the base plate at an angle of substantially 90 degrees between the first primary surface of the first fin structure and the first primary surface of the base plate.

The first fin structure may include at least one internal fluid channel through which a fluid enters and exits the first fin structure, the at least one internal fluid channel having at least one inlet and at least one outlet on the first edge. The base plate may include at least one inlet opening and at least one outlet opening in the first groove that are respectively aligned with the at least one inlet and the at least one outlet on the first edge of the first fin structure when the first edge of the first fin structure is received in the first groove of the base plate. A wall thickness between a surface of the internal fluid channel closest to the first primary surface of the first fin structure and the first primary surface of the first fin structure may be less than 200 microns. A wall thickness between a surface of the internal fluid channel closest to the second primary surface of the first fin structure and the second primary surface of the first fin structure may be less than 200 microns. The internal fluid channel may have a cross-sectional area that ranges between 0.004 square millimeters and 10 square millimeters. The first fin structure may include a first fin chip and a second fin chip, each of the first and the second fin chips having recessed portions to form the internal fluid channel when the first and the second fin chips are bonded to form the first fin structure. The first fin chip and the second fin chip may be bonded by metal soldering, epoxy boding, eutectic bonding, anodic bonding, or diffusion bonding.

At least one of the primary surfaces of the first fin structure may have a recessed area configured to receive the object. The at least one of the primary surfaces of the first fin structure having the recessed area may have at least one groove extending from the recessed area to one of the edges of the first fin structure.

In another aspect, a thermal energy transfer device may be summarized as including a base plate having a first primary surface and a second primary surface opposite the first primary surface, the base plate made from a first single-crystal silicon wafer; and a fin structure made from a second single-crystal silicon wafer, the fin structure having a first primary surface, a second primary surface opposite and substantially parallel to the first primary surface, and a plurality of edges that are between the first and the second primary surfaces including a first edge, the first edge of the fin structure attached to the first primary surface of the base plate at an angle greater than 0 degrees between the first primary surface of the base plate and the first primary surface of the fin structure.

The base plate may include a first groove, wherein the first edge of the fin structure is received in the first groove of the base plate when the fin structure is attached to the base plate. An angle between the first primary surface of the base plate and the first primary surface of the fin structure when the first edge of the fin structure is received in the first groove of the base plate may be substantially 90 degrees. At least one of the base plate and the fin structure may include a solar energy collector.

In yet another aspect, a thermal energy transfer apparatus may be summarized as including a silicon-based support module having a plurality of grooves on a first primary surface of the support module; and a plurality of silicon-based fin modules each having a first primary surface, a second primary surface opposite the first primary surface, and a plurality of edges that are between the first and the second primary surfaces including a first edge, the first edge of each fin module received in a respective one of the grooves of the support module to attach the respective fin module substantially orthogonally to the support module. The thermal energy transfer apparatus may further include an active cooler operable to cause turbulence in an ambient fluid surrounding the support module and the fin modules. The thermal energy transfer apparatus may further include a support block attached to a second primary surface of the support module that is opposite the first primary surface of the support module, the support block having at least one inlet cavity and at least one outlet cavity through which a fluid enters and exits the first fin module; and a plurality of fluid tubes each coupled to a respective one of the at least one inlet cavity and the at least one outlet cavity through which the fluid flows. At least one of the first primary surface, the second primary surface, and the plurality of edges of at least one of the fin modules may be at least partially metalized.

A first fin module of the plurality of fin modules may include an internal fluid channel having at least one inlet and at least one outlet on the first edge. The support module may include at least one inlet opening and at least one outlet opening in a first groove of the plurality of grooves in which the first edge of the first fin module is received, the at least one inlet opening aligned with the at least one inlet and the at least one outlet opening aligned with the at least one outlet when the first edge of the first fin module is received in the first groove of the support module. The first fin module of the plurality of fin modules may include a first fin chip, a second fin chip, and a first wicking structure. A primary surface of at least one of the first fin chip and the second fin chip may have recessed portions that form the internal fluid channel when the first and the second fin chips are bonded to form the first fin module. The first wicking structure may be sandwiched between the first fin chip and the second fin chip when the first and the second fin chips are bonded to form the first fin module. The support module may include a first base chip, a second base chip, and a second wicking structure. A primary surface of the first base chip may include the plurality of grooves to receive the plurality of fin modules and further includes a plurality of filling ports through at least one of which a fluid is filled into the support module. A first primary surface of the second base chip may have recessed portions to receive the second wicking structure. The second wicking structure may be sandwiched between the first base chip and the second base chip when the first and the second base chips are bonded to form the support module.

BRIEF DESCRIPTION OF THE SEVERAL VIEWS OF THE DRAWINGS

FIGS. 1A-1D are each a diagram showing a cross-sectional view of a chemically etched groove in a single-crystal silicon wafer according to one non-limiting illustrated embodiment.

FIGS. 3A-3E are each a diagram showing a respective view of a half fin structure chip where all edges of the chip have a half V-notch wedge contour according to one non-limiting illustrated embodiment.

FIGS. 4A-4D are each a diagram showing an assembly view of two half fin structure chips of FIG. 3A to form a fin structure according to one non-limiting illustrated embodiment.

FIGS. 8A-8BA are each a diagram showing an assembly view of two half fin structure chips of FIG. 7A to form a fin structure according to one non-limiting illustrated embodiment.

FIGS. 10A-10BA are each a diagram showing an assembly view of two half fin structure chips of FIG. 9A to form a fin structure according to one non-limiting illustrated embodiment.

FIGS. 11A-11CB are each a diagram showing a respective view of a base plate that has a V-notch groove according to one non-limiting illustrated embodiment.

FIGS. 18A-18BB are each a diagram showing a respective view of a thermal energy transfer device having a fin structure of FIG. 10B attached to a base plate of FIG. 14A according to one non-limiting illustrated embodiment.

FIGS. 20A-20CB are each a diagram showing a respective view of a base plate that has multiple V-notch grooves according to one non-limiting illustrated embodiment.

FIGS. 21A-21CB are each a diagram showing a respective view of a base plate that has multiple double V-notch grooves according to one non-limiting illustrated embodiment.

FIGS. 22A-22CB are each a diagram showing a respective view of a base plate that has multiple trapezoidal grooves according to one non-limiting illustrated embodiment.

FIGS. 24A-24BA are each a diagram showing a respective view of an assembled thermal energy transfer device according to one non-limiting illustrated embodiment.

FIGS. 25A-25BA are each a diagram showing a respective view of an assembled thermal energy transfer device according to another non-limiting illustrated embodiment.

FIGS. 47-47B are each a diagram showing a cross-sectional view of the assembly of FIG. 46 according to one non-limiting illustrated embodiment.

DETAILED DESCRIPTION

Figure 2A:
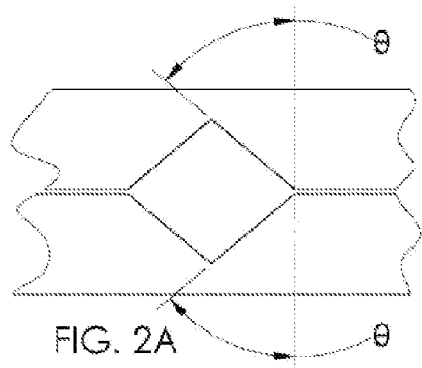
FIGS. 2A-2G are each a diagram showing a cross-sectional view of an internal fluid channel in a fin structure according to one non-limiting illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with diode lasers, solar cells, heat exchangers and heat pipes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Further moreFurthermore, the particular features, structures, or characteristics may be combined in any suitable manner in one or more embodiments.

The headings and Abstract of the Disclosure provided herein are for convenience only and do not interpret the scope or meaning of the embodiments.

Currently, methods to etch a single crystal silicon wafer to make V-notch grooves or V-notch derived grooves are known. A single crystal silicon wafer can be etched to form a V-notch groove, V-notch derived groove, or a rectangular groove on a surface of the silicon wafer. Many V-notch grooves are used, for example, to position or mount fiber optics for precision alignment purposes. Various V-notch groove angles, relative to a plane of a single crystal silicon wafer, can be achieved by etching in an anisotropic chemical process. All of the silicon V-notch groove half angles, units in degrees, are listed in Table 1 below.

TABLE 1

Angles between Crystal Planes

| Angle between planes | <100> plane | <110> plane | <010> plane | <001> plane | <101> plane |
|---|---|---|---|---|---|
| <100> plane | 0.00 | 45.0 | 90.0 | 90.0 | 45.0 |
| <011> plane | 90.0 | 60.0 | 45.0 | 45.0 | 60.0 |
| <111> plane | 54.7 | 35.3 | 54.7 | 54.7 | 35.3 |
| <211> plane | 35.2 | 30.0 | 65.9 | 65.9 | 30.0 |
| <311> plane | 25.2 | 31.4 | 72.4 | 72.4 | 31.4 |
| <511> plane | 15.8 | 35.2 | 78.9 | 78.9 | 35.2 |
| <711> plane | 11.4 | 37.6 | 81.9 | 81.9 | 37.6 |

As will be described in more detail below, V-notch grooves, V-notch derived grooves, and rectangular grooves can be engineered on a base plate component to interlock with other components to support construction of a three-dimensional structure out of a plane on the base plate where one or more grooves are located.

Each of FIGS. 1A-1D illustrates a cross-sectional view of a chemically etched groove in a single-crystal silicon wafer according to one non-limiting illustrated embodiment. FIG. 1A illustrates a cross-sectional view of a V-notch groove on a top surface of a single-crystal silicon wafer etched by potassium hydroxide (KOH) or by other chemical process. The resultant angle θ, 35.3 degrees as measured from a plane orthogonal to the top surface of the silicon wafer as shown in FIG. 1A, is fixed by the <100> crystal plane of the single-crystal silicon wafer. The silicon wafer may also be etched to produce an edge in the form of a V-shaped wedge that is approximately complementary to the V-notch groove etched on the top surface of the silicon wafer. FIG. 1B illustrates a cross-sectional view of a V-notch derived groove etched into a top surface of a single-crystal silicon wafer. The etching process for the groove of FIG. 1B is terminated earlier, compared to the etching process for a V-notch groove similar to that shown in FIG. 1A, to prevent the etched groove in the single-crystal silicon wafer from tapering to a point. As a result, the groove generally has a trapezoidal cross-sectional contour. The angle θ, as measured from a plane orthogonal to the top surface of the silicon wafer, is greater than 0 degrees and less than 90 degrees. FIG. 1C illustrates a cross-sectional view of a rectangular groove etched into a top surface of a single-crystal silicon wafer. The angle θ, approximately 90 degrees as measured from a plane parallel to the top surface of the silicon wafer, is a result of isotropic etching of the silicon wafer that creates a straight vertical wall in the <110> plane of the silicon wafer. As a result, the groove generally has a rectangular or square cross-sectional contour. FIG. 1D illustrates a cross-sectional view of multiple V-notch grooves etched into a top surface of a single-crystal silicon wafer. The angle θ, as measured from a plane orthogonal to the top surface of the silicon wafer, is greater than 0 degrees and less than 90 degrees. Grooves etched into a surface of a silicon wafer, such as those shown in FIGS. 1A-1D for example, may be utilized for attachment of another component or to form fluid channels, as will be described in more detail below.

Figure 2B:
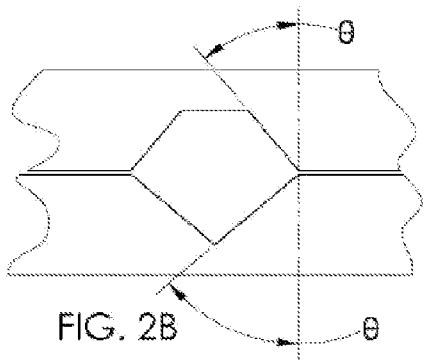
Figure 2C:
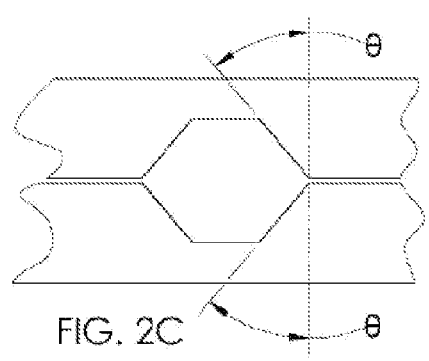
Figure 2D:
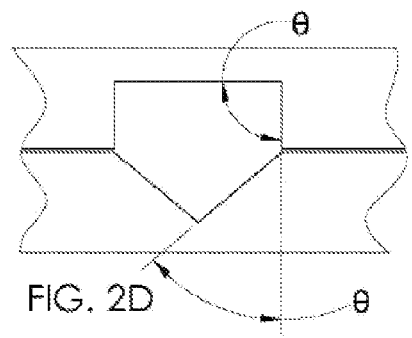
Figure 2E:
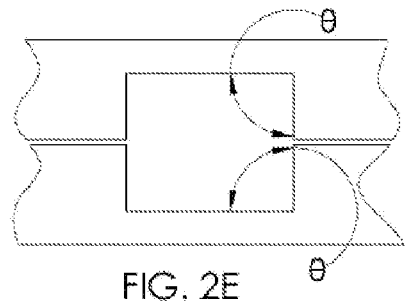
Figure 2F:
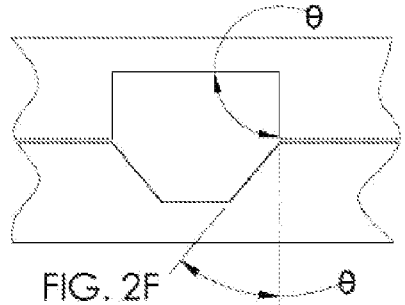
Figure 2G:
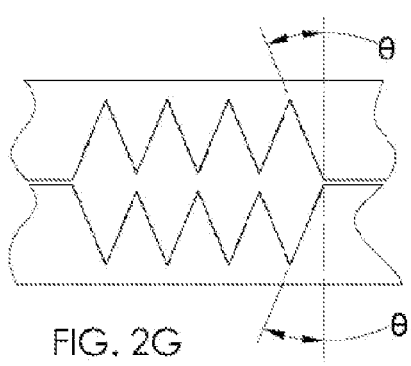

Each of FIGS. 2A-2G illustrates a cross-sectional view of an internal fluid channel in a fin structure according to one non-limiting illustrated embodiment. FIG. 2A illustrates an internal fluid channel formed by bonding two silicon wafers each with an etched V-notch groove, such as that shown in FIG. 1A, with the etched surfaces facing, or adjacent, one another. FIG. 2B illustrates an internal fluid channel formed by bonding two silicon wafers with the etched surfaces adjacent one another, where one silicon wafer is etched to have a V-notch groove, such as that shown in FIG. 1A, and the other etched to have a trapezoidal groove, such as that shown in FIG. 1B. FIG. 2C illustrates an internal fluid channel formed by bonding two silicon wafers each with an etched trapezoidal groove, such as that shown in FIG. 1B, with the etched surfaces adjacent one another. FIG. 2D illustrates an internal fluid channel formed by bonding two silicon wafers with the etched surfaces adjacent one another, where one silicon wafer is etched to have a V-notch groove, such as that shown in FIG. 1A, and the other etched to have a rectangular groove, such as that shown in FIG. 1C. FIG. 2E illustrates an internal fluid channel formed by bonding two silicon wafers each with an etched rectangular groove, such as that shown in FIG. 1C, with the etched surfaces adjacent one another. FIG. 2F illustrates an internal fluid channel formed by bonding two silicon wafers with the etched surfaces adjacent one another, where one silicon wafer is etched to have a trapezoidal groove, such as that shown in FIG. 1B, and the other etched to have a rectangular groove, such as that shown in FIG. 1C. FIG. 2G illustrates an internal fluid channel formed by bonding two silicon wafers each with an etched multiple V-notch grooves, such as that shown in FIG. 1D, with the etched surfaces adjacent one another. In one embodiment, the etched surface of each of the two silicon wafers is either metalized, such as by coating with a layer of metallic material, or epoxied to facilitate the bonding of the two silicon wafers as shown in FIGS. 2A-2G. An internal fluid channel thus formed provides an enclosed channel for a fluid, such as a liquid or gas, to flow through a structure formed by the two bonded silicon wafers.

It should be understood that the various shapes of grooves and channels as illustrated in FIGS. 1A-1D and 2A-2G are only some of the embodiments and should not be construed as an exhaustive listing of all the embodiments within the scope of the present disclosure. Furthermore, although the illustrated embodiments are directed to a single-crystal silicon wafer, other non-metal materials including multi-crystal silicon wafers and ceramic materials, such as beryllium oxide, aluminum oxide, or silicon carbide for example, may be used as the material from which components of the embodiments disclosed herein can be fabricated. Grooves and channels of other shapes achievable by etching or cutting a single-crystal, a multi-crystal silicon wafer, another silicon-based material, or a ceramic material are also within the scope of the present disclosure.

Figure 3D:
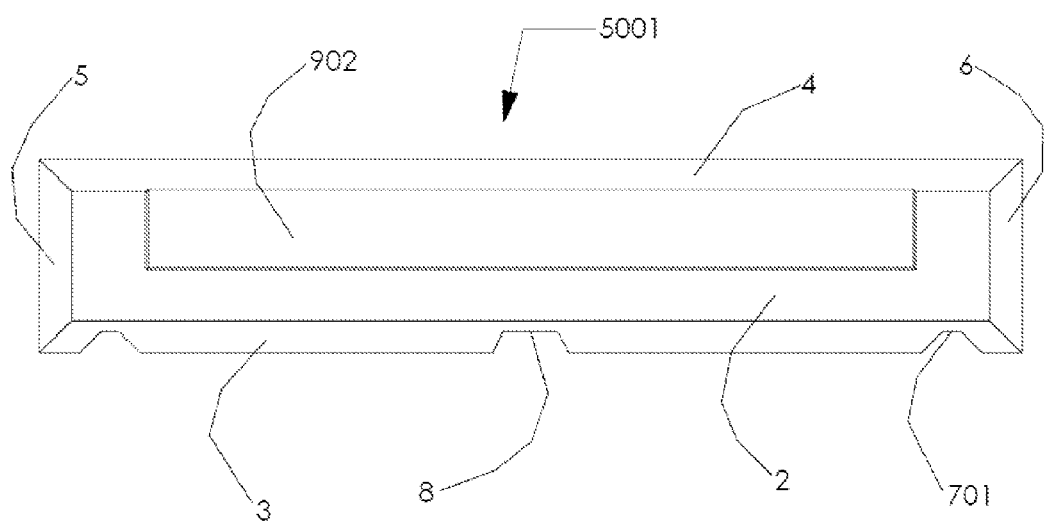

Each of FIGS. 3A-3E illustrates a respective view of a half fin structure chip 1001 where all peripheral edges have a half V-notch wedge contour according to one non-limiting illustrated embodiment. As shown in FIGS. 3A and 3B, the half fin structure chip 1001 includes a first primary surface 1, a second primary surface 2 that is opposite and approximately parallel to the first primary surface 1, and peripheral edges including a front edge 3, a back edge 4, a first side edge 5, and a second side edge 6. In one embodiment, the first primary surface 1 is etched to have recessed portions that form a fluid channel 701 having a thin wall, as shown in FIG. 3A.

In one embodiment, the fluid channel 701 is an E-shaped channel that has three openings, including a middle opening 8, on the front edge 3. The middle opening 8 may serve as an inlet while the other two openings may serve as outlets, for example. In another embodiment, the fluid channel 701 is a U-shaped channel that has two openings on the front edge 3, with one opening serving as the inlet and the other serving as the outlet. In one embodiment, the thickness of the thin wall at the recessed portions of the half fin structure chip 1001 is less than 200 microns. In one embodiment, the thickness of the thin wall at the recessed portions of the half fin structure chip 1001 is within the range of 10 microns to 200 microns.

Figure 3E:
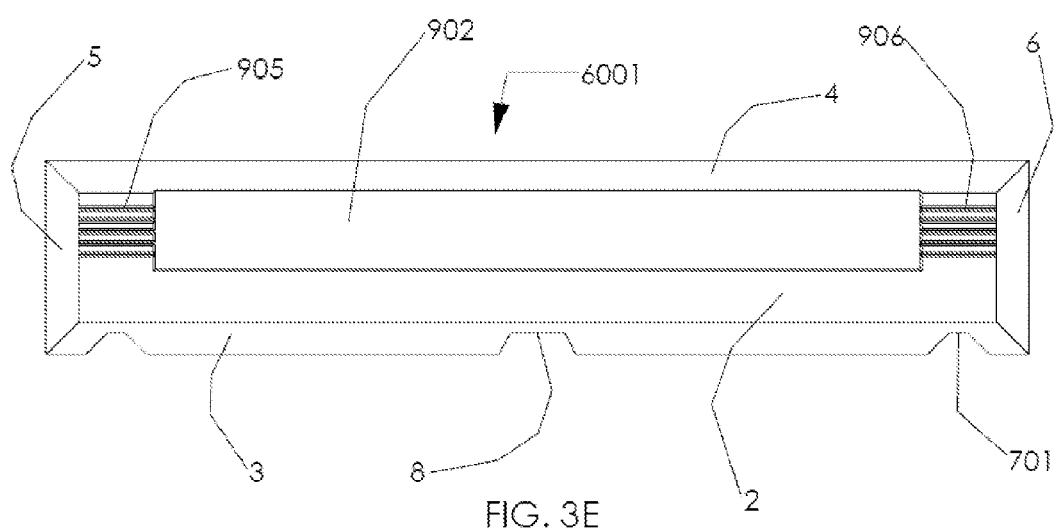

In one embodiment, the peripheral edges 3, 4, 5 and 6 of the half fin structure chip 1001 have a half V-notch wedge contour formed by a chemical etching process. In one embodiment, at least one of the first primary surface 1, the second primary surface 2, and the peripheral edges 3, 4, 5 and 6 is at least partially metalized. In one embodiment, the metalized surface is coated with a layer of copper. In another embodiment, the metalized surface is coated with a layer of TiW/Ni/Au. The half fin structure chip 1001 is made of a non-metal material. In one embodiment, the half fin structure chip 1001 is made from a single-crystal silicon wafer, a multi-crystal silicon wafer, another silicon-based material, or a ceramic material such as, for example, beryllium oxide, aluminum oxide, or silicon carbide. FIG. 3B illustrates the half fin structure chip 1001 as viewed from the side of the second primary surface 2. FIG. 3C illustrates a perspective view of the half fin structure chip 1001. FIG. 3CA illustrates an enlarged sectional view of an opening formed by the fluid channel 701 along the front edge 3 of the half fin structure chip 1001. FIG. 3D illustrates an embodiment of the half fin structure chip 1001, labeled as half fin structure chip, 5001 having a recessed area 902 on the second primary surface 2. FIG. 3E illustrates another embodiment of the half fin structure chip 1001, labeled as half fin structure chip 6001, having a recessed area 902 on the second primary surface 2 and at least one groove, such as the multiple fine grooves 905 and 906 shown in the example, extending orthogonally from the recessed area 902.

Figure 4C:
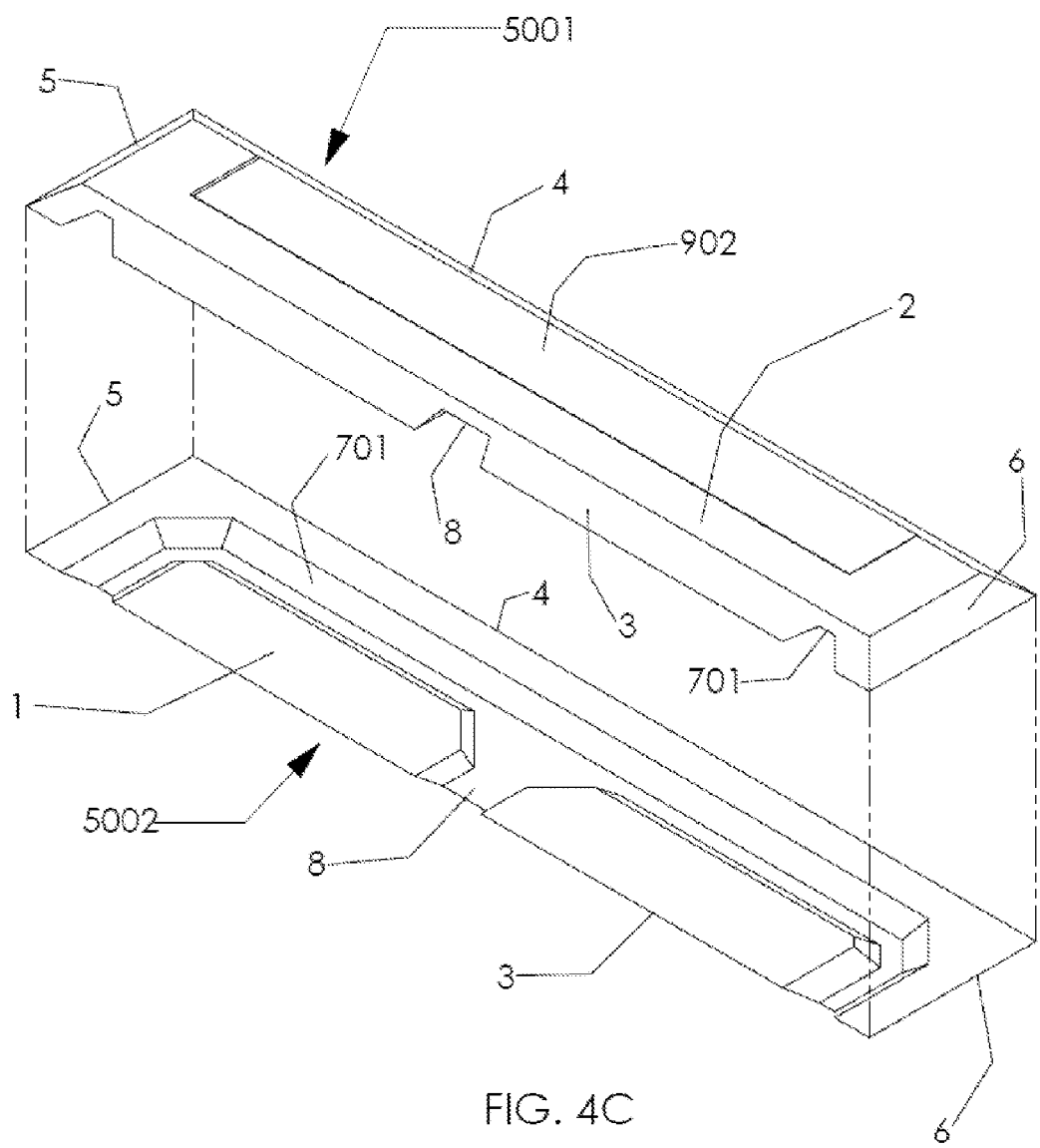
Figure 4D:
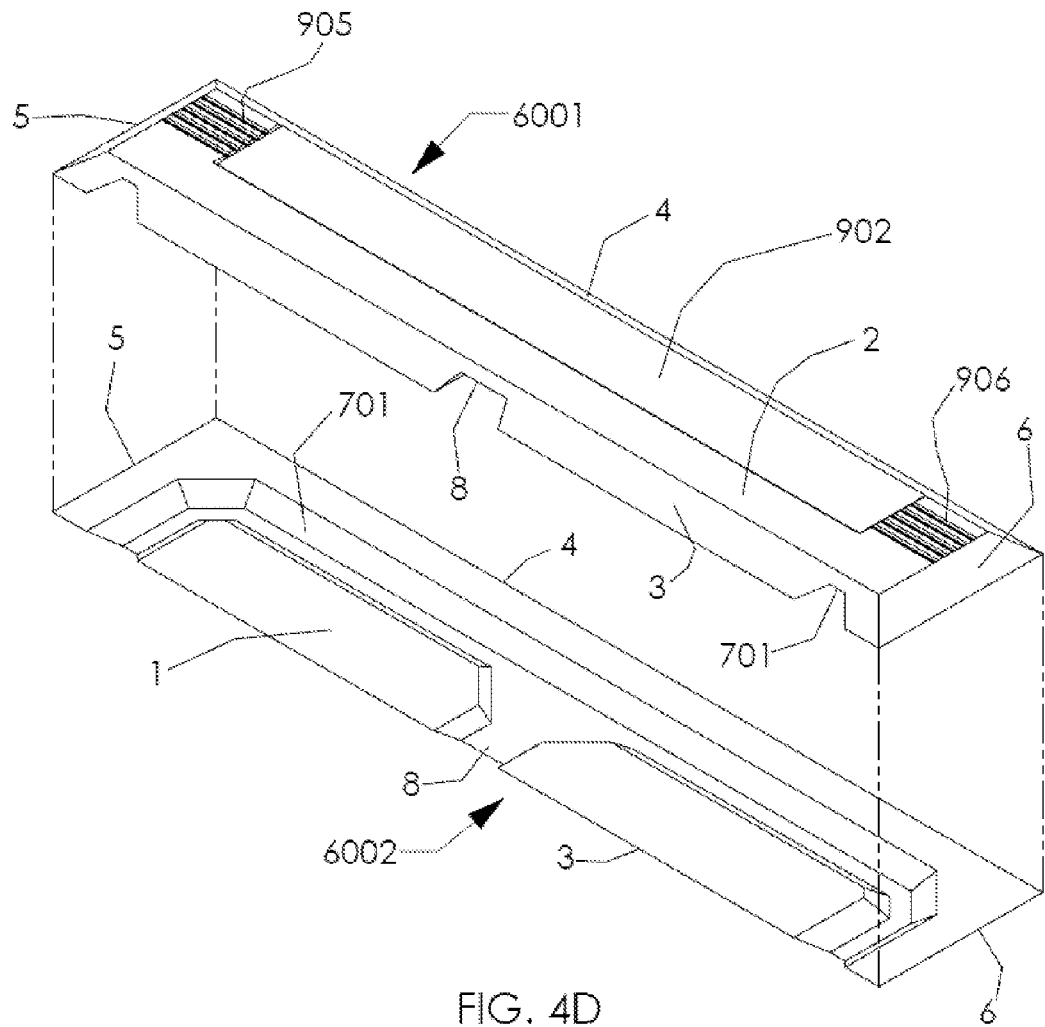

Each of FIGS. 4A-4D illustrates an assembly view of two half fin structure chips 1001 and 1002 to form a fin structure 1003 according to one non-limiting illustrated embodiment. FIG. 4A illustrates an assembly of the half fin structure chip 1001 and a half fin structure chip 1002 that is similar or identical to the half fin structure chip 1001, with the half fin structure chips 1001 and 1002 bonded to one another at the respective first primary surface 1. The bonding of the two half fin structure chips 1001 and 1002 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 4B illustrates a perspective view of the fin structure 1003. As shown in FIG. 4B, when the two half fin structure chips 1001 and 1002 are bonded together, an internal fluid channel 7001 is formed due to the fluid channel 701 on the first primary surface 1 of each of the two half fin structure chips 1001 and 1002. FIG. 4BA illustrates an enlarged sectional view of an inlet or outlet of the internal fluid channel of the fin structure 1003. In one embodiment, the internal fluid channel 7001 has a cross-sectional area that ranges between 0.004 square millimeters and 10 square millimeters. FIG. 4C illustrates an embodiment of the half fin structure chip 1001, labeled as half fin structure chip, 5001 having a recessed area 902 on the second primary surface 2. FIG. 4D illustrates another embodiment of the half fin structure chip 1001, labeled as half fin structure chip 6001, having a recessed area 902 on the second primary surface 2 and at least one groove, such as the multiple fine grooves 905 and 906 shown in the example, extending orthogonally from the recessed area 902.

Figure 5A:
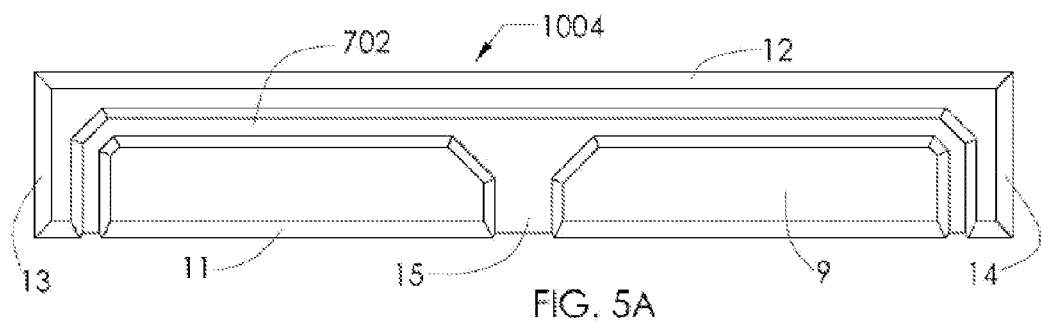
FIGS. 5A-5CA are each a diagram showing a respective view of a half fin structure chip where all edges of the chip have a full V-notch wedge contour according to one non-limiting illustrated embodiment.
Figure 5B:
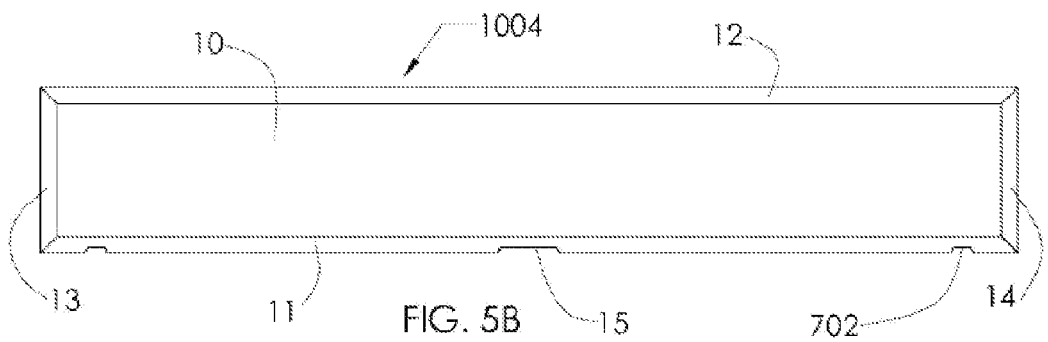
Figure 5C:
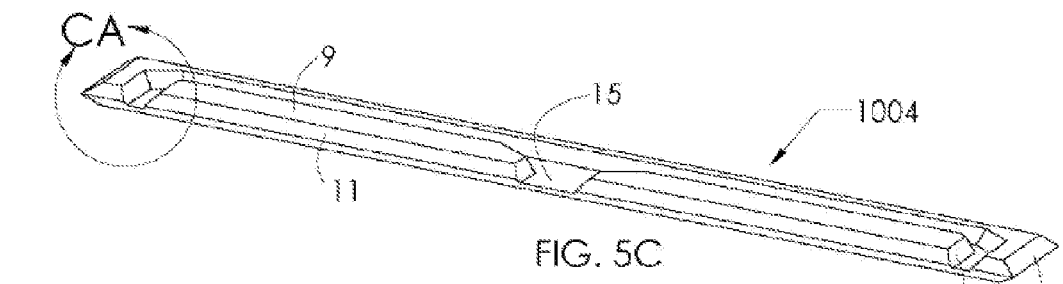
Figure 5C:
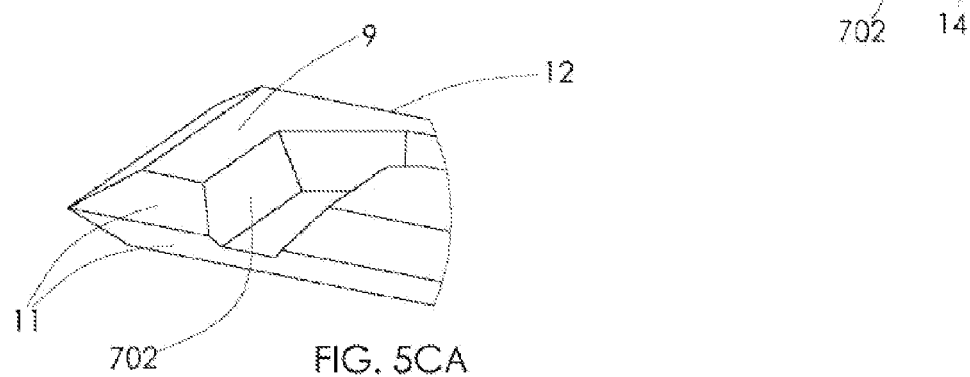

Each of FIGS. 5A-5CA illustrates a respective view of a half fin structure chip 1004 where all peripheral edges have a full V-notch wedge contour according to one non-limiting illustrated embodiment. As shown in FIGS. 5A and 5B, the half fin structure chip 1004 includes a first primary surface 9, a second primary surface 10 that is opposite and approximately parallel to the first primary surface 9, and peripheral edges including a front edge 11, a back edge 12, a first side edge 13, and a second side edge 14. In one embodiment, the first primary surface 9 is etched to have recessed portions that form a fluid channel 702 having a thin wall, as shown in FIG. 5A. In one embodiment, the fluid channel 702 is an E-shaped channel that has three openings, including a middle opening 15, on the front edge 11. The middle opening 15 may serve as an inlet while the other two openings may serve as outlets, for example. In another embodiment, the fluid channel 702 is a U-shaped channel that has two openings on the front edge 11, with one opening serving as the inlet and the other serving as the outlet. In one embodiment, the thickness of the thin wall at the recessed portions of the half fin structure chip 1004 is less than 200 microns. In one embodiment, the thickness of the thin wall at the recessed portions of the half fin structure chip 1004 is within the range of 10 microns to 200 microns.

In one embodiment, the peripheral edges 11, 12, 13 and 14 of the chip 1004 have a full V-notch wedge contour formed by a chemical etching process. In one embodiment, at least one of the first primary surface 9, the second primary surface 10, and the peripheral edges 11, 12, 13 and 14 is at least partially metalized. In one embodiment, the metalized surface is coated with a layer of copper. In another embodiment, the metalized surface is coated with a layer of TiW/Ni/Au. The half fin structure chip 1004 is made of a non-metal material. In one embodiment, the half fin structure chip 1004 is made from a single-crystal silicon wafer, a multi-crystal silicon wafer, another silicon-based material, or a ceramic material such as, for example, beryllium oxide, aluminum oxide, or silicon carbide. FIG. 5B illustrates the half fin structure chip 1004 as viewed from the side of the second primary surface 10. FIG. 5C illustrates a perspective view of the half fin structure chip 1004. FIG. 5CA illustrates an enlarged sectional view of an opening formed by the fluid channel 702 along the front edge 11 of the half fin structure chip 1004.

Figure 6A:
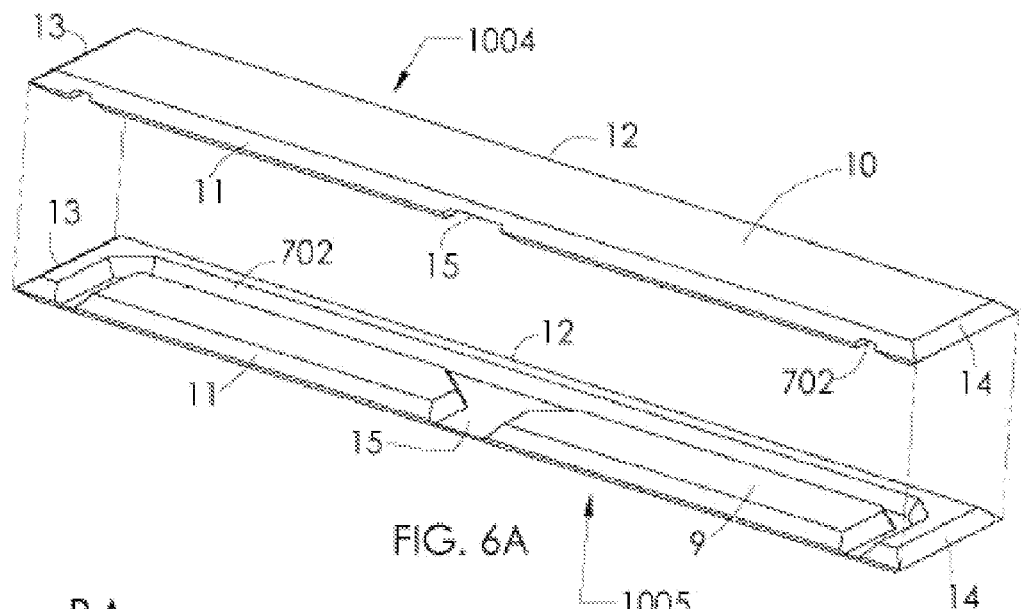
FIGS. 6A-6BA are each a diagram showing an assembly view of two half fin structure chips of FIG. 5A to form a fin structure according to one non-limiting illustrated embodiment.
Figure 6B:
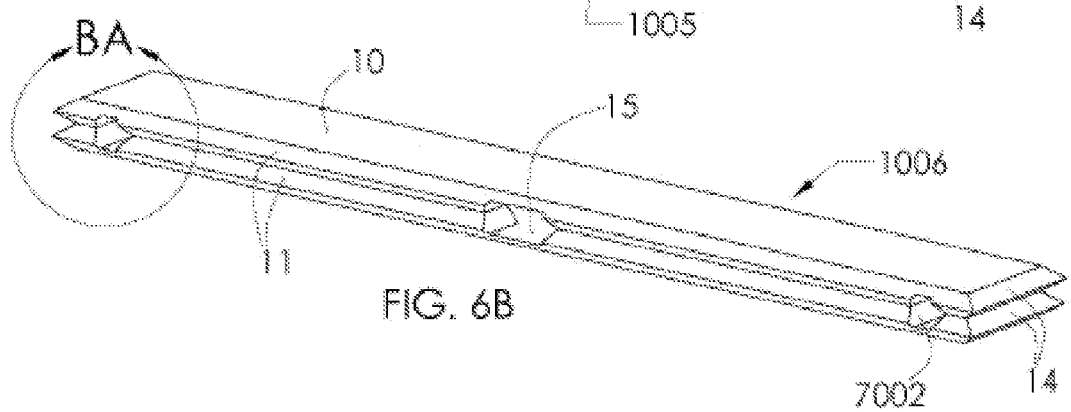
Figure 6B:
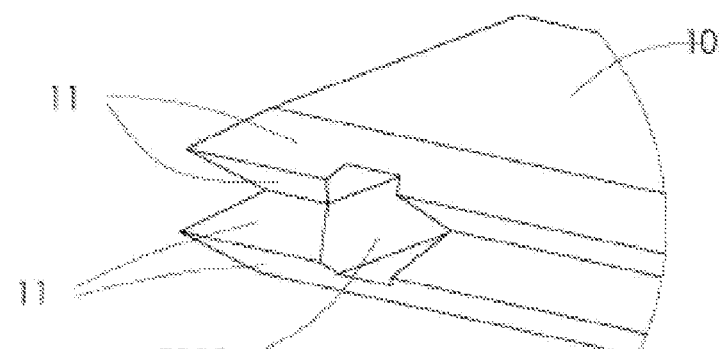

Each of FIGS. 6A-6BA illustrates an assembly view of two half fin structure chips 1004 and 1005 to form a fin structure 1006 according to one non-limiting illustrated embodiment. FIG. 6A illustrates an assembly of the half fin structure chip 1004 and a half fin structure chip 1005 that is similar or identical to the half fin structure chip 1004, with the half fin structure chips 1004 and 1005 bonded to one another at the respective first primary surface 9. The bonding of the two half fin structure chips 1004 and 1005 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 6B illustrates a perspective view of the fin structure 1006. As shown in FIG. 6B, when the two half fin structure chips 1004 and 1005 are bonded together, an internal fluid channel 7002 is formed due to the fluid channel 702 on the first primary surface 9 of each of the two half fin structure chips 1004 and 1005. FIG. 6BA illustrates an enlarged sectional view of an inlet or outlet of the internal fluid channel of the fin structure 1006. In one embodiment, the internal fluid channel 7002 has a cross-sectional area that ranges between 0.004 square millimeters and 10 square millimeters.

Figure 7A:
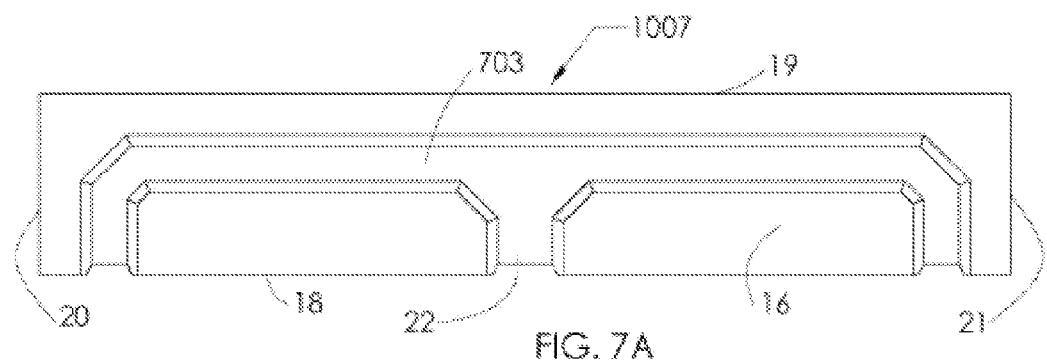
FIGS. 7A-7CA are each a diagram showing a respective view of a half fin structure chip where all edges of the chip have a half trapezoidal contour according to one non-limiting illustrated embodiment.
Figure 7B:
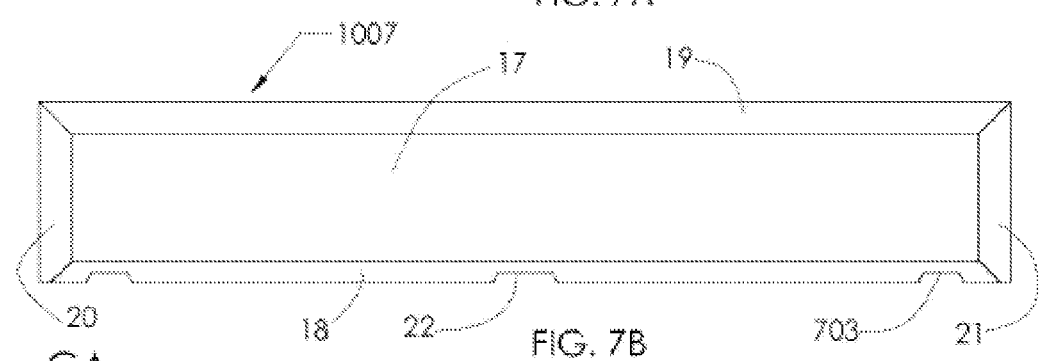
Figure 7C:
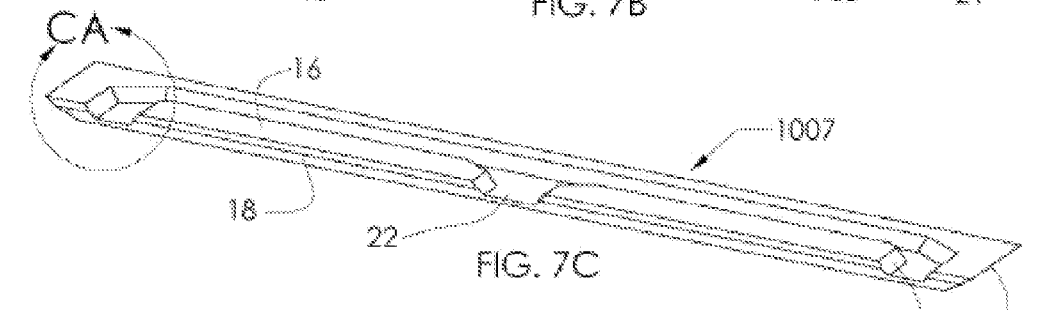
Figure 7C:
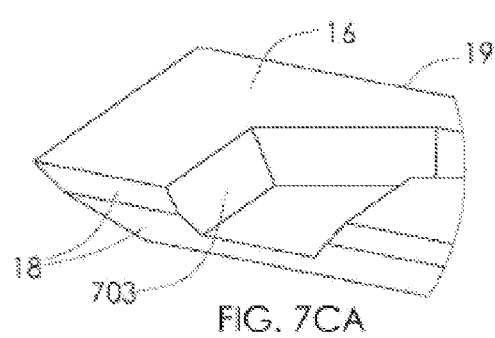

Each of FIGS. 7A-7CA illustrates a respective view of a half fin structure chip 1007 where all edges have a half trapezoidal wedge according to one non-limiting illustrated embodiment. As shown in FIGS. 7A and 7B, the half fin structure chip 1007 includes a first primary surface 16, a second primary surface 17 that is opposite and approximately parallel to the first primary surface 16, and peripheral edges including a front edge 18, a back edge 19, a first side edge 20, and a second side edge 21. In one embodiment, the first primary surface 16 is etched to have recessed portions that form a fluid channel 703 having a thin wall, as shown in FIG. 7A. In one embodiment, the fluid channel 703 is an E-shaped channel that has three openings, including a middle opening 22, on the front edge 18. The middle opening 22 may serve as an inlet while the other two openings may serve as outlets, for example. In another embodiment, the fluid channel 703 is U-shaped channel that has two openings on the front edge 18, with one opening serving as the inlet and the other serving as the outlet. In one embodiment, the thickness of the thin wall at the recessed portions of the half fin structure chip 1007 is less than 200 microns. In one embodiment, the thickness of the thin wall at the recessed portions of the half fin structure chip 1007 is within the range of 10 microns to 200 microns.

In one embodiment, the peripheral edges 18, 19, 20 and 21 of the chip 1007 have a half trapezoidal wedge contour formed by a chemical etching process. In one embodiment, at least one of the first primary surface 16, the second primary surface 17, and the peripheral edges 18, 19, 20 and 21 is at least partially metalized. In one embodiment, the metalized surface is coated with a layer of copper. In another embodiment, the metalized surface is coated with a layer of TiW/Ni/Au. The half fin structure chip 1007 is made of a non-metal material. In one embodiment, the half fin structure chip 1007 is made from a single-crystal silicon wafer, a multi-crystal silicon wafer, another silicon-based material, or a ceramic material such as, for example, beryllium oxide, aluminum oxide, or silicon carbide. FIG. 7B illustrates the half fin structure chip 1007 as viewed from the side of the second primary surface 17. FIG. 7C illustrates a perspective view of the half fin structure chip 1007. FIG. 7CA illustrates an enlarged sectional view of an opening formed by the fluid channel 703 along the front edge 18 of the half fin structure chip 1007.

Each of FIGS. 8A-8BA illustrates an assembly view of two half fin structure chips 1007 and 1008 to form a fin structure 1009 according to one non-limiting illustrated embodiment. FIG. 8A illustrates an assembly of the half fin structure chip 1007 and a half fin structure chip 1008 that is similar or identical to the half fin structure chip 1007, with the half fin structure chips 1007 and 1008 bonded to one another at the respective first primary surface 16. The bonding of the two half fin structure chips 1007 and 1008 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 8B illustrates a perspective view of the fin structure 1009. As shown in FIG. 8B, when the two half fin structure chips 1007 and 1008 are bonded together, an internal fluid channel 7003 is formed due to the fluid channel 703 on the first primary surface 16 of each of the two half fin structure chips 1007 and 1008. FIG. 8BA illustrates an enlarged sectional view of an inlet or outlet of the internal fluid channel of the fin structure 1009. In one embodiment, the internal fluid channel 7003 has a cross-sectional area that ranges between 0.004 square millimeters and 10 square millimeters.

Figure 9A:
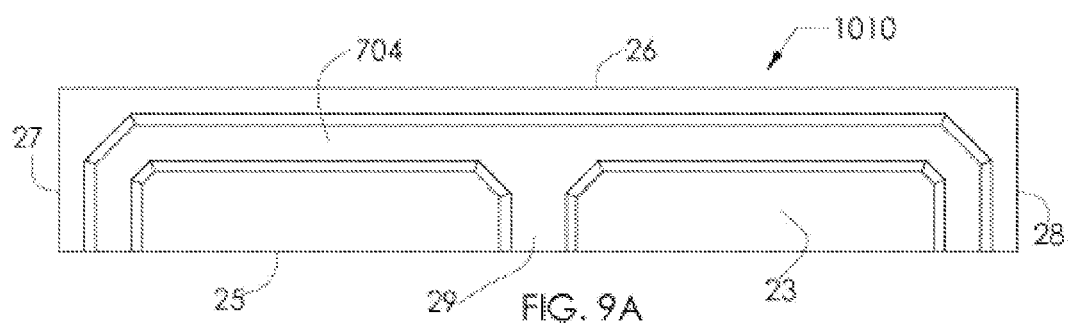
FIGS. 9A-9CA are each a diagram showing a respective view of a half fin structure chip where one of the edges of the chip is substantially orthogonal to the first side of the chip according to one non-limiting illustrated embodiment.
Figure 9B:
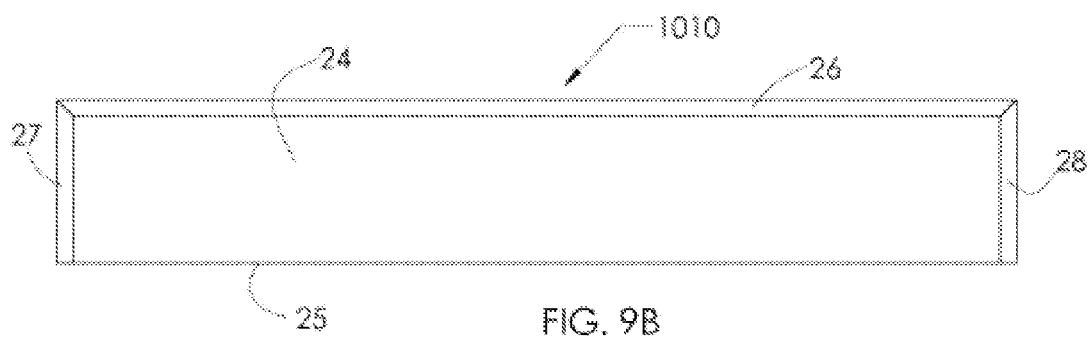
Figure 9C:
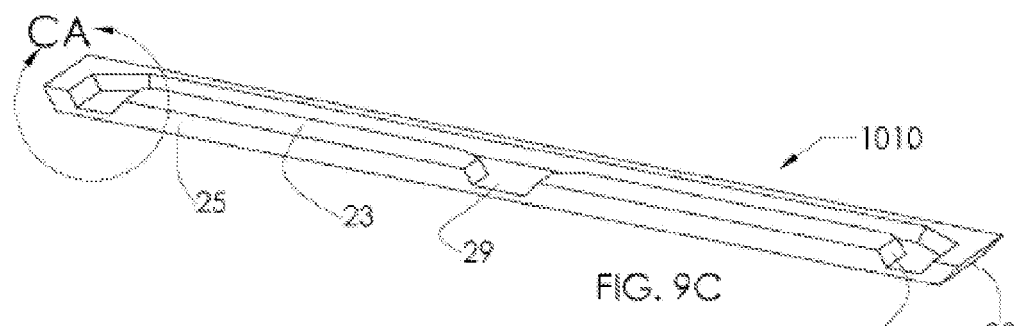
Figure 9C:
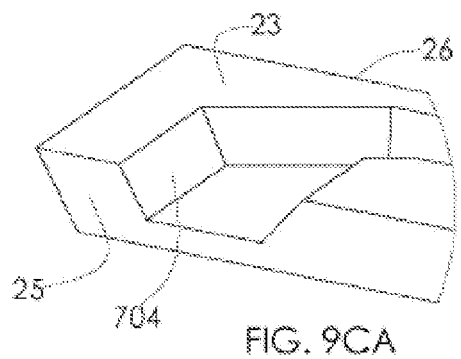

Each of FIGS. 9A-9CA illustrates a respective view of a half fin structure chip 1010 where one of the peripheral edges is substantially orthogonal to the primary surfaces of the half fin structure chip 1010 according to one non-limiting illustrated embodiment. As shown in FIGS. 9A and 9B, the half fin structure chip 1010 includes a first primary surface 23, a second primary surface 24 that is opposite and approximately parallel to the first primary surface 23, and peripheral edges including a front edge 25, a back edge 26, a first side edge 27, and a second side edge 28. In one embodiment, the first primary surface 23 is etched to have recessed portions that form a fluid channel 704 having a thin wall, as shown in FIG. 9A. In one embodiment, the fluid channel 704 is an E-shaped channel that has three openings, including a middle opening 29, on the front edge 25. The middle opening 29 may serve as an inlet while the other two openings may serve as outlets, for example. In another embodiment, the fluid channel 704 is a U-shaped channel that has two openings on the front edge 25, with one opening serving as the inlet and the other serving as the outlet. In one embodiment, the thickness of the thin wall at the recessed portions of the half fin structure chip 1010 is less than 200 microns. In one embodiment, the thickness of the thin wall at the recessed portions of the half fin structure chip 1010 is within the range of 10 microns to 200 microns.

In one embodiment, the peripheral edges 25, 26, 27 and 28 of the chip 1010 have a half V-notch wedge contour formed by a chemical etching process while the front edge 25 is substantially orthogonal to at least one of the primary surfaces 23 and 24. In one embodiment, at least one of the first primary surface 23, the second primary surface 24, and the peripheral edges 25, 26, 27 and 28 is at least partially metalized. In one embodiment, the metalized surface is coated with a layer of copper. In another embodiment, the metalized surface is coated with a layer of TiW/Ni/Au. The half fin structure chip 1010 is made of a non-metal material. In one embodiment, the half fin structure chip 1010 is made from a single-crystal silicon wafer, a multi-crystal silicon wafer, another silicon-based material, or a ceramic material such as, for example, beryllium oxide, aluminum oxide, or silicon carbide. FIG. 9B illustrates the half fin structure chip 1010 as viewed from the side of the second primary surface 24. FIG. 9C illustrates a perspective view of the half fin structure chip 1010. FIG. 9CA illustrates an enlarged sectional view of an opening formed by the fluid channel 704 along the front edge 25 of the half fin structure chip 1010.

Each of FIGS. 10A-10BA illustrates an assembly view of two half fin structure chips 1010 and 1011 to form a fin structure 1012 according to one non-limiting illustrated embodiment. FIG. 10A illustrates an assembly of the half fin structure chip 1010 and a half fin structure chip 1011 that is similar or identical to the half fin structure chip 1010, with the half fin structure chips 1010 and 1011 bonded to one another at the respective first primary surface 23. The bonding of the two half fin structure chips 1010 and 1011 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 10B illustrates a perspective view of the fin structure 1012. As shown in FIG. 10B, when the two half fin structure chips 1010 and 1011 are bonded together, an internal fluid channel 7004 is formed due to the fluid channel 704 on the first primary surface 23 of each of the two half fin structure chips 1010 and 1011. FIG. 10BA illustrates an enlarged sectional view of an inlet or outlet of the internal fluid channel of the fin structure 1012. In one embodiment, the internal fluid channel 7004 has a cross-sectional area that ranges between 0.004 square millimeters and 10 square millimeters.

Each of FIGS. 11A-11CB illustrates a respective view of a base plate 1013 that has a V-notch groove according to one non-limiting illustrated embodiment. As shown in FIGS. 11A and 11B, the base plate 1013 includes a first primary surface 30, a second primary surface 31, and four peripheral edges including a front edge 33, a back edge 34, a first side edge 35, and a second side edge 36. The base plate 1013 also includes a groove 32 with a V-notch groove contour etched into its first primary surface 30, and channel openings 37 that may be formed by an etching process, for example, on the second primary surface 31 to meet the groove 32. In one embodiment, the location of each of the channel openings 37 is precisely matched with the location of the inlet and outlet of the internal fluid channel 7001 of the fin structure 1003. In one embodiment, the groove 32 has three channel openings 37 when the fin structure has an E-shaped internal fluid channel with three openings, e.g., one as an inlet port and the other two as outlet ports. In another embodiment, the groove 32 has two channel openings 37 when the fin structure has a U-shaped internal fluid channel with two openings, e.g., one as an inlet port and the other as an outlet port. In the embodiment shown in FIGS. 11A and 11B, there are three channel openings 37. The groove 32 extends from one side of the base plate 1013 near the first side edge 35 toward another side of the base plate 1013 near the second side edge 36, but does not cut through the side edges 35 and 36.

In one embodiment, the four peripheral edges 33, 34, 35 and 36 are etched to form a V-shaped wedge contour. In another embodiment, at least one of the four peripheral edges 33, 34, 35 and 36 is cut to have a vertical straight edge that is substantially orthogonal to at least one of the primary surfaces 30 and 31. The base plate 1013 is made of a non-metal material. In one embodiment, the base plate 1013 is made from a single-crystal silicon wafer, a multi-crystal silicon wafer, another silicon-based material, or a ceramic material such as, for example, beryllium oxide, aluminum oxide, or silicon carbide. FIG. 1C illustrates a side view of the base plate 1013. FIG. 11CA illustrates an enlarged cross-sectional view of the base plate 1013 along the cross section AA, where the groove 32 and one of the openings 37 meet to form a channel opening. FIG. 11 CB illustrates an enlarged cross-sectional view of the base plate 1013 along the cross section BB, showing the groove 32 etched into the first primary surface 30 of the base plate 1013.

Figure 12A:
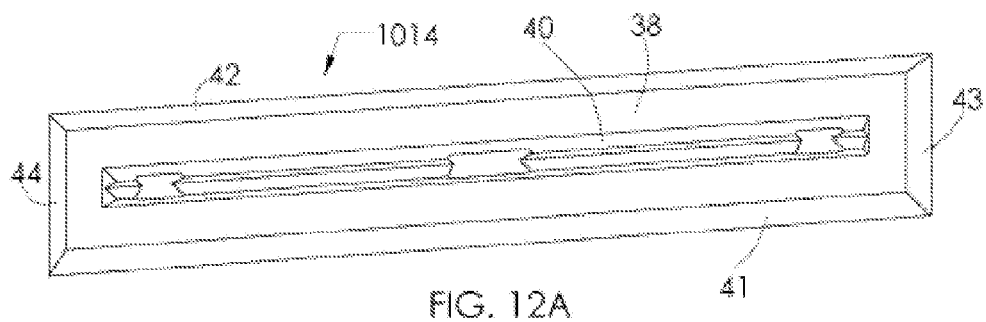
FIGS. 12A-12CB are each a diagram showing a respective view of a base plate that has a double V-notch groove according to one non-limiting illustrated embodiment.
Figure 12B:
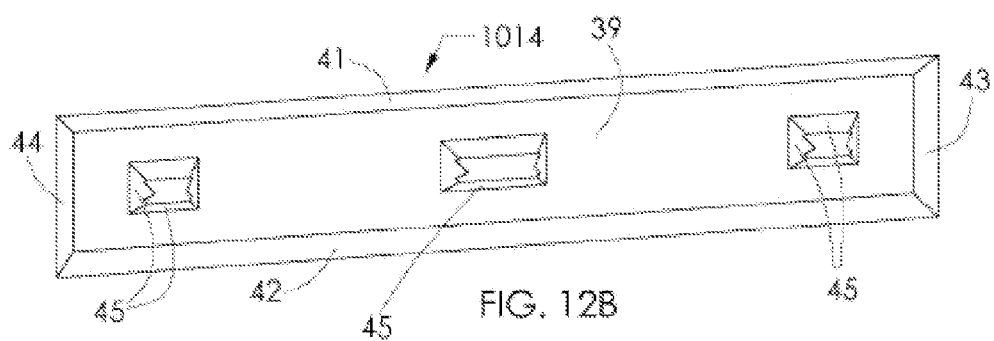
Figure 12C:
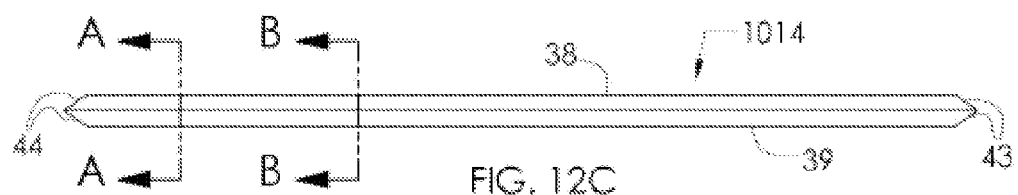
Figure 12C:
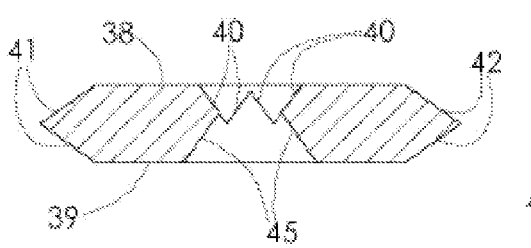
Figure 12C:
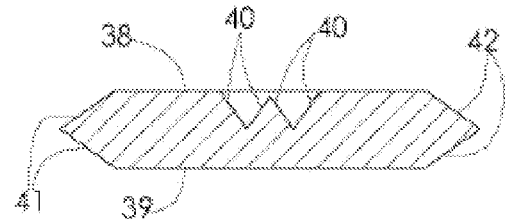

Each of FIGS. 12A-12CB illustrates a respective view of a base plate 1014 that has a double V-notch groove according to one non-limiting illustrated embodiment. As shown in FIGS. 12A and 12B, the base plate 1014 includes a first primary surface 38, a second primary surface 39, and four peripheral edges including a front edge 41, a back edge 42, a first side edge 43, and a second side edge 44. The base plate 1014 also includes a groove 40 with a double V-notch groove contour etched into its first primary surface 38, and channel openings 45 that may be formed by an etching process, for example, on the second primary surface 39 to meet the groove 40. In one embodiment, the location of each of the channel openings 45 is precisely matched with the location of the inlet and outlet of the internal fluid channel 7002 of the fin structure 1006. In one embodiment, the groove 40 has three channel openings 45 when the fin structure has an E-shaped internal fluid channel with three openings, e.g., one as an inlet port and the other two as outlet ports. In another embodiment, the groove 40 has two channel openings 45 when the fin structure has a U-shaped internal fluid channel with two openings, e.g., one as an inlet port and the other as an outlet port. In the embodiment shown in FIGS. 12A and 12B, there are three channel openings 45. The groove 40 extends from one side of the base plate 1014 near the first side edge 43 toward another side of the base plate 1014 near the second side edge 44, but does not cut through the side edges 43 and 44.

In one embodiment, the four peripheral edges 41, 42, 43 and 44 are etched to form a V-shaped wedge contour. In another embodiment, at least one of the four peripheral edges 41, 42, 43 and 44 is cut to have a vertical straight edge that is substantially orthogonal to at least one of the primary surfaces 38 and 39. The base plate 1014 is made of a non-metal material. In one embodiment, the base plate 1014 is made from a single-crystal silicon wafer, a multi-crystal silicon wafer, another silicon-based material, or a ceramic material such as, for example, beryllium oxide, aluminum oxide, or silicon carbide. FIG. 12C illustrates a side view of the base plate 1014. FIG. 12CA illustrates an enlarged cross-sectional view of the base plate 1014 along the cross section AA, where the groove 40 and one of the openings 45 meet to form a channel opening. FIG. 12CB illustrates an enlarged cross-sectional view of the base plate 1014 along the cross section BB, showing the groove 40 etched into the first primary surface 38 of the base plate 1014.

Figure 13A:
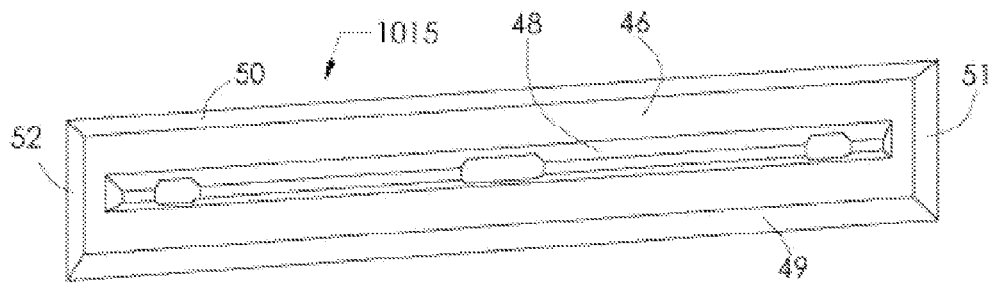
FIGS. 13A-13CB are each a diagram showing a respective view of a base plate that has a trapezoidal groove according to one non-limiting illustrated embodiment.
Figure 13B:
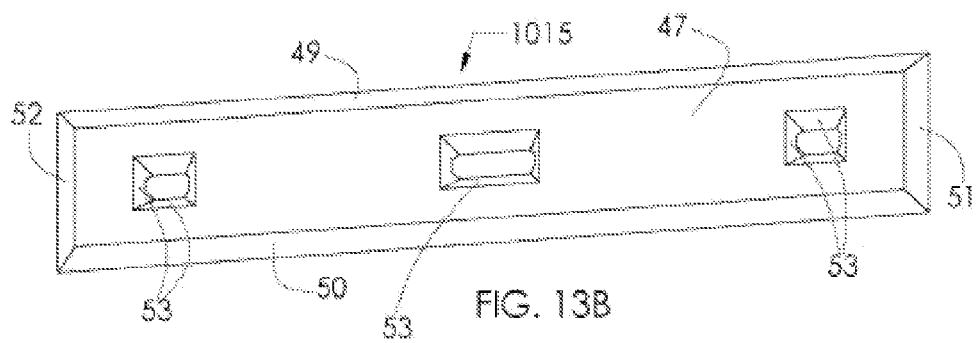
Figure 13C:
Figure 13C:
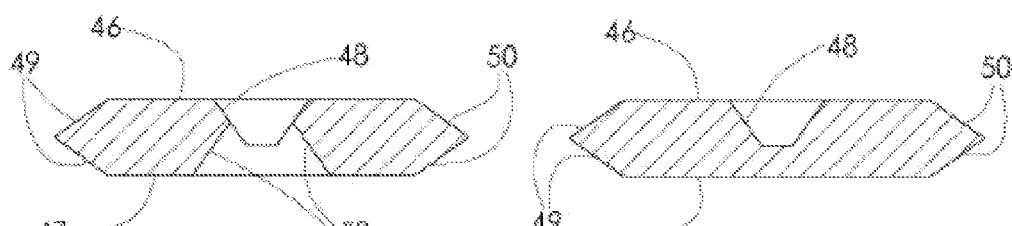

Each of FIGS. 13A-13CB illustrates a respective view of a base plate 1015 that has a trapezoidal groove according to one non-limiting illustrated embodiment. As shown in FIGS. 13A and 13B, the base plate 1015 includes a first primary surface 46, a second primary surface 47, and four peripheral edges including a front edge 49, a back edge 50, a first side edge 51, and a second side edge 52. The base plate 1015 also includes a groove 48 with a trapezoidal contour etched into its first primary surface 46, and channel openings 53 that may be formed by an etching process, for example, on the second primary surface 47 to meet the groove 48. In one embodiment, the location of each of the channel openings 53 is precisely matched with the location of the inlet and outlet of the internal fluid channel 7003 of the fin structure 1009. In one embodiment, the groove 48 has three channel openings 53 when the fin structure has an E-shaped internal fluid channel with three openings, e.g., one as an inlet port and the other two as outlet ports. In another embodiment, the groove 48 has two channel openings 53 when the fin structure has a U-shaped internal fluid channel with two openings, e.g., one as an inlet port and the other as an outlet port. In the embodiment shown in FIGS. 13A and 13B, there are three channel openings 53. The groove 48 extends from one side of the base plate 1015 near the first side edge 51 toward another side of the base plate 1015 near the second side edge 52, but does not cut through the side edges 51 and 52.

In one embodiment, the four peripheral edges 49, 50, 51 and 52 are etched to form a V-shaped wedge contour. In another embodiment, at least one of the four peripheral edges 49, 50, 51 and 52 is cut to have a vertical straight edge that is substantially orthogonal to at least one of the primary surfaces 46 and 47. The base plate 1015 is made of a non-metal material. In one embodiment, the base plate 1015 is made from a single-crystal silicon wafer, a multi-crystal silicon wafer, another silicon-based material, or a ceramic material such as, for example, beryllium oxide, aluminum oxide, or silicon carbide. FIG. 13C illustrates a side view of the base plate 1015. FIG. 13CA illustrates an enlarged cross-sectional view of the base plate 1015 along the cross section AA, where the groove 48 and one of the openings 53 meet to form a channel opening. FIG. 13CB illustrates an enlarged cross-sectional view of the base plate 1015 along the cross section BB, showing the groove 48 etched into the first primary surface 46 of the base plate 1015.

Figure 14A:
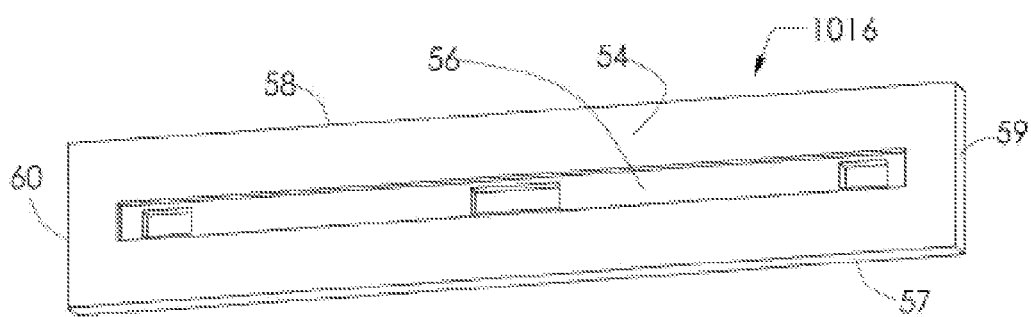
FIGS. 14A-14CB are each a diagram showing a respective view of a first side of a base plate that has a rectangular groove according to one non-limiting illustrated embodiment.
Figure 14B:
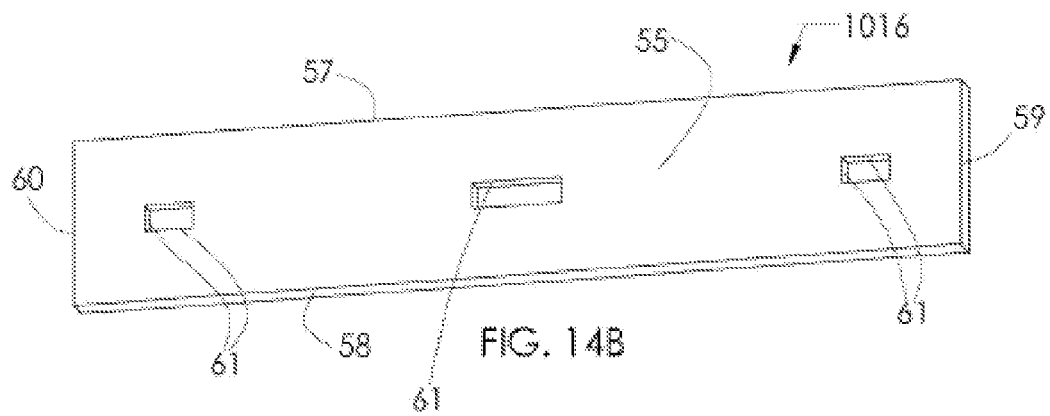
Figure 14C:
Figure 14C:
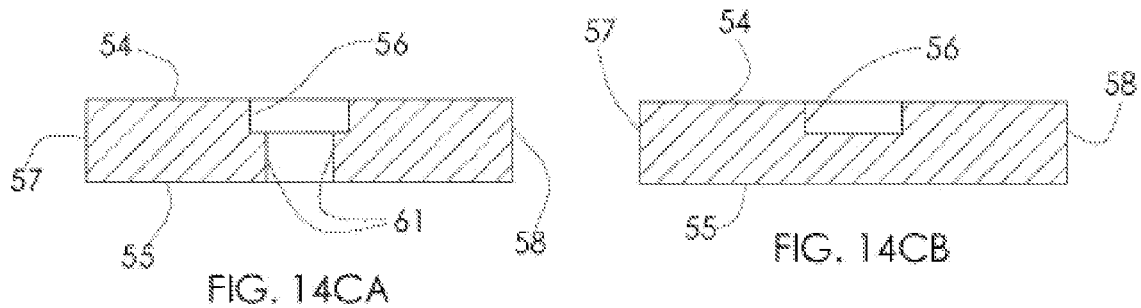

Each of FIGS. 14A-14CB illustrates a respective view of a base plate 1016 that has a rectangular groove according to one non-limiting illustrated embodiment. As shown in FIGS. 14A and 14B, the base plate 1016 includes a first primary surface 54, a second primary surface 55, and four peripheral edges including a front edge 57, a back edge 58, a first side edge 59, and a second side edge 60. The base plate 1016 also includes a groove 56 with a rectangular groove contour etched into its first primary surface 54, and channel openings 61 that may be formed by an etching process, for example, on the second primary surface 55 to meet the groove 56. In one embodiment, the location of each of the channel openings 61 is precisely matched with the location of the inlet and outlet of the internal fluid channel 7004 of the fin structure 1012. In one embodiment, the groove 56 has three channel openings 61 when the fin structure has an E-shaped internal fluid channel with three openings, e.g., one as an inlet port and the other two as outlet ports. In another embodiment, the groove 56 has two channel openings 61 when the fin structure has a U-shaped internal fluid channel with two openings, e.g., one as an inlet port and the other as an outlet port. In the embodiment shown in FIGS. 14A and 14B, there are three channel openings 61. The groove 56 extends from one side of the base plate 1016 near the first side edge 59 toward another side of the base plate 1016 near the second side edge 60, but does not cut through the side edges 59 and 60.

In one embodiment, the four peripheral edges 57, 58, 59 and 60 are etched to form a V-shaped wedge contour. In another embodiment, at least one of the four peripheral edges 57, 58, 59 and 60 is cut to have a vertical straight edge that is substantially orthogonal to at least one of the primary surfaces 54 and 55. The base plate 1016 is made of a non-metal material. In one embodiment, the base plate 1016 is made from a single-crystal silicon wafer, a multi-crystal silicon wafer, another silicon-based material, or a ceramic material such as, for example, beryllium oxide, aluminum oxide, or silicon carbide. FIG. 14C illustrates a side view of the base plate 1016. FIG. 14CA illustrates an enlarged cross-sectional view of the base plate 1016 along the cross section AA, where the groove 56 and one of the openings 61 meet to form a channel opening. FIG. 14CB illustrates an enlarged cross-sectional view of the base plate 1016 along the cross section BB, showing the groove 56 etched into the first primary surface 54 of the base plate 1016.

Figure 15A:
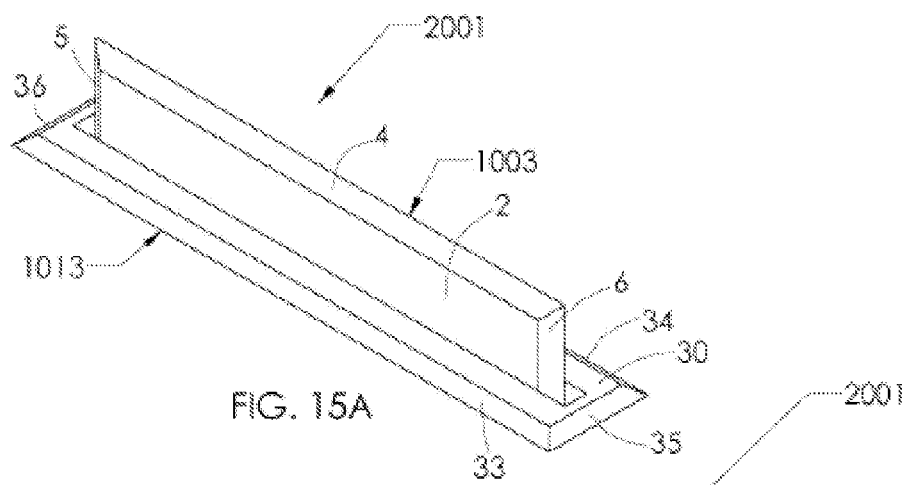
FIGS. 15A-15BB are each a diagram showing a respective view of a thermal energy transfer device having a fin structure of FIG. 4B attached to a base plate of FIG. 11A according to one non-limiting illustrated embodiment.
Figure 15B:
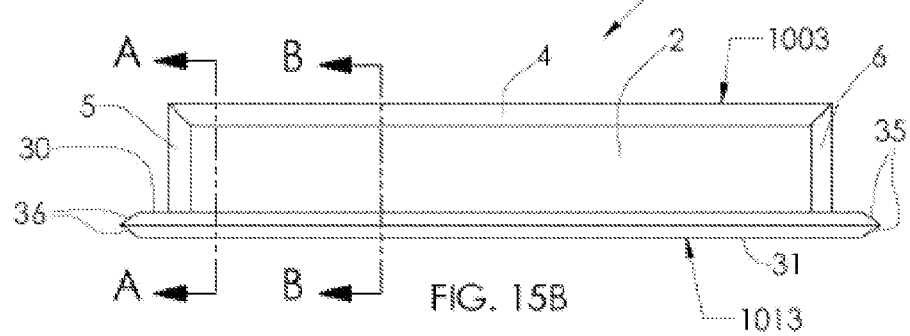
Figure 15B:
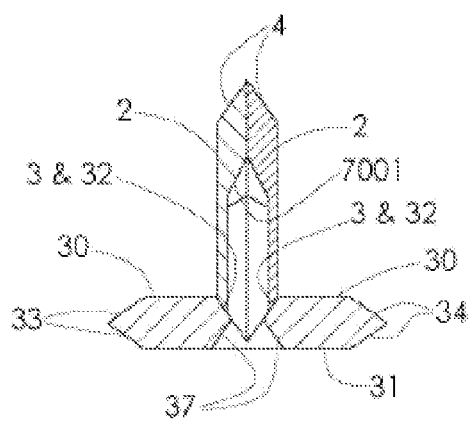
Figure 15B:
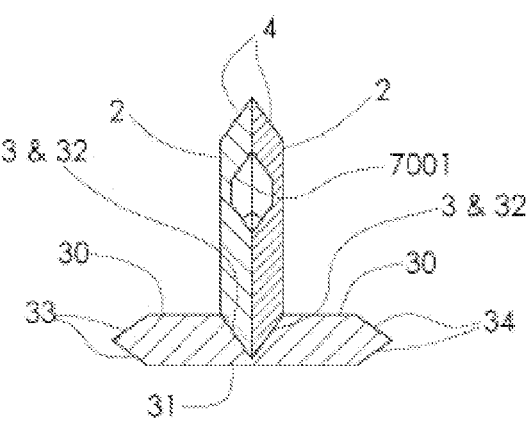

Each of FIGS. 15A-15BB illustrates a respective view of a thermal energy transfer device 2001 having the fin structure 1003 of FIG. 4B attached to the base plate 1013 of FIG. 11A according to one non-limiting illustrated embodiment. FIG. 15A illustrates a perspective view of the thermal energy transfer device 2001 having the fin structure 1003 attached to the base plate 1013. In particular, the V-notch wedge shaped front edge 3 of the fin structure 1003 is received in, or interlocked into, the V-notch shaped groove 32 of the base plate 1013. In one embodiment, either one or both of the front edge 3 of the fin structure 1003 and the groove 32 of the base plate 1013 are at least partially metalized to facilitate bonding with the groove 32 of the base plate 1013. In one embodiment, the bonding between the front edge 3 and the groove 32 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 15B illustrates a side view of the thermal energy transfer device 2001. FIG. 15BA illustrates an enlarged cross-sectional view of the thermal energy transfer device 2001 along the cross section AA, showing the internal fluid channel 7001 and a channel opening 37, which may serve as an inlet or outlet port. FIG. 15BB illustrates an enlarged cross-sectional view of the thermal energy transfer device 2001 along the cross section BB.

The attachment of the fin structure 1003 to the base plate 1013 results in the three-dimensional thermal energy transfer device 2001 that contains internal fluid channel for a fluid, such as a liquid or a gas, to flow through to transfer thermal energy from an object that is attached to the thermal energy transfer device 2001. For example, a heat-generating object, such as a diode laser, a microprocessor or another type of integrated circuit, may be attached to one of the primary surfaces 2 of the fin structure 1003 or the second primary surface 31 of the base plate 1013. In the case that the heat-generating object is attached to one of the primary surfaces 2 of the fin structure 1003, heat from the heat-generating object is transferred at least by conduction to the fin structure 1003. The fin structure 1003 dissipates a majority of the absorbed heat by convection to the fluid circulated through the internal fluid channel 7001, and a small portion of the absorbed heat is dissipated by radiation to an ambient fluid surrounding the thermal energy transfer device 2001, such as ambient air, for example, and by conduction to the base plate 1013. In the case that the heat-generating object is attached to the second primary surface 31 of the base plate 1013, heat from the heat-generating object is transferred at least by conduction to the base plate 1013. The base plate 1013 dissipates the absorbed heat by conduction to the fin structure 1003, and by convection as well as radiation to the ambient fluid surrounding the thermal energy transfer device 2001. The fin structure 1003 in turn dissipates the absorbed heat by convection to the fluid circulated through the internal fluid channel 7001, and by radiation to the ambient fluid that surrounds the thermal energy transfer device 2001.

Because one of the peripheral edges of the fin structure 1003 is used to attach the fin structure 1003 to the base plate 1013, the angle between the first primary surface 30 of the base plate 1013 and at least one of the primary surfaces 2 of the fin structure 1003 is greater than 0 degrees. In one embodiment, the angle between the first primary surface 30 of the base plate 1013 and at least one of the primary surfaces 2 of the fin structure 1003 is substantially 90 degrees, as shown in FIGS. 15A, 15BA and 15BB.

Figure 16A:
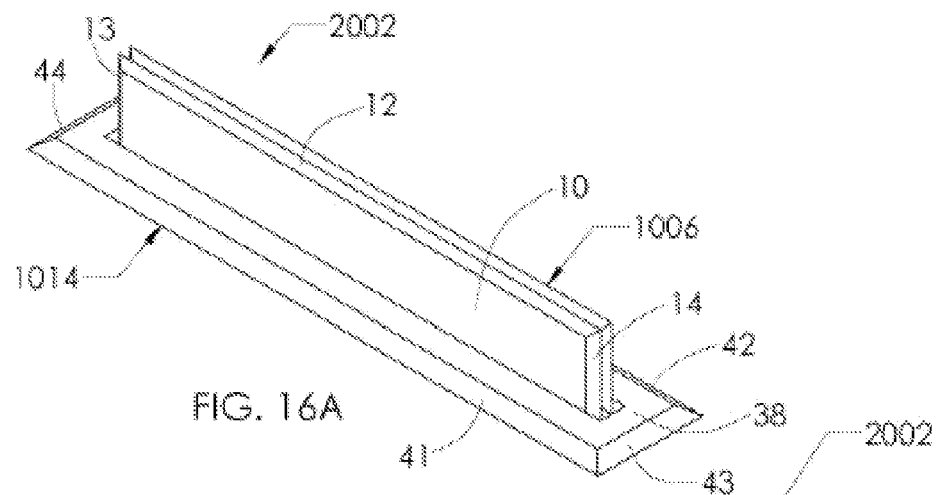
FIGS. 16A-16BB are each a diagram showing a respective view of a thermal energy transfer device having a fin structure of FIG. 6B attached to a base plate of FIG. 12A according to one non-limiting illustrated embodiment.
Figure 16B:
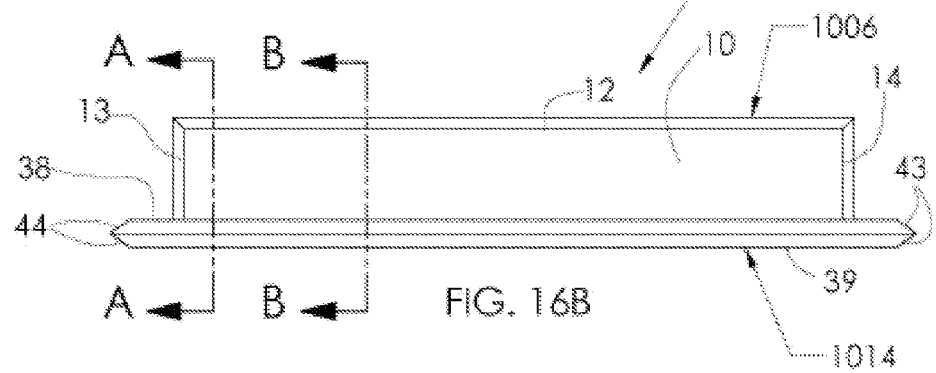
Figure 16B:
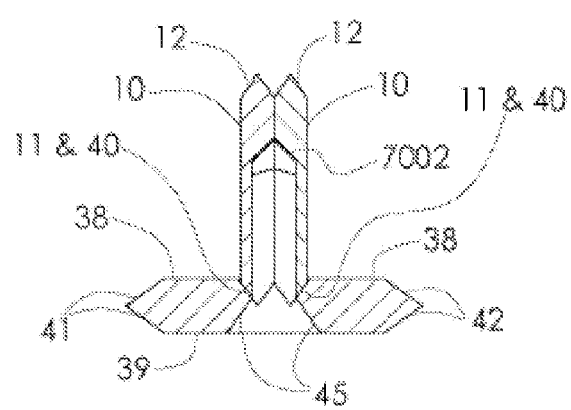
Figure 16B:
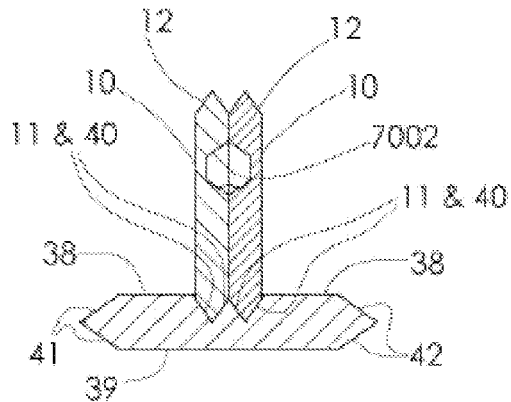

Each of FIGS. 16A-16BB illustrates a respective view of a thermal energy transfer device 2001 having the fin structure 1006 of FIG. 6B attached to the base plate 1014 of FIG. 12A according to one non-limiting illustrated embodiment. FIG. 16A illustrates a perspective view of the thermal energy transfer device 2002 having the fin structure 1006 attached to the base plate 1014. In particular, the double V-notch wedge shaped front edge 11 of the fin structure 1006 is received in, or interlocked into, the double V-notch shaped groove 40 of the base plate 1014. In one embodiment, either one or both of the front edge 11 of the fin structure 1006 and the groove 40 of the base plate 1014 are at least partially metalized to facilitate bonding with the groove 40 of the base plate 1014. In one embodiment, the bonding between the front edge 11 and the groove 40 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 16B illustrates a side view of the thermal energy transfer device 2002. FIG. 16BA illustrates an enlarged cross-sectional view of the thermal energy transfer device 2002 along the cross section AA, showing the internal fluid channel 7002 and a channel opening 45, which may serve as an inlet or outlet port. FIG. 16BB illustrates an enlarged cross-sectional view of the thermal energy transfer device 2002 along the cross section BB.

The attachment of the fin structure 1006 to the base plate 1014 results in the three-dimensional thermal energy transfer device 2002 that contains internal fluid channel for a fluid, such as a liquid or a gas, to flow through to transfer thermal energy from an object that is attached to the thermal energy transfer device 2002. For example, a heat-generating object, such as a diode laser, a microprocessor or another type of integrated circuit, may be attached to one of the primary surfaces 10 of the fin structure 1006 or the second primary surface 39 of the base plate 1014. In the case that the heat-generating object is attached to one of the primary surfaces 10 of the fin structure 1006, heat from the heat-generating object is transferred at least by conduction to the fin structure 1006. The fin structure 1006 dissipates a majority of the absorbed heat by convection to the fluid circulated through the internal fluid channel 7002, and a small portion of the absorbed heat is dissipated by radiation to an ambient fluid surrounding the thermal energy transfer device 2002, such as ambient air, for example, and by conduction to the base plate 1014. In the case that the heat-generating object is attached to the second primary surface 39 of the base plate 1014, heat from the heat-generating object is transferred at least by conduction to the base plate 1016. The base plate 1014 dissipates the absorbed heat by conduction to the fin structure 1006, and by convection as well as radiation to the ambient fluid surrounding the thermal energy transfer device 2002. The fin structure 1006 in turn dissipates the absorbed heat by convection to the fluid circulated through the internal fluid channel 7002, and by radiation to the ambient fluid that surrounds the thermal energy transfer device 2002.

Because one of the peripheral edges of the fin structure 1006 is used to attach the fin structure 1006 to the base plate 1014, the angle between the first primary surface 38 of the base plate 1014 and at least one of the primary surfaces 10 of the fin structure 1006 is greater than 0 degrees. In one embodiment, the angle between the first primary surface 38 of the base plate 1014 and at least one of the primary surfaces 10 of the fin structure 1006 is substantially 90 degrees, as shown in FIGS. 16A, 16BA and 16BB.

Figure 17A:
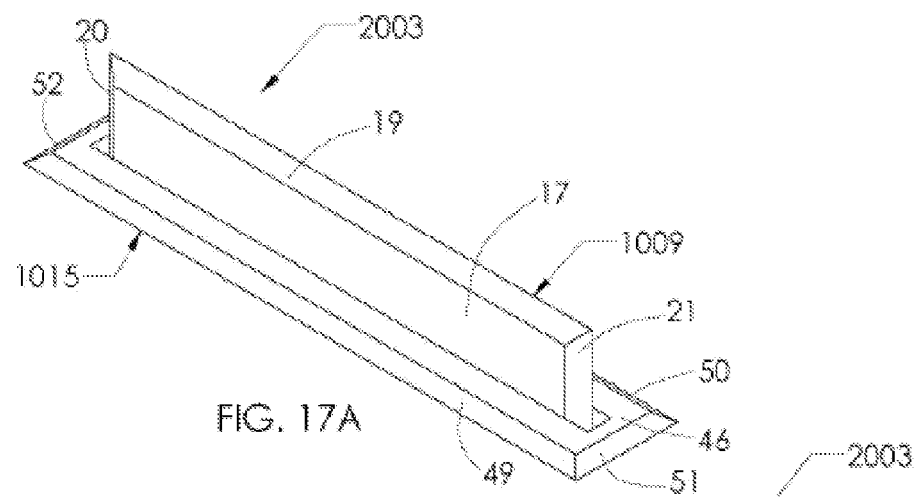
FIGS. 17A-17BB are each a diagram showing a respective view of a thermal energy transfer device having a fin structure of FIG. 8B attached to a base plate of FIG. 13A according to one non-limiting illustrated embodiment.
Figure 17B:
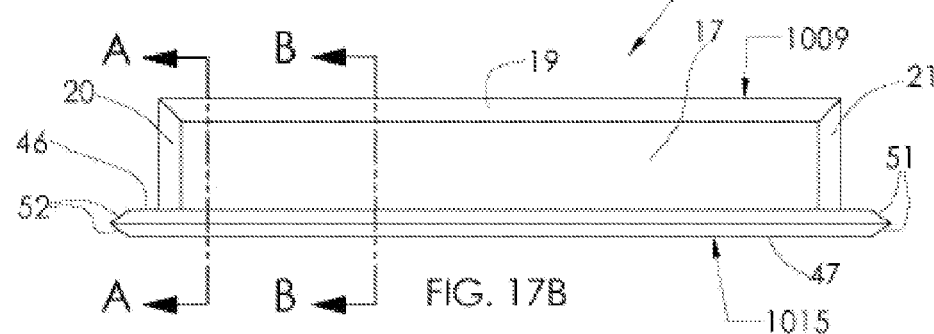
Figure 17B:
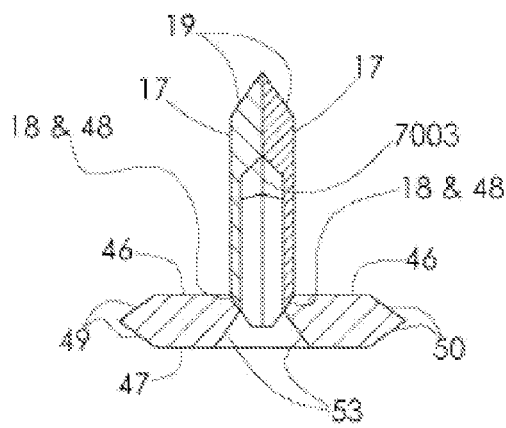
Figure 17B:
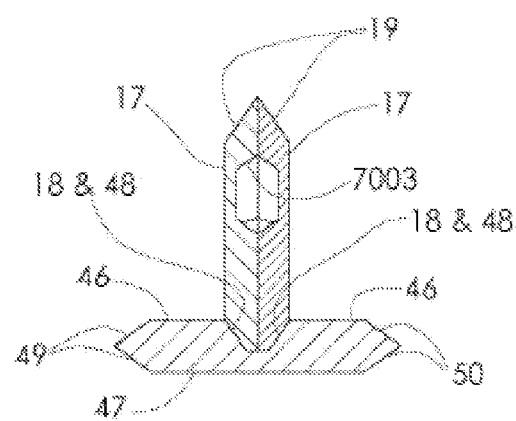

Each of FIGS. 17A-17BB illustrates a respective view of a thermal energy transfer device 2003 having the fin structure 1009 of FIG. 8B attached to the base plate 1015 of FIG. 13A according to one non-limiting illustrated embodiment.

FIG. 17A illustrates a perspective view of the thermal energy transfer device 2003 having the fin structure 1009 attached to the base plate 1015. In particular, the trapezoidal wedge shaped front edge 18 of the fin structure 1009 is received in, or interlocked into, the trapezoidal shaped groove 48 of the base plate 1015. In one embodiment, either one or both of the front edge 18 of the fin structure 1009 and the groove 48 of the base plate 1015 are at least partially metalized to facilitate bonding with the groove 48 of the base plate 1015. In one embodiment, the bonding between the front edge 18 and the groove 48 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 17B illustrates a side view of the thermal energy transfer device 2003. FIG. 17BA illustrates an enlarged cross-sectional view of the thermal energy transfer device 2003 along the cross section AA, showing the internal fluid channel 7003 and a channel opening 53, which may serve as an inlet or outlet port. FIG. 17BB illustrates an enlarged cross-sectional view of the thermal energy transfer device 2003 along the cross section BB.

The attachment of the fin structure 1009 to the base plate 1015 results in the three-dimensional thermal energy transfer device 2003 that contains internal fluid channel for a fluid, such as a liquid or a gas, to flow through to transfer thermal energy from an object that is attached to the thermal energy transfer device 2003. For example, a heat-generating object, such as a diode laser, a microprocessor or another type of integrated circuit, may be attached to one of the primary surfaces 17 of the fin structure 1009 or the second primary surface 47 of the base plate 1015. In the case that the heat-generating object is attached to one of the primary surfaces 17 of the fin structure 1009, heat from the heat-generating object is transferred at least by conduction to the fin structure 1009. The fin structure 1009 dissipates a majority of the absorbed heat by convection to the fluid circulated through the internal fluid channel 7003, and a small portion of the absorbed heat is dissipated by radiation to an ambient fluid surrounding the thermal energy transfer device 2003, such as ambient air, for example, and by conduction to the base plate 1015. In the case that the heat-generating object is attached to the second primary surface 47 of the base plate 1015, heat from the heat-generating object is transferred at least by conduction to the base plate 1015. The base plate 1015 dissipates the absorbed heat by conduction to the fin structure 1009, and by convection as well as radiation to the ambient fluid surrounding the thermal energy transfer device 2003. The fin structure 1009 in turn dissipates the absorbed heat by convection to the fluid circulated through the internal fluid channel 7003, and by radiation to the ambient fluid that surrounds the thermal energy transfer device 2003.

Because one of the peripheral edges of the fin structure 1009 is used to attach the fin structure 1009 to the base plate 1015, the angle between the first primary surface 46 of the base plate 1015 and at least one of the primary surfaces 17 of the fin structure 1009 is greater than 0 degrees. In one embodiment, the angle between the first primary surface 46 of the base plate 1015 and at least one of the primary surfaces 17 of the fin structure 1009 is substantially 90 degrees, as shown in FIGS. 17A, 17BA and 17BB.

Each of FIGS. 18A-18BB illustrates a respective view of a thermal energy transfer device 2004 having the fin structure 1012 of FIG. 10B attached to the base plate 1016 of FIG. 14A according to one non-limiting illustrated embodiment. FIG. 18A illustrates a perspective view of the thermal energy transfer device 2004 having the fin structure 1012 attached to the base plate 1016. In particular, the flat front edge 25 of the fin structure 1012 is received in, or interlocked into, the rectangular shaped groove 56 of the base plate 1016. In one embodiment, either one or both of the front edge 25 of the fin structure 1012 and the groove 56 of the base plate 1016 are at least partially metalized to facilitate bonding with the groove 56 of the base plate 1016. In one embodiment, the bonding between the front edge 25 and the groove 56 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 18B illustrates a side view of the thermal energy transfer device 2004. FIG. 18BA illustrates an enlarged cross-sectional view of the thermal energy transfer device 2004 along the cross section AA, showing the internal fluid channel 7004 and a channel opening 61, which may serve as an inlet or outlet port. FIG. 18BB illustrates an enlarged cross-sectional view of the thermal energy transfer device 2004 along the cross section BB.

The attachment of the fin structure 1012 to the base plate 1016 results in the three-dimensional thermal energy transfer device 2004 that contains internal fluid channel for a fluid, such as a liquid or a gas, to flow through to transfer thermal energy from an object that is attached to the thermal energy transfer device 2004. For example, a heat-generating object, such as a diode laser, a microprocessor or another type of integrated circuit, may be attached to one of the primary surfaces 24 of the fin structure 1012 or the second primary surface 55 of the base plate 1016. In the case that the heat-generating object is attached to one of the primary surfaces 24 of the fin structure 1012, heat from the heat-generating object is transferred at least by conduction to the fin structure 1012. The fin structure 1012 dissipates a majority of the absorbed heat by convection to the fluid circulated through the internal fluid channel 7004, and a small portion of the absorbed heat is dissipated by radiation to an ambient fluid surrounding the thermal energy transfer device 2004, such as ambient air, for example, and by conduction to the base plate 1016. In the case that the heat-generating object is attached to the second primary surface 55 of the base plate 1016, heat from the heat-generating object is transferred at least by conduction to the base plate 1016. The base plate 1016 dissipates the absorbed heat by conduction to the fin structure 1012, and by convection as well as radiation to the ambient fluid surrounding the thermal energy transfer device 2004. The fin structure 1012 in turn dissipates the absorbed heat by convection to the fluid circulated through the internal fluid channel 7004, and by radiation to the ambient fluid that surrounds the thermal energy transfer device 2004.

Because one of the peripheral edges of the fin structure 1012 is used to attach the fin structure 1012 to the base plate 1016, the angle between the first primary surface 54 of the base plate 1016 and at least one of the primary surfaces 24 of the fin structure 1012 is greater than 0 degrees. In one embodiment, the angle between the first primary surface 54 of the base plate 1016 and at least one of the primary surfaces 24 of the fin structure 1012 is substantially 90 degrees, as shown in FIGS. 18A, 18BA and 18BB.

Figure 19A:
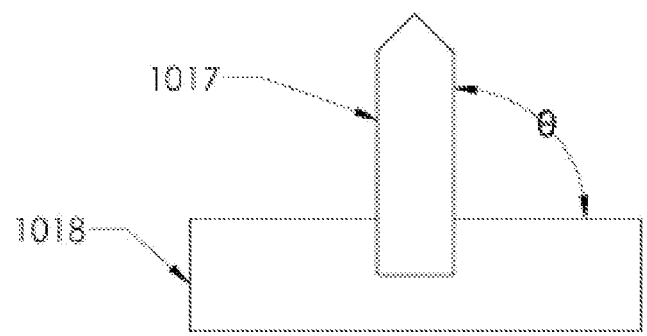
FIGS. 19A-19C are each a simplified diagram showing a fin structure attached to a base plate according to one non-limiting illustrated embodiment.
Figure 19B:
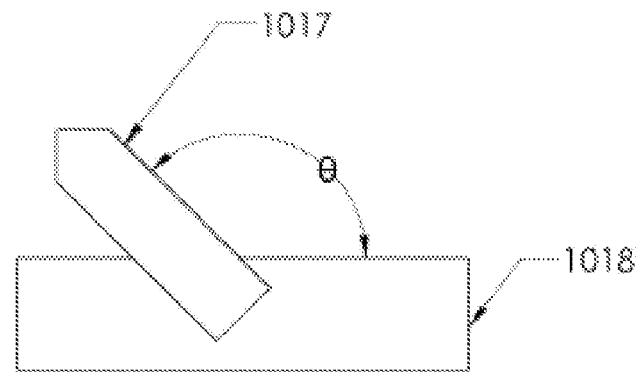
Figure 19C:
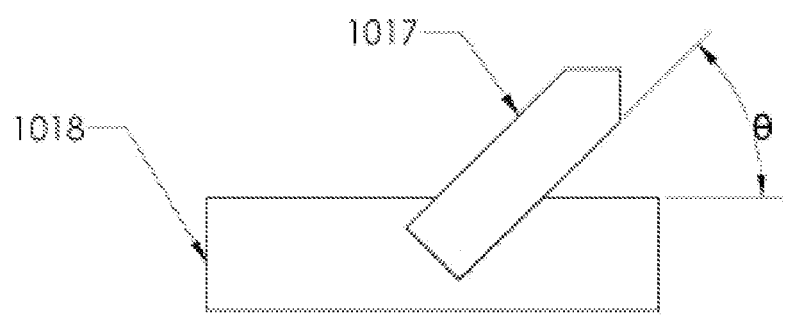

Each of FIGS. 19A-19C illustrates a fin structure 1017 attached to a base plate 1018 according to one non-limiting illustrated embodiment. As shown in FIG. 19A, the fin structure 1017 is attached to the base plate 1018 substantially orthogonally. That is, the angle θ, as measured between one of the primary surfaces of the fin structure 1017 and the top primary surface of the base plate 1018, is substantially 90 degrees. As shown in FIG. 19B, the fin structure 1017 is attached to the base plate 1018 with the angle θ, as measured between one of the primary surfaces of the fin structure 1017 and the top primary surface of the base plate 1018, being greater than 0 degrees and less than 180 degrees. As shown in FIG. 19C, the fin structure 1017 is attached to the base plate 1018 with the angle θ, as measured between one of the primary surfaces of the fin structure 1017 and the top primary surface of the base plate 1018, being greater than 0 degrees and less than 90 degrees. In various embodiments, neither of the two primary surfaces of the fin structure 1017 is adjacent to, i.e., having an angle θ of substantially 0 degrees, the top primary surface of the base plate 1018.

Each of FIGS. 20A-20CB illustrates a respective view of a base plate 1019 that has multiple grooves according to one non-limiting illustrated embodiment. As shown in FIGS. 20A and 20B, the base plate 1019 includes a first primary surface 62, a second primary surface 63 that is opposite and substantially parallel to the first primary surface 62, four peripheral edges 65, 66, 67 and 68, and a plurality of grooves 64 on the first primary surface 62. In one embodiment, the four peripheral edges 65, 66, 67 and 68 are etched to form a V-shaped wedge contour. In another embodiment, at least one of the four peripheral edges 65, 66, 67 and 68 is cut to have a vertical straight edge that is substantially orthogonal to at least one of the primary surfaces 62 and 63. The base plate 1019 is made of a non-metal material. In one embodiment, the base plate 1019 is made from a single-crystal silicon wafer, a multi-crystal silicon wafer, another silicon-based material, or a ceramic material such as, for example, beryllium oxide, aluminum oxide, or silicon carbide. FIG. 20C illustrates a side view of the base plate 1019. FIG. 20CA illustrates an enlarged cross-sectional view of the base plate 1019 along the cross section AA. FIG. 20CB illustrates an enlarged cross-sectional view of the base plate 1019 along the cross section BB. Although five grooves 64 are shown in FIGS. 20A-20CB, there may be more or fewer grooves 64 in other embodiments.

In one embodiment, the grooves 64 are parallel to each other and extend from one end of the base plate 1019 near the edge 67 toward another end of the base plate 1019 near the edge 68. The grooves 64 do not cut through either of the edges 67 and 68. Each of the grooves 64 has a cross-sectional contour of a V-notch. In one embodiment, the base plate 1019 further includes a plurality of channel openings 69 on the second primary surface 63 that meet the grooves 64 on the first primary surface 62. The locations of the channel openings 69 corresponding to each of the grooves 64 are precisely matched with the locations of the openings of the internal fluid channel in a fin structure that is to be received in the groove 64. In one embodiment, at least one of the grooves 64 has three channel openings 69 when the fin structure has an E-shaped internal fluid channel with three openings, e.g., one as an inlet port and the other two as outlet ports. In another embodiment, at least one of the grooves 64 has two channel openings 69 when the fin structure has a U-shaped internal fluid channel with two openings, e.g., one as an inlet port and the other as an outlet port. In the embodiment shown in FIGS. 20A and 20B, each groove 64 has three channel openings 69.

Each of FIGS. 21A-21CB illustrates a respective view of a base plate 1020 that has multiple grooves according to one non-limiting illustrated embodiment. As shown in FIGS. 21A and 21B, the base plate 1020 includes a first primary surface 70, a second primary surface 71 that is opposite and substantially parallel to the first primary surface 70, four peripheral edges 73, 74, 75 and 76, and a plurality of grooves 72 on the first primary surface 70. In one embodiment, the four peripheral edges 73, 74, 75 and 76 are etched to form a V-shaped wedge contour. In another embodiment, at least one of the four peripheral edges 73, 74, 75 and 76 is cut to have a vertical straight edge that is substantially orthogonal to at least one of the primary surfaces 70 and 71. The base plate 1020 is made of a non-metal material. In one embodiment, the base plate 1020 is made from a single-crystal silicon wafer, a multi-crystal silicon wafer, another silicon-based material, or a ceramic material such as, for example, beryllium oxide, aluminum oxide, or silicon carbide. FIG. 21C illustrates a side view of the base plate 1020. FIG. 21CA illustrates an enlarged cross-sectional view of the base plate 1020 along the cross section AA. FIG. 21CB illustrates an enlarged cross-sectional view of the base plate 1020 along the cross section BB. Although five grooves 72 are shown in FIGS. 21A-21CB, there may be more or fewer grooves 72 in other embodiments.

In one embodiment, the grooves 72 are parallel to each other and extend from one end of the base plate 1020 near the edge 75 toward another end of the base plate 1020 near the edge 76. The grooves 72 do not cut through either of the edges 75 and 76. Each of the grooves 72 has a cross-sectional contour of a double V-notch. In one embodiment, the base plate 1020 further includes a plurality of channel openings 77 on the second primary surface 71 that meet the grooves 72 on the first primary surface 70. The locations of the channel openings 77 corresponding to each of the grooves 72 are precisely matched with the locations of the openings of the internal fluid channel in a fin structure that is to be received in the groove 72. In one embodiment, at least one of the grooves 72 has three channel openings 77 when the fin structure has an E-shaped internal fluid channel with three openings, e.g., one as an inlet port and the other two as outlet ports. In another embodiment, at least one of the grooves 72 has two channel openings 77 when the fin structure has a U-shaped internal fluid channel with two openings, e.g., one as an inlet port and the other as an outlet port. In the embodiment shown in FIGS. 21A and 21B, each groove 72 has three channel openings 77.

Each of FIGS. 22A-22CB illustrates a respective view of a base plate 1021 that has multiple grooves according to one non-limiting illustrated embodiment. As shown in FIGS. 22A and 22B, the base plate 1021 includes a first primary surface 78, a second primary surface 79 that is opposite and substantially parallel to the first primary surface 78, four peripheral edges 81, 82, 83 and 84, and a plurality of grooves 80 on the first primary surface 78. In one embodiment, the four peripheral edges 81, 82, 83 and 84 are etched to form a V-shaped wedge contour. In another embodiment, at least one of the four peripheral edges 81, 82, 83 and 84 is cut to have a vertical straight edge that is substantially orthogonal to at least one of the primary surfaces 78 and 79. The base plate 1021 is made of a non-metal material. In one embodiment, the base plate 1021 is made from a single-crystal silicon wafer, a multi-crystal silicon wafer, another silicon-based material, or a ceramic material such as, for example, beryllium oxide, aluminum oxide, or silicon carbide. FIG. 22C illustrates a side view of the base plate 1021. FIG. 22CA illustrates an enlarged cross-sectional view of the base plate 1021 along the cross section AA. FIG. 22CB illustrates an enlarged cross-sectional view of the base plate 1021 along the cross section BB. Although five grooves 80 are shown in FIGS. 22A-22CB, there may be more or fewer grooves 80 in other embodiments.

In one embodiment, the grooves 80 are parallel to each other and extending from one end of the base plate 1021 near the edge 83 toward another end of the base plate 1021 near the edge 84. The grooves 80 do not cut through either of the edges 83 and 84. Each of the grooves 80 has a cross-sectional contour of a trapezoid. In one embodiment, the base plate 1021 further includes a plurality of channel openings 85 on the second primary surface 79 that meet the grooves 80 on the first primary surface 78. The locations of the channel openings 85 corresponding to each of the grooves 80 are precisely matched with the locations of the openings of the internal fluid channel in a fin structure that is to be received in the groove 80. In one embodiment, at least one of the grooves 80 has three channel openings 85 when the fin structure has an E-shaped internal fluid channel with three openings, e.g., one as an inlet port and the other two as outlet ports. In another embodiment, at least one of the grooves 80 has two channel openings 85 when the fin structure has a U-shaped internal fluid channel with two openings, e.g., one as an inlet port and the other as an outlet port. In the embodiment shown in FIGS. 22A and 22B, each groove 80 has three channel openings 85.

Figure 23A:
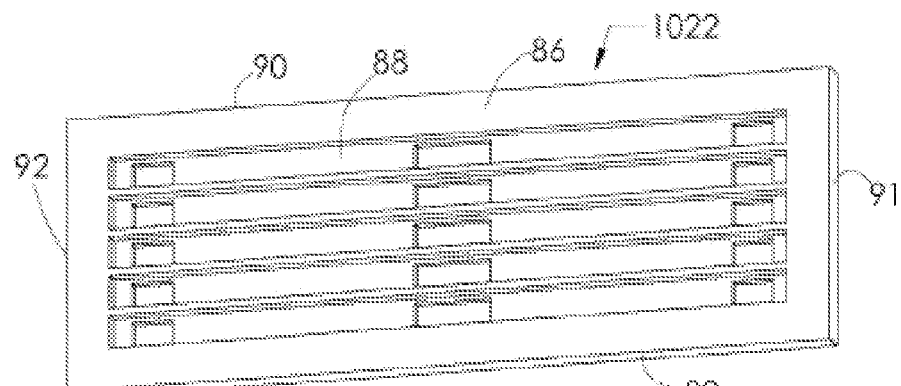
FIGS. 23A-23CB are each a diagram showing a respective view of a base plate that has multiple rectangular grooves according to one non-limiting illustrated embodiment.
Figure 23B:
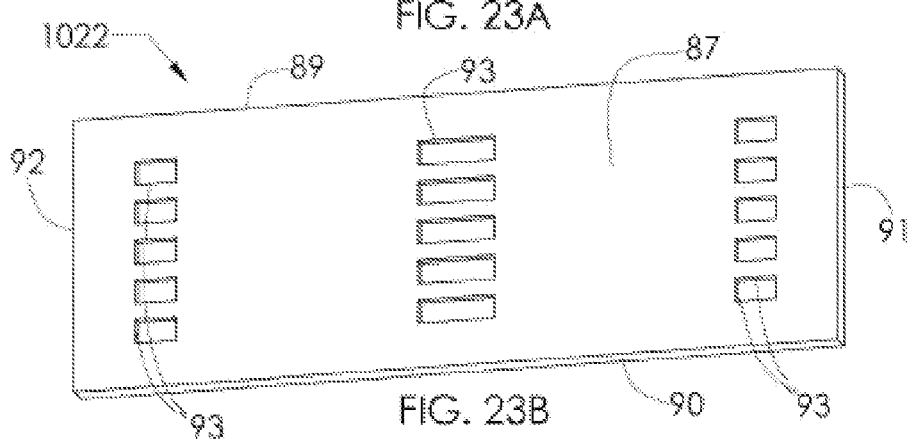
Figure 23C:
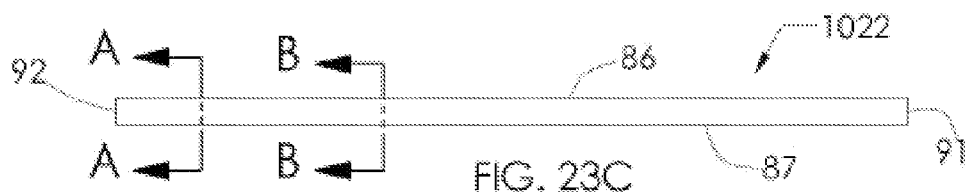
Figure 23C:
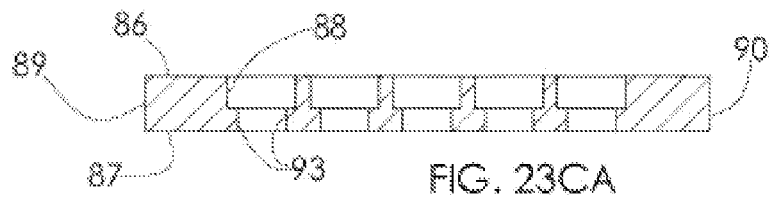
Figure 23C:

Each of FIGS. 23A-23CB illustrates a respective view of a base plate 1022 that has multiple grooves according to one non-limiting illustrated embodiment. As shown in FIGS. 23A and 23B, the base plate 1022 includes a first primary surface 86, a second primary surface 87 that is opposite and substantially parallel to the first primary surface 86, four peripheral edges 89, 90, 91 and 92, and a plurality of grooves 88 on the first primary surface 86. In one embodiment, the four peripheral edges 89, 90, 91 and 92 are etched to form a V-shaped wedge contour. In another embodiment, at least one of the four peripheral edges 89, 90, 91 and 92 is cut to have a vertical straight edge that is substantially orthogonal to at least one of the primary surfaces 86 and 87. The base plate 1022 is made of a non-metal material. In one embodiment, the base plate 1022 is made from a single-crystal silicon wafer, a multi-crystal silicon wafer, another silicon-based material, or a ceramic material such as, for example, beryllium oxide, aluminum oxide, or silicon carbide. FIG. 23C illustrates a side view of the base plate 1022. FIG. 23CA illustrates an enlarged cross-sectional view of the base plate 1022 along the cross section AA. FIG. 23CB illustrates an enlarged cross-sectional view of the base plate 1022 along the cross section BB. Although five grooves 88 are shown in FIGS. 23A-23CB, there may be more or fewer grooves 88 in other embodiments.

In one embodiment, the grooves 88 are parallel to each other and extend from one end of the base plate 1022 near the edge 91 toward another end of the base plate 1022 near the edge 92. The grooves 88 do not cut through either of the edges 91 and 92. Each of the grooves 88 has a cross-sectional contour of a rectangle. In one embodiment, the base plate 1022 further includes a plurality of channel openings 93 on the second primary surface 87 that meet the grooves 88 on the first primary surface 86. The locations of the channel openings 93 corresponding to each of the grooves 88 are precisely matched with the locations of the openings of the internal fluid channel in a fin structure that is to be received in the groove 88. In one embodiment, at least one of the grooves 88 has three channel openings 93 when the fin structure has an E-shaped internal fluid channel with three openings, e.g., one as an inlet port and the other two as outlet ports. In another embodiment, at least one of the grooves 88 has two channel openings 93 when the fin structure has a U-shaped internal fluid channel with two openings, e.g., one as an inlet port and the other as an outlet port. In the embodiment shown in FIGS. 23A and 23B, each groove 88 has three channel openings 93.

Each of FIGS. 24A-24BA illustrates a respective view of an assembled thermal energy transfer device 2005 according to one non-limiting illustrated embodiment. As shown in FIGS. 24A and 24B, the thermal energy transfer device 2005 includes a fin structure 94a, a base plate 94b, a mounting block 94c, and a plurality of connector tubes 95. A heat-generating object may be attached to, or otherwise in physical contact with, one of the primary surfaces of the fin structure 94a to allow heat to be transferred from the heat-generating object to the fin structure 94a at least by conduction. The fin structure 94a includes an internal fluid channel 7005 for a fluid, such as a liquid or gas, to flow through to allow thermal energy to be transferred from the fin structure 94a to the fluid at least by convection. The fluid flowing through the internal fluid channel 7005 of the fin structure 94a allows effective removal of the heat generated by a heat-generating object that is attached to either primary surface of the fin structure 94a.

The fin structure 94a may be, for example, the fin structure 1003 of FIG. 4B, the fin structure 1006 of FIG. 6B, the fin structure 1009 of FIG. 8B, or the fin structure 1012 of FIG. 10B. The base plate 94b may be, for example, the base plate 1013 of FIGS. 11A-11C, the base plate 1014 of FIGS. 12A-12C, the base plate 1015 of FIGS. 13A-13C, or the base plate 1016 of FIGS. 14A-14C. The base plate 94b includes a groove, into which a peripheral edge of the fin structure 94a is received, to attach and interlock the fin structure 94a to. In one embodiment, the fin structure 94a is attached to the base plate 94b with a primary plane through the fin structure 94a substantially orthogonal to a primary plane through the base plate 94b, as shown in FIGS. 24A and 24B. In another embodiment, the fin structure 94a is attached to the base plate 94b at an angle θ, as measured between the primary plane through the fin structure 94a and the primary plane through the base plate 94b, that is greater than 0 degrees.

In one embodiment, the mounting block 94c is bonded with the base plate 94b. In one embodiment, the primary surface of the base plate 94b that is bonded to the mounting block 94c is at least partially metalized to facilitate bonding. In one embodiment, the metalized surface is coated with a layer of copper. In another embodiment, the metalized surface is coated with a layer of TiW/Ni/Au. The mounting block 94c has a number of cavities to allow a fluid to flow through the mounting block 94c to enter and exit the fin structure 94a via the base plate 94b. For example, when the fin structure 94a includes an E-shaped internal fluid channel that has three openings, the mounting block 94c has three cavities each aligned with one of the internal fluid channel openings on the fin structure 94a. The base plate 94b in this case also has three channel openings each aligned with one of the internal fluid channel openings on the fin structure 94a. Likewise, when the fin structure 94a includes a U-shaped internal fluid channel that has two openings, the mounting block 94c has two cavities each aligned with one of the internal fluid channel openings on the fin structure 94a. The base plate 94b in this case also has two channel openings each aligned with one of the internal fluid channel openings on the fin structure 94a.

The connector tubes 95 provide a pathway for the fluid to enter and exit the thermal energy transfer device 2005. Each of the connector tubes 95 corresponds to a respective one of the cavities in the mounting block 94c. The connector tubes 95 are attached to, bonded to, or otherwise coupled to the mounting block 94c. In one embodiment, the connector tubes 95 are inserted into the cavities of the mounting block 94c. FIG. 24BA illustrates a cross-sectional view of the thermal energy transfer device 2005 along the cross section AA.

Each of FIGS. 25A-25BA illustrates a respective view of an assembled thermal energy transfer device 2006 according to another non-limiting illustrated embodiment. As shown in FIGS. 25A and 25B, the thermal energy transfer device 2006 includes a plurality of fin structures 96a, a base plate 96b, a mounting block 96c, and a plurality of connector tubes 95. One or more heat-generating objects may be attached to, or otherwise in physical contact with, one or both of the primary surfaces of one or more of the fin structures 96a to allow heat to be transferred from the one or more heat-generating objects to the one or more fin structures 96a at least by conduction. At least one of the fin structures 96a includes an internal fluid channel 7006 for a fluid, such as a liquid or gas, to flow through to allow thermal energy to be transferred from the at least one fin structure 96a to the fluid at least by convection. The fluid flowing through the internal fluid channel 7006 of the at least one fin structure 96a allows effective removal of the heat generated by a heat-generating object that is attached to a primary surface of a fin structure 96a.

As shown in FIG. 25B, a plurality of heat-generating objects 97, diode lasers for example, are attached to the fin structures 96a in a way that each of the heat-generating objects 97 is sandwiched between two adjacent fin structures 96a. Thus, heat generated by each of the heat-generating objects 97 can be dissipated at least by conduction to the fin structures 96a, and by convection as well as radiation to an ambient fluid that surrounds the thermal energy transfer device 2006, such as ambient air.

The fin structure 96a may be, for example, the fin structure 1003 of FIG. 4B, the fin structure 1006 of FIG. 6B, the fin structure 1009 of FIG. 8B, or the fin structure 1012 of FIG.

10B. The base plate 96b may be, for example, the base plate 1019 of FIGS. 20A-20C, the base plate 1020 of FIGS. 21A-21C, the base plate 1021 of FIGS. 22A-22C, or the base plate 1022 of FIGS. 23A-23C. The exterior surfaces of each of the fin structures 96a may be metalized, and the layer of metallic material may be used to serve as a pathway to provide electricity to the heat-generating objects 97. In one embodiment, the metalized surface is coated with a layer of copper. In another embodiment, the metalized surface is coated with a layer of TiW/Ni/Au.

In one embodiment, the thermal energy transfer device 2006 further includes one or more electrodes 98 attached to at least one of the outer fin structures 96a as shown in FIGS. 25A and 25B. When there are two electrodes 98, each electrically coupled to a metalized surface of a respective fin structure 96a, the electrodes 98 provide electrical connection to power the heat-generating objects 97 that are sandwiched between the fin structures 96a. Electrical wirings are not shown in the interest of simplicity and to avoid unnecessarily obstructing the figures.

The base plate 96b includes a plurality of grooves to receive the fin structures 96a. In one embodiment, the fin structures 96a are attached to the base plate 96b with a primary plane through each fin structure 96a substantially orthogonal to a primary plane through the base plate 96b, as shown in FIGS. 25A and 25B. In another embodiment, the fin structures 96a are attached to the base plate 96b at an angle θ, as measured between the primary plane through each fin structure 96a and the primary plane through the base plate 96b, that is greater than 0 degrees.

In one embodiment, the mounting block 96c is bonded with the base plate 96b. In one embodiment, the primary surface of the base plate 96b that is bonded to the mounting block 96c is at least partially metalized to facilitate bonding. In one embodiment, the metalized surface is coated with a layer of copper. In another embodiment, the metalized surface is coated with a layer of TiW/Ni/Au. The mounting block 96c has a number of cavities to allow a fluid to flow through the mounting block 96c to enter and exit the fin structures 96a via the base plate 96b. For example, when at least one of the fin structures 96a includes an E-shaped internal fluid channel that has three openings, the mounting block 96c has three cavities each aligned with one of the internal fluid channel openings on the at least one fin structure 96a. The base plate 96b in this case also has three channel openings each aligned with one of the internal fluid channel openings on the at least one fin structure 96a. Likewise, when at least one of the fin structures 96a includes a U-shaped internal fluid channel that has two openings, the mounting block 96c has two cavities each aligned with one of the internal fluid channel openings on the at least one fin structure 96a. The base plate 96b in this case also has two channel openings each aligned with one of the internal fluid channel openings on the at least one fin structure 96a.

The connector tubes 95 provide a pathway for the fluid to enter and exit the thermal energy transfer device 2006. Each of the connector tubes 95 corresponds to a respective one of the cavities in the mounting block 96c. The connector tubes 95 are attached to, bonded to, or otherwise coupled to the mounting block 96c. In one embodiment, the connector tubes 95 are inserted into the cavities of the mounting block 96c. FIG. 25BA illustrates a cross-sectional view of the thermal energy transfer device 2006 along the cross section AA.

Figure 26:
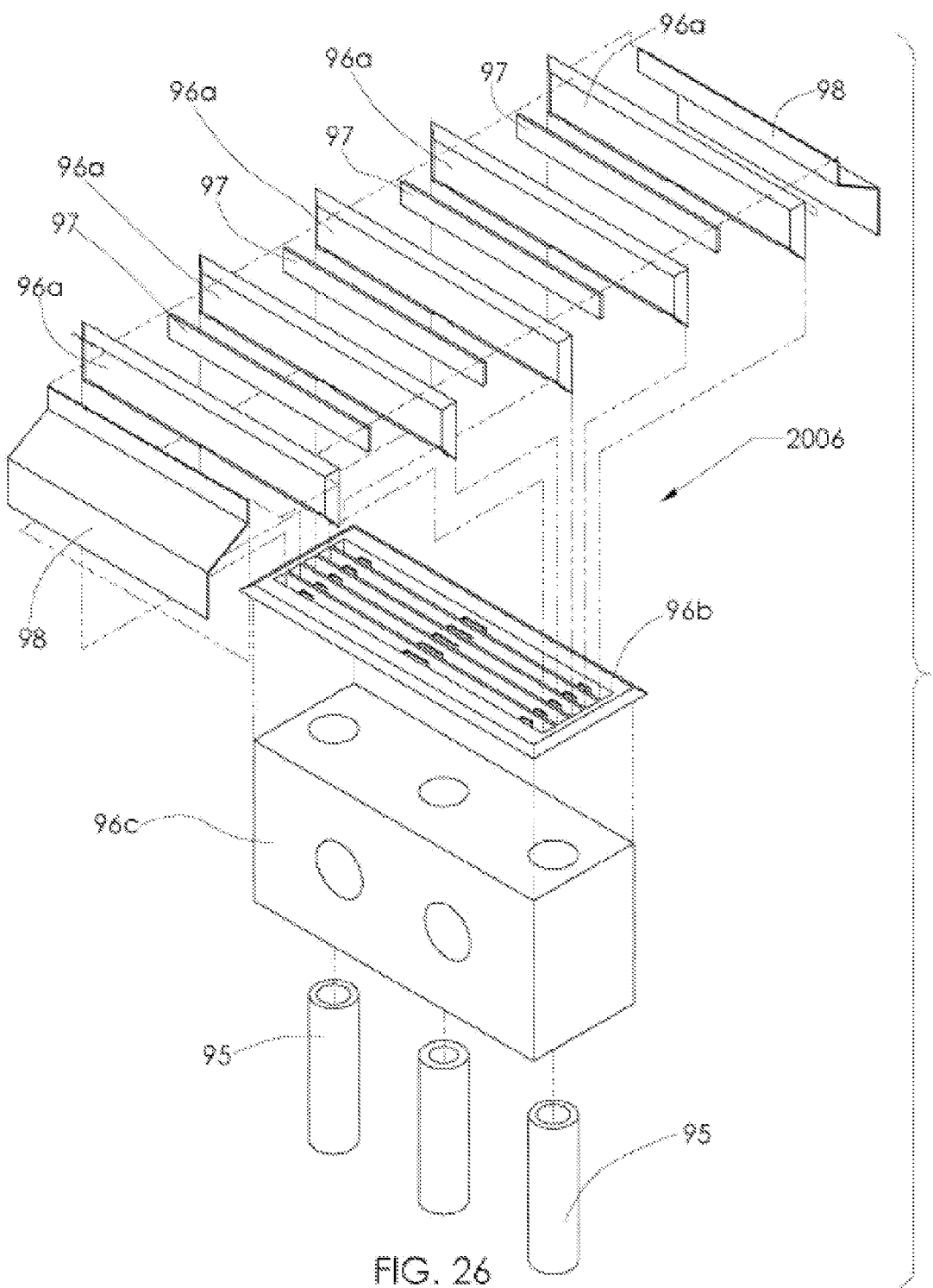
FIG. 26 is a diagram showing an assembly view of the thermal energy transfer device of FIG. 25A and a plurality of thermal energy-generating objects according to one non-limiting illustrated embodiment.

FIG. 26 illustrates an assembly view of the thermal energy transfer device 2006 and a plurality of heat-generating objects 97. Although there are five fin structures 96a and five grooves on the base plate 96b shown in FIG. 26, there may be more or fewer fin structures 96a and five grooves on the base plate 96b in other embodiments. Likewise, although there are three cavities in the mounting block 96c and three connector tubes 95 shown in FIG. 26, corresponding to three internal fluid channel openings in at least one of the fin structures 96a, there may be more or fewer cavities in the mounting block 96c and a corresponding number of connector tubes 95, corresponding to more or fewer internal fluid channel openings in the at least one fin structure 96a, in other embodiments.

Figure 27:
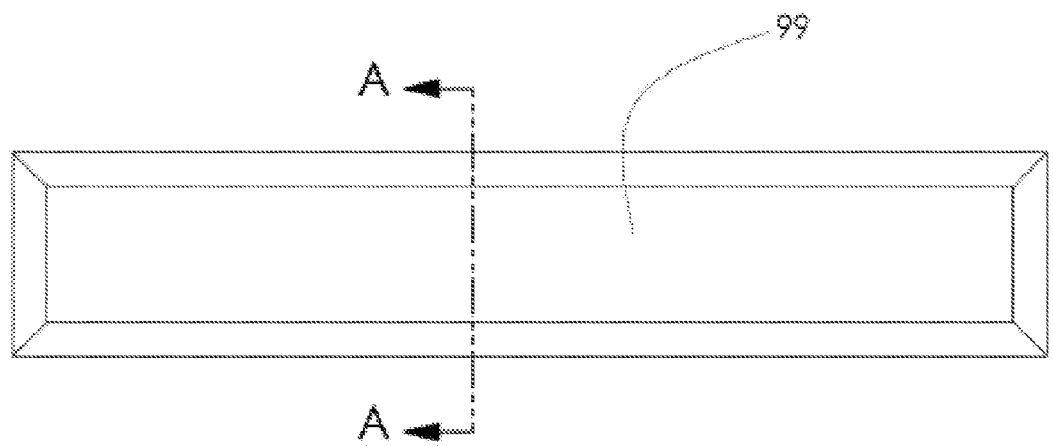
FIGS. 27-27A are each a diagram showing a respective view of a first side of a fin structure according to one non-limiting illustrated embodiment.
Figure 27A:
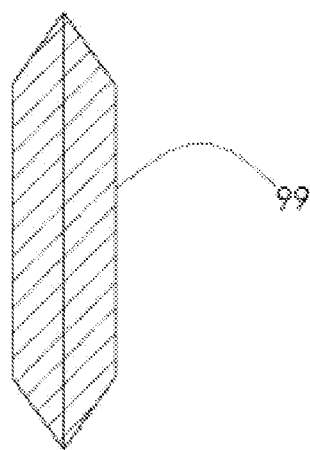

Each of FIGS. 27-27A illustrates a respective view of a fin structure according to one non-limiting illustrated embodiment. FIG. 27 illustrates a perspective view of a fin structure 99. The fin structure 99 is made of a non-metal material. In one embodiment, the fin structure 99 is made from a single-crystal silicon wafer, a multi-crystal silicon wafer, another silicon-based material, or a ceramic material such as, for example, beryllium oxide, aluminum oxide, or silicon carbide. The peripheral edges of the fin structure 99 is cut or etched to have a contour resembling a half V-notch wedge, a full V-notch wedge, or a flat surface that is substantially orthogonal to one or both of the primary surfaces of the fin structure 99. The fin structure 99 does not have an internal fluid channel. Either one or both of the primary surfaces of the fin structure 99 is configured to accommodate the attachment of a heat-generating object, such as a diode laser or an integrated circuit chip. In one embodiment, at least one of the primary surfaces and the peripheral edges of the fin structure 99 is at least partially metalized. FIG. 27A illustrates an enlarged cross-sectional view of the fin structure 99 along the cross section AA. In one embodiment, the fin structure 99 is a silicon-based solar energy collector that can be used to extract usable or storable energy from the electromagnetic radiation from the sun.

Figure 28:
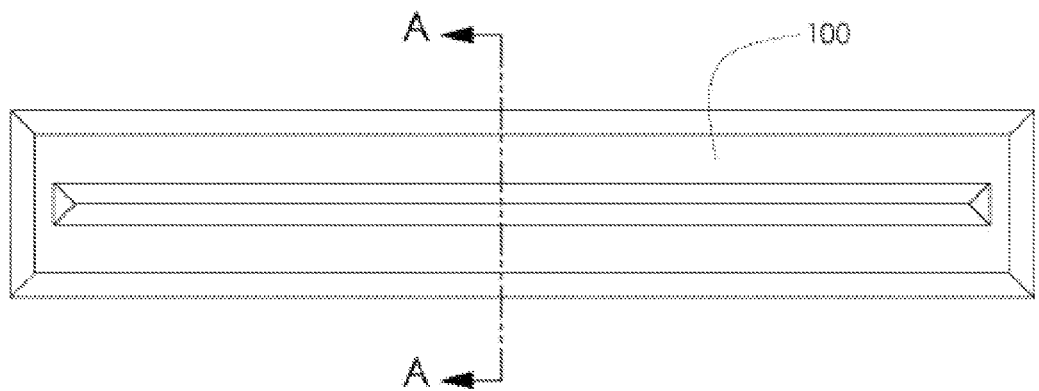
FIGS. 28-28A are each a diagram showing a respective view of a first side of a base plate according to one non-limiting illustrated embodiment.
Figure 28A:
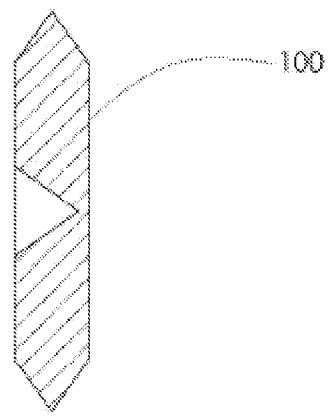

Each of FIGS. 28-28A illustrates a respective view of a base plate according to one non-limiting illustrated embodiment. FIG. 28 illustrates a perspective view of a base plate 100. The base plate 100 is made of a non-metal material. In one embodiment, the base plate 100 is made from a single-crystal silicon wafer, a multi-crystal silicon wafer, another silicon-based material, or a ceramic material such as, for example, beryllium oxide, aluminum oxide, or silicon carbide. The peripheral edges of the base plate 100 is cut or etched to have a contour resembling a half V-notch wedge, a full V-notch wedge, or a flat surface that is substantially orthogonal to one or both of the primary surfaces of the base plate 100. The base plate 100 has one or more grooves on one of its primary surfaces to allow attachment of a fin structure such as the fin structure 99 of FIG. 27. Each of the one or more grooves may be etched to have a cross-sectional contour that is substantially complementary to that of a respective fin structure that is to be received in the groove. For example, if the edge of the fin structure that is received in a groove on the base plate 100 has a V-notch wedge contour, the respective groove has a cross-sectional contour of a V-notch groove to complement the V-notch wedge contour of the edge of the fin structure. The primary surface of the base plate 100 that is opposite the primary surface with the grooves is configured to accommodate the attachment of a heat-generating object, such as a diode laser or an integrated circuit chip, or a mounting block. In one embodiment, at least one of the primary surfaces and the peripheral edges, including the one or more grooves, of the base plate 100 is at least partially metalized. FIG. 28A illustrates an enlarged cross-sectional view of the base plate 100 along the cross section AA. In one embodiment, the base plate 100 is a silicon-based solar energy collector that can be used to extract usable or storable energy from the electromagnetic radiation from the sun.

Figure 29:
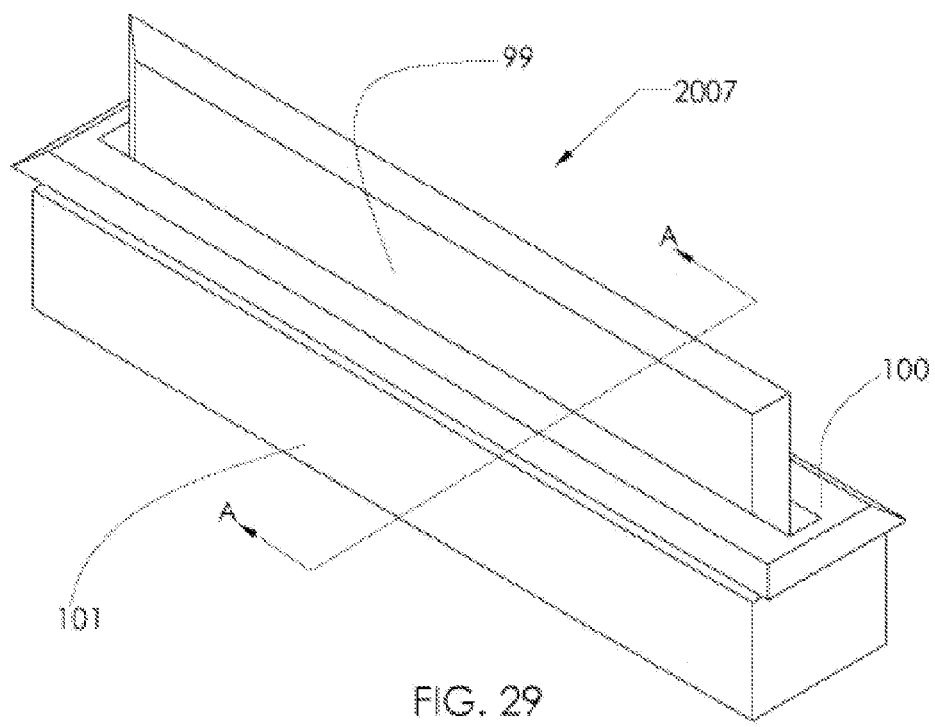
FIGS. 29-29A are each a diagram showing a respective view of an assembled thermal energy transfer device using the fin structure of FIG. 27 and the base plate of FIG. 28 according to one non-limiting illustrated embodiment.
Figure 29A:
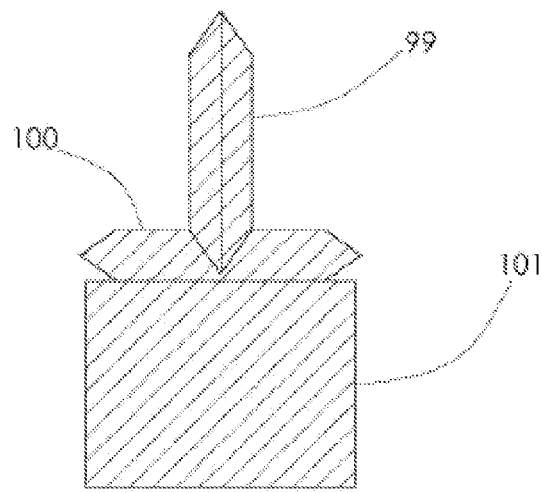

Each of FIGS. 29-29A illustrates a respective view of an assembled thermal energy transfer device using the fin structure of FIG. 27 and the base plate of FIG. 28 according to one non-limiting illustrated embodiment. FIG. 29 illustrates a perspective view of an assembled thermal energy transfer device 2007 using the fin structure 99 of FIG. 27 and the base plate 100 of FIG. 28. The thermal energy transfer device 2007 includes the fin structure 99 attached to the base plate 100 with one of the edges of the fin structure 99 received in a groove on the base plate 100. A heat-generating object may be attached to one of the two primary surfaces of the fin structure 99 or to the primary surface of the base plate 100 opposite to the surface where the fin structure 99 is attached. Heat from such heat-generating object is transferred to the thermal energy transfer device 2007 at least by conduction, and the thermal energy transfer device 2007 in turn transfers the heat to a fluid surrounding the thermal energy transfer device 2007, such as ambient air, by convection and radiation. In one embodiment, the thermal energy transfer device 2007 further includes a mounting block 101 that is attached to the base plate 100, for example, by bonding or by mechanical means such as fasteners. FIG. 29A illustrates an enlarged cross-sectional view of the assembled thermal energy transfer device 2007 along the cross section AA.

Figure 30:
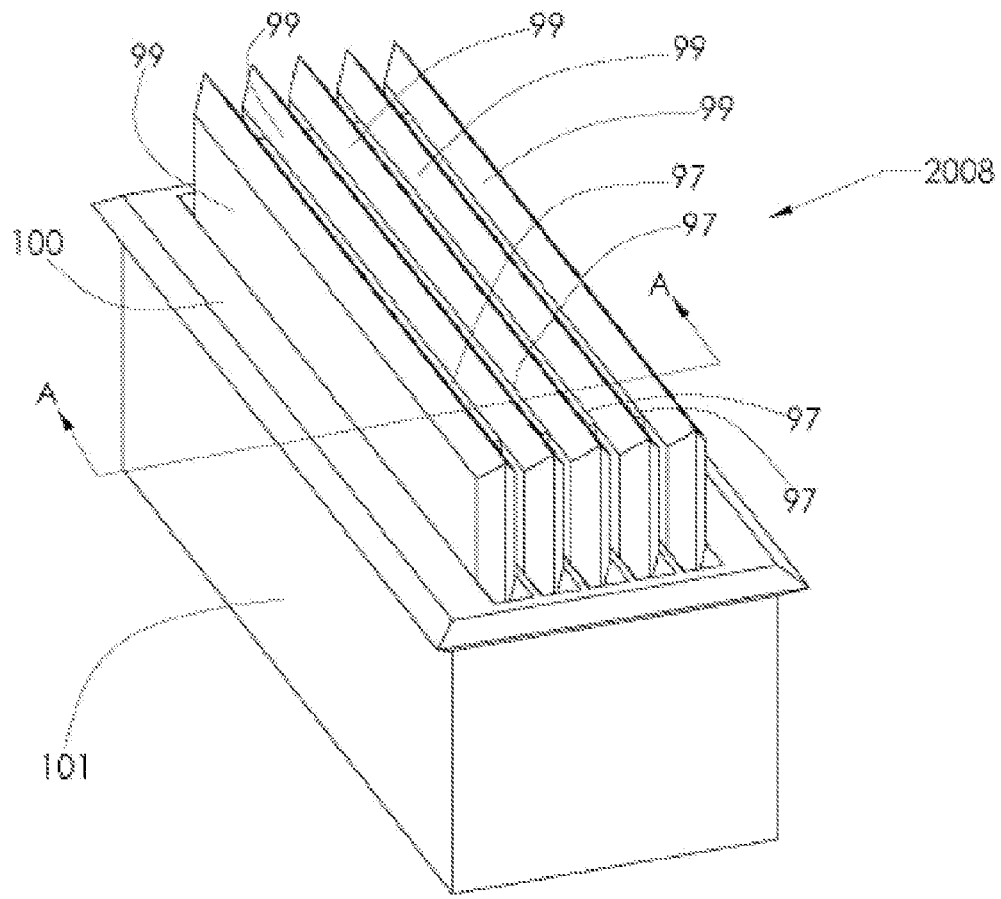
FIGS. 30-30A are each a diagram showing a respective view of another assembled thermal energy transfer device with a plurality of fin structures according to one non-limiting illustrated embodiment.
Figure 30A:
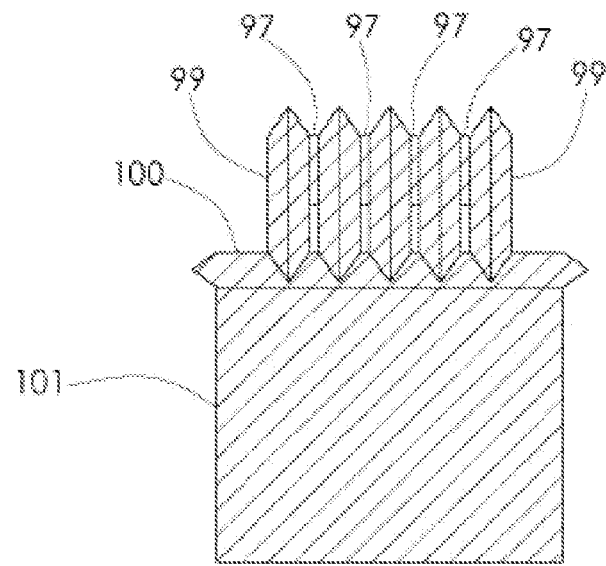

Each of FIGS. 30-30A illustrates a respective view of another assembled thermal energy transfer device with a plurality of fin structures according to one non-limiting illustrated embodiment. FIG. 30 illustrates a perspective view of an assembled thermal energy transfer device 2008 with a plurality of fin structures 99. As shown in FIG. 30, in one embodiment, the base plate 100 includes a plurality of grooves to each receive a respective one of the plurality of fin structures 99. A plurality of heat-generating objects 97 are sandwiched between the fin structures 99. The mounting block 101 is attached to the base plate 100, for example, by bonding or by mechanical means such as fasteners. Heat from each of the heat-generating object 97 is transferred to the thermal energy transfer device 2007 at least by conduction, and the thermal energy transfer device 2007 in turn transfers the heat to a fluid surrounding the thermal energy transfer device 2007, such as ambient air, by convection and radiation. FIG. 30A illustrates an enlarged cross-sectional view of the assembled thermal energy transfer device 2008 along the cross section AA.

Figure 31:
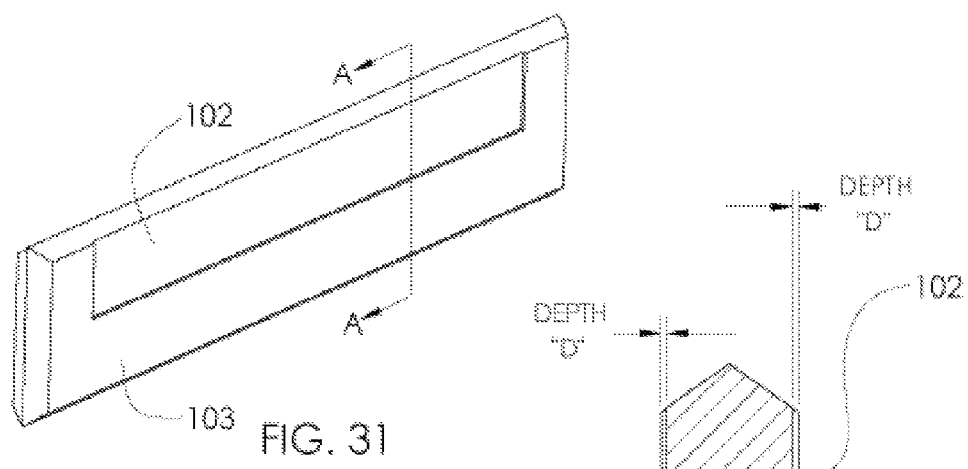
FIGS. 31-32 are each a diagram showing a respective view of a fin structure having a recessed area according to one non-limiting illustrated embodiment.
Figure 32:
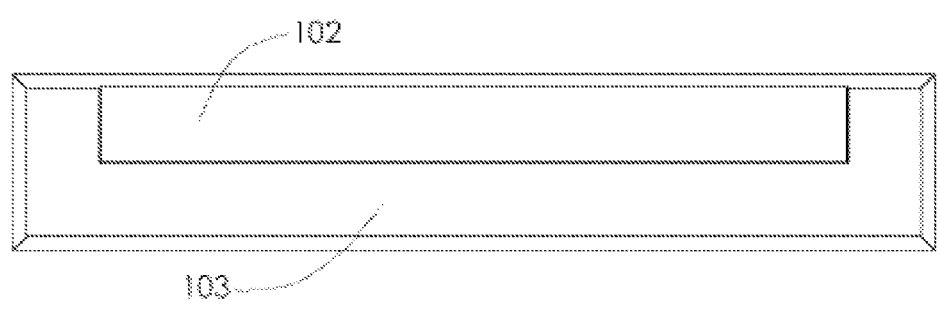

Each of FIGS. 31-32 illustrates a respective view of a fin structure having a recessed area according to one non-limiting illustrated embodiment. FIG. 31 illustrates a perspective view of a fin structure 103 having a recessed area 102 on at least one of the two primary surfaces of the fin structure 103. In one embodiment, each primary surface of the fin structure 103 has a recessed area 102. In another embodiment, only one of the primary surfaces of the fin structure 103 has a recessed area 102. In one embodiment, the recessed area 102 is formed by etching. In one embodiment, the recessed area 102 is shaped and sized to receive and position a heat-generating object, such as a diode laser or an integrated circuit chip. In one embodiment, the depth of the recessed area 102 is more than 1 micron. In one embodiment, the recessed area 102 is etched to fit a heat-generating object with less than 2 microns in dimensional tolerance. In one embodiment, the depth of the recessed area 102 is no more than the dimension of the heat-generating object that is orthogonal to the primary surface of the fin structure 103 where the recessed area 102 is located. In one embodiment, the depth of the recessed area 102 is no more than half of the dimension of the heat-generating object that is orthogonal to the primary surface of the fin structure 103 where the recessed area 102 is located.

Figure 31A:
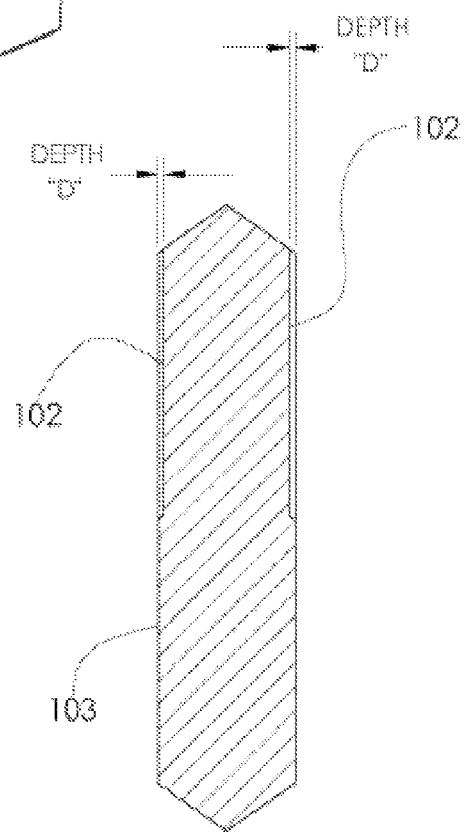

The fin structure 103 is made of a non-metal material. In one embodiment, the fin structure 103 is made from a single-crystal silicon wafer, a multi-crystal silicon wafer, another silicon-based material, or a ceramic material such as, for example, beryllium oxide, aluminum oxide, or silicon carbide. The peripheral edges of the fin structure 103 is cut or etched to have a contour resembling a half V-notch wedge, a full V-notch wedge, or a flat surface that is substantially orthogonal to one or both of the primary surfaces of the fin structure 103. The fin structure 103 may or may not have an internal fluid channel. FIG. 31A illustrates an enlarged cross-sectional view of the fin structure 103 along the cross section AA. In the embodiment shown in FIG. 31A, the fin structure 103 does not have an internal fluid channel. FIG. 32 illustrates a perspective view of a first side of the fin structure 103.

Figure 33:
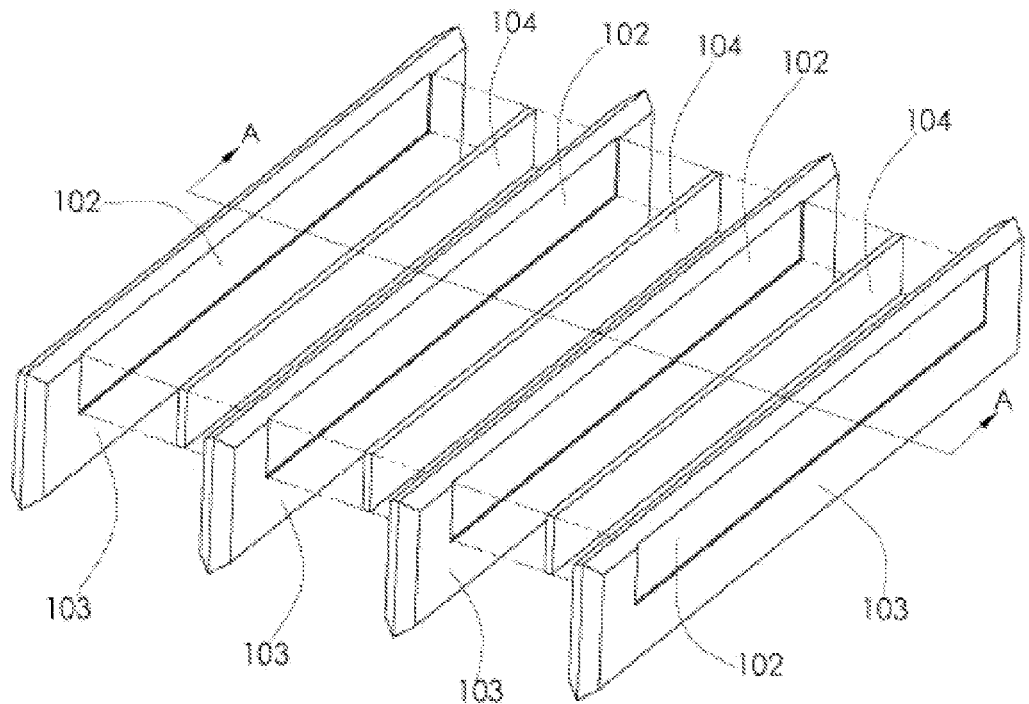
FIGS. 33-34A are each a diagram showing a respective view of an assembly of a plurality of fin structures of FIG. 31 and a plurality of thermal energy-generating objects according to one non-limiting illustrated embodiment.
Figure 33A:
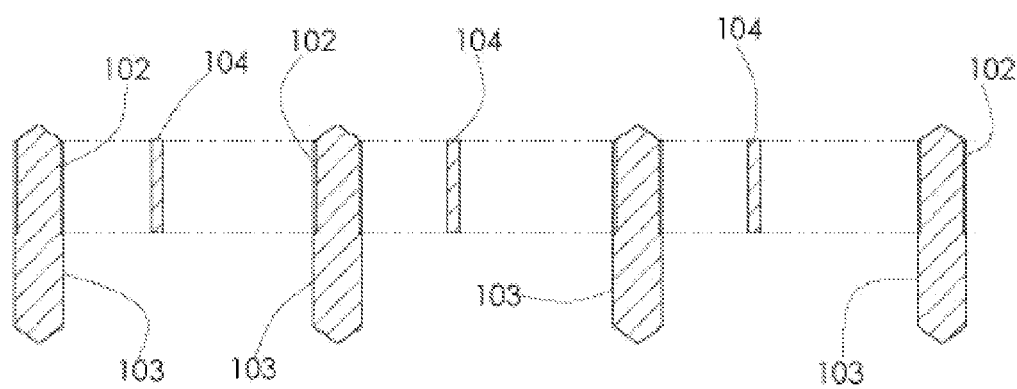
Figure 34:
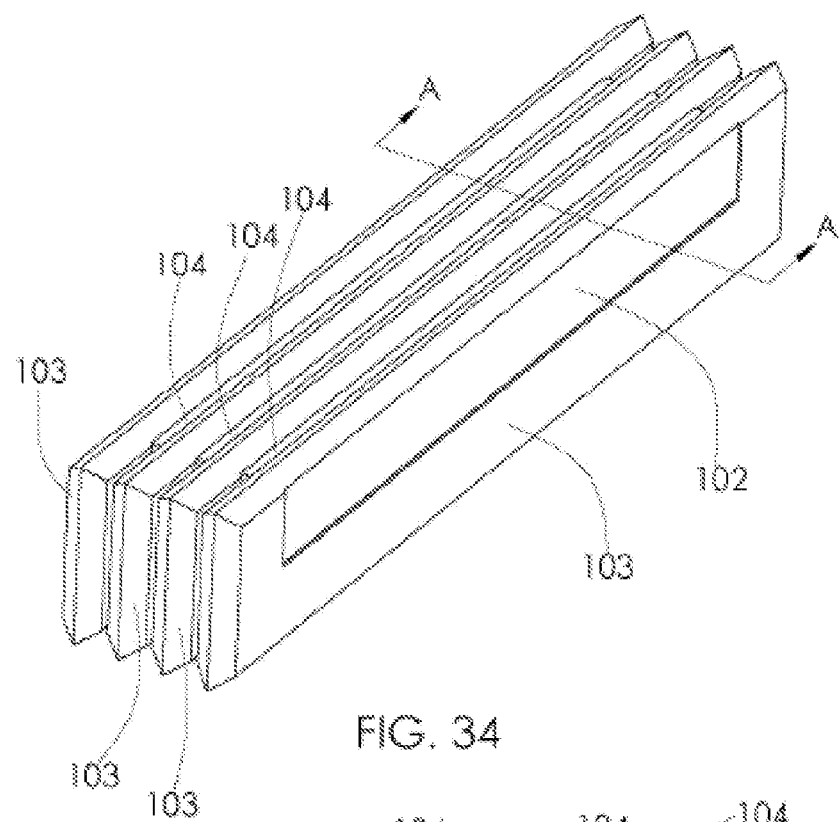
Figure 34A:
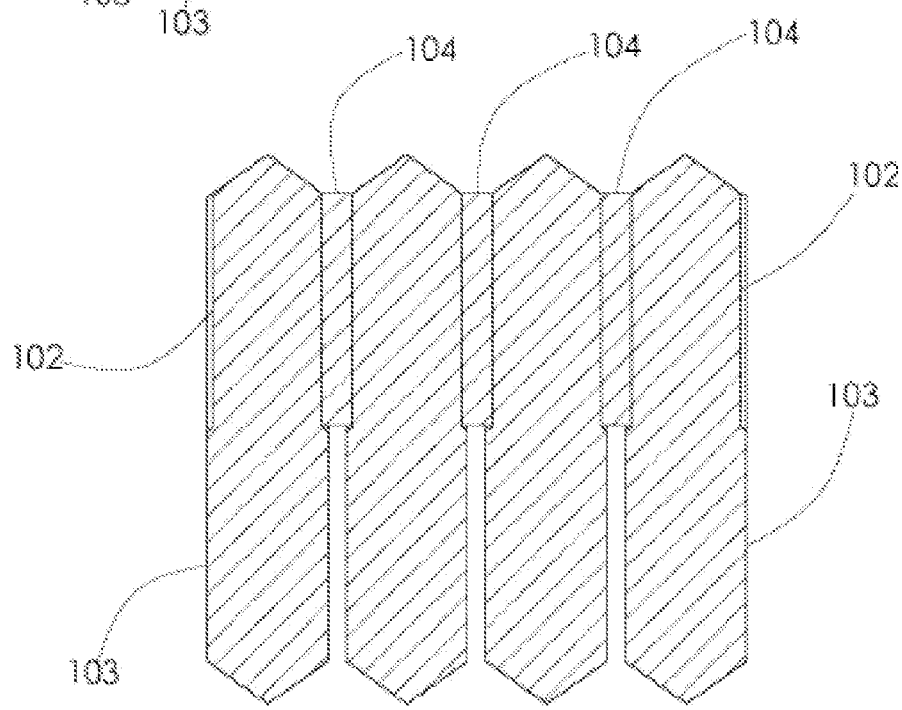

Each of FIGS. 33-34A illustrates a respective view of an assembly of a plurality of fin structures of FIG. 31 and a plurality of thermal energy-generating objects according to one non-limiting illustrated embodiment. FIG. 33 illustrates an assembly view of a plurality of the fin structures 103 of FIG. 31 to dissipate thermal energy from a plurality of heat-generating objects 104. As shown in FIGS. 33-34A, each of the fin structure 103, the heat-generating objects 104 are sandwiched between the fin structures 103. The recessed area 102 on the fin structures 103 allow the heat-generating objects 104 to be snuggly received in the recessed area 102 and attached to the fin structures 103. In one embodiment, at least one of the heat-generating objects 104 is bonded to at least one of the fin structures 103 by metal soldering. FIG. 33A illustrates an enlarged cross-sectional view of the assembly of FIG. 33 along the cross section AA. FIG. 34 illustrates the assembly of FIG. 33. FIG. 34A illustrates an enlarged cross-sectional view of the assembly of FIG. 34 along the cross section AA.

Figure 35:
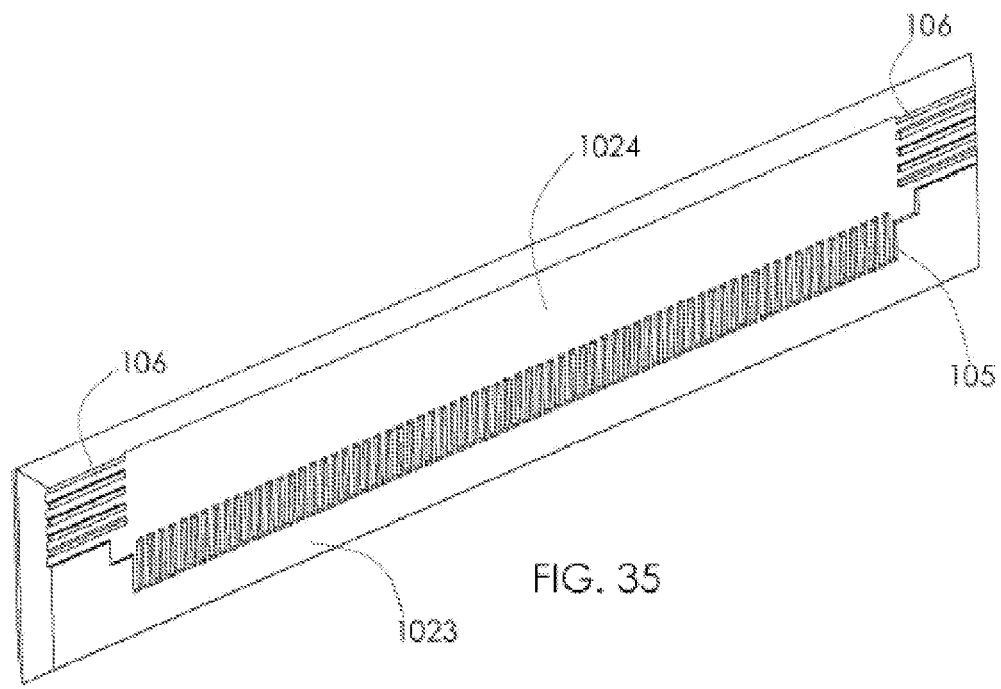
FIGS. 35-36 are each a diagram showing a respective view of a fin structure that has fine grooves extending orthogonally from a recessed area according to one non-limiting illustrated embodiment.
Figure 36:
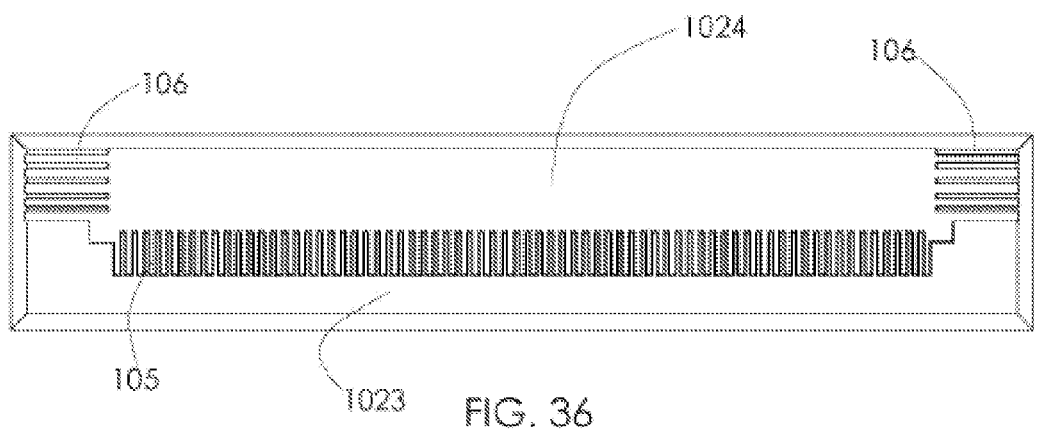

Each of FIGS. 35-36 illustrates a respective view of a fin structure that has fine grooves extending orthogonally from a recessed area according to one non-limiting illustrated embodiment. FIG. 35 illustrates a perspective view of a fin structure 1023 that has fine grooves 105 and 106 extending orthogonally from a recessed area 1024. FIG. 36 illustrates a perspective view of a first side of the fin structure 1023. In one embodiment, each primary surface of the fin structure 1023 has a recessed area 1024. In another embodiment, only one of the primary surfaces of the fin structure 1023 has a recessed area 1024. In one embodiment, the recessed area 1024 is formed by etching. In one embodiment, the recessed area 1024 is shaped and sized to receive and position a heat-generating object, such as a diode laser or an integrated circuit chip. In one embodiment, the depth of the recessed area 1024 is more than 1 micron. In one embodiment, the recessed area 1024 is etched to fit a heat-generating object with less than 2 microns in dimensional tolerance. In one embodiment, the depth of the recessed area 1024 is no more than the dimension of the heat-generating object that is orthogonal to the primary surface of the fin structure 1023 where the recessed area 1024 is located. In one embodiment, the depth of the recessed area 102 is no more than half of the dimension of the heat-generating object that is orthogonal to the primary surface of the fin structure 1023 where the recessed area 1024 is located.

The fin structure 1023 further includes a plurality of fine grooves 105 and 106 that extend from the recessed area 1024. In one embodiment, the fine grooves 105 and 106 are formed by etching. In one embodiment, the fine grooves 105 and 106 extend orthogonally from the recessed area 1024. In one embodiment, the fine grooves 106 extend from the recessed area 1024 to one of the peripheral edges, such as the nearest peripheral edge for example. The fine grooves 105 and 106 allow any excess amount of metal solder used in bonding a heat-generating object to the fin structure 1023 to be contained in the fine grooves 105 and 106 by a wicking action.

The fin structure 1023 is made of a non-metal material. In one embodiment, the fin structure 1023 is made from a single-crystal silicon wafer, a multi-crystal silicon wafer, another silicon-based material, or a ceramic material such as, for example, beryllium oxide, aluminum oxide, or silicon carbide. The peripheral edges of the fin structure 1023 is cut or etched to have a contour resembling a half V-notch wedge, a full V-notch wedge, or a flat surface that is substantially orthogonal to one or both of the primary surfaces of the fin structure 1023. The fin structure 1023 may or may not have an internal fluid channel.

Figure 37:
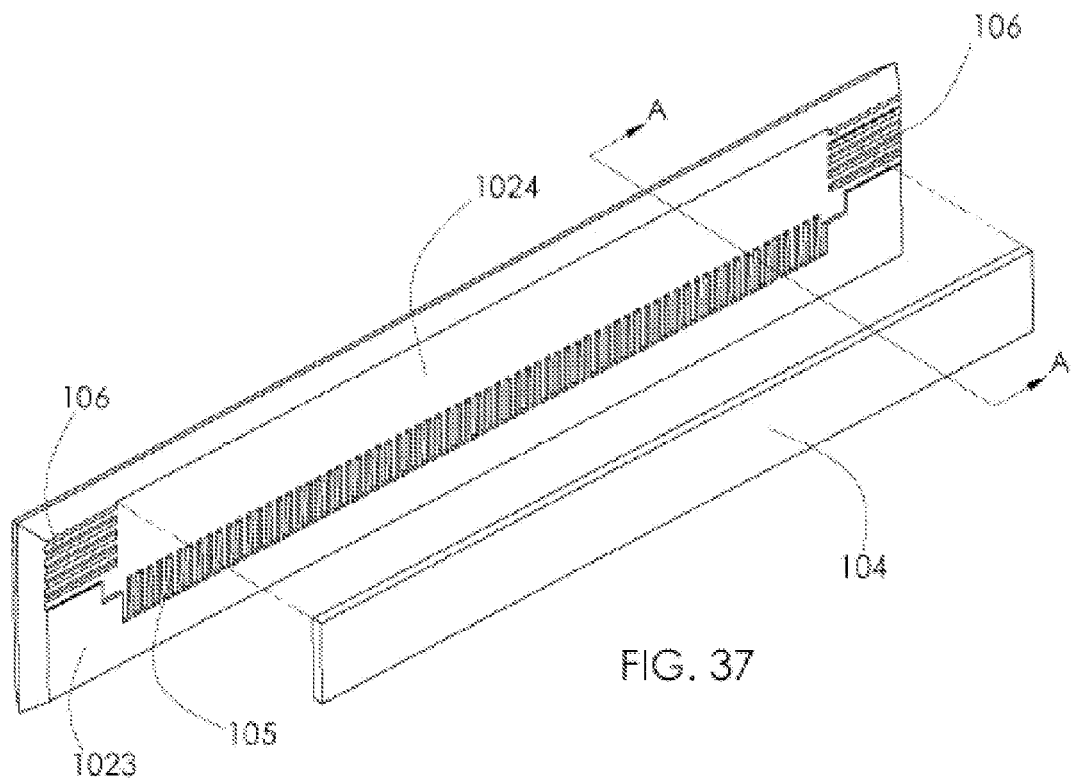
FIGS. 37-38A are each a diagram showing a respective view of an assembly of the fin structure of FIG. 35 with a thermal energy-generating object according to one non-limiting illustrated embodiment.
Figure 37A:
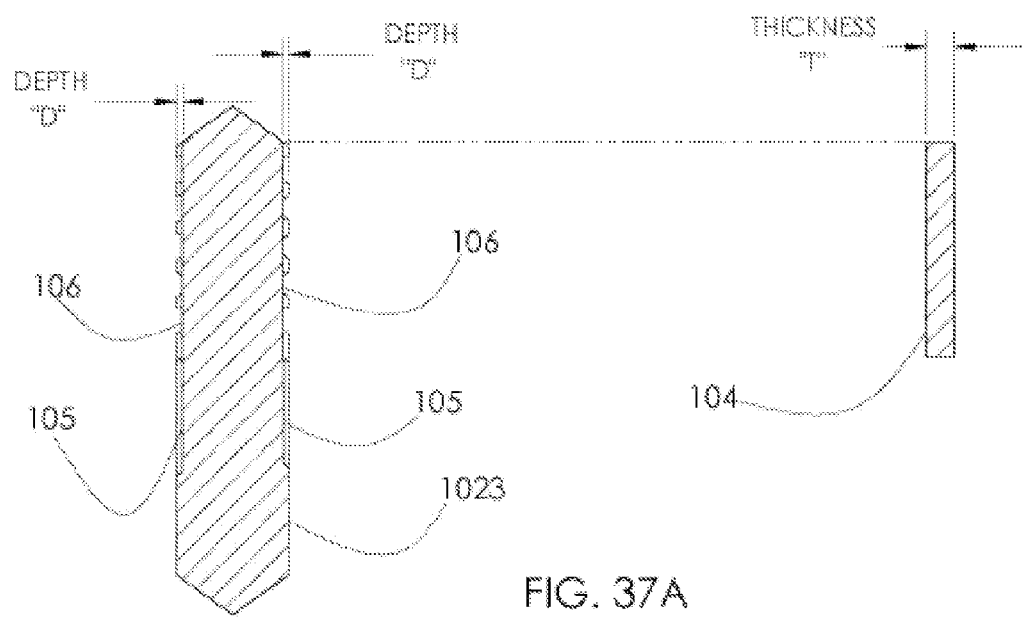
Figure 38:
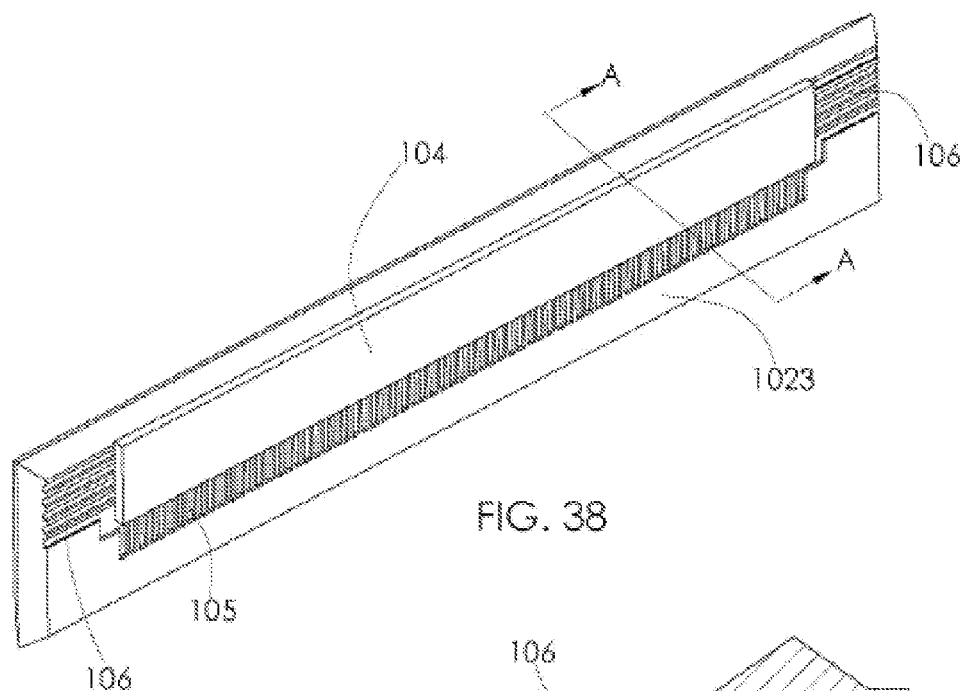
Figure 38A:
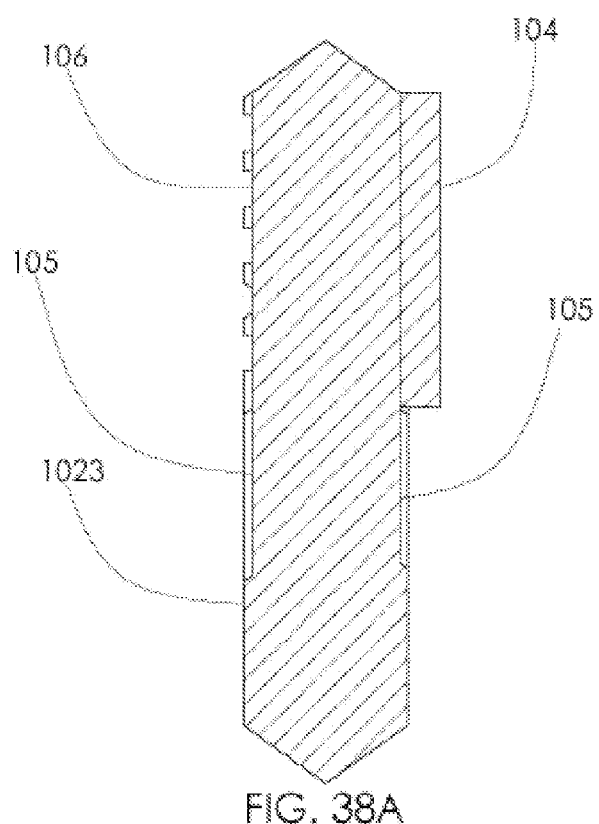

Each of FIGS. 37-38A illustrates a respective view of an assembly of the fin structure of FIG. 35 with a thermal energy-generating device according to one non-limiting illustrated embodiment. FIG. 37 illustrates an assembly view of the fin structure 1023 with a heat-generating object 104. FIG. 37A illustrates an enlarged cross-sectional view of the assembly of FIG. 37 along the cross section AA. FIG. 38 illustrates the fin structure 1023 with the heat-generating object 104 attached thereto. FIG. 38A illustrates an enlarged cross-sectional view of the fin structure 1023 assembled with the heat-generating object 104 along the cross section AA.

Figure 39:
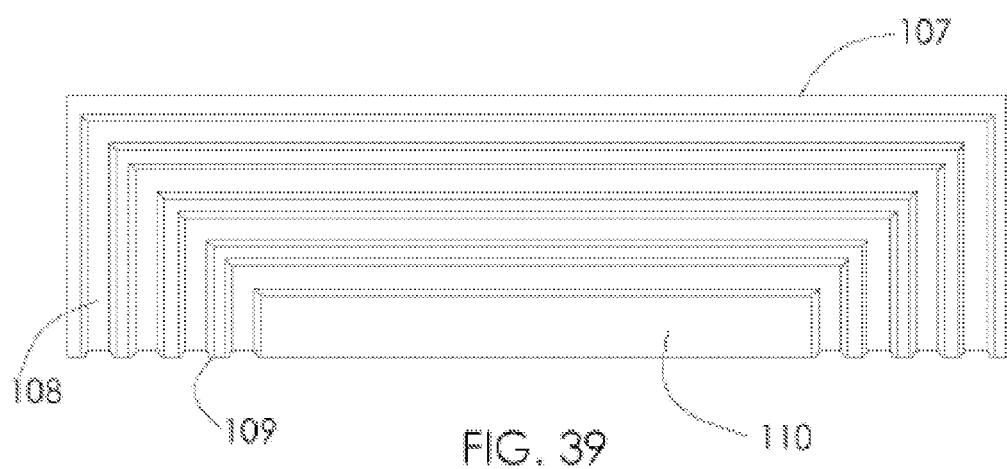
FIG. 39 is a diagram showing a perspective view of a first side of a fin chip having a set of U-shaped fluid channels according to one non-limiting illustrated embodiment.

FIG. 39 illustrates a perspective view of a first side of a fin chip 107 having a set of U-shaped fluid channels 108 according to one non-limiting illustrated embodiment. In one embodiment, one of the two primary surfaces of the fin chip 107, primary surface 110, is etched to have recessed portions that form a plurality of U-shaped fluid channels 108 having a thin wall, as shown in FIG. 39. The etching process may be a conventional silicon micro-machining method to make deep etched grooves. In one embodiment, the fin chip 107 is chemically etched to have a thin wall thickness where the fluid channel 108 is located. In one embodiment, the thickness of the thin wall at the recessed portions of the fin chip 107 is less than 200 microns. In one embodiment, the thickness of the thin wall at the recessed portions of the fin chip 107 is within the range of 10 microns to 200 microns. Each of the fluid channels 108 has two openings on the peripheral edge 109 of the fin chip 107, with one opening serving as the inlet and the other serving as the outlet. In one embodiment, the peripheral edges of the fin chip 107 have a contour of a half V-notch wedge, a full V-notch wedge, or a trapezoidal wedge formed by a chemical etching process. In one embodiment, at least one of the primary surfaces and the peripheral edges is at least partially metalized. In one embodiment, the metalized surface is coated with a layer of copper. In another embodiment, the metalized surface is coated with a layer of TiW/Ni/Au. The fin chip 107 is made of a non-metal material. In one embodiment, the fin chip 107 is made from a single-crystal silicon wafer. In another embodiment, the fin chip 107 is made from a multi-crystal silicon wafer. In yet another embodiment, the fin chip 107 is made of a silicon-based material. Although four fluid channels 108 are shown in FIG. 39, there may be more or fewer fluid channels 108 in other embodiments.

Figure 40:
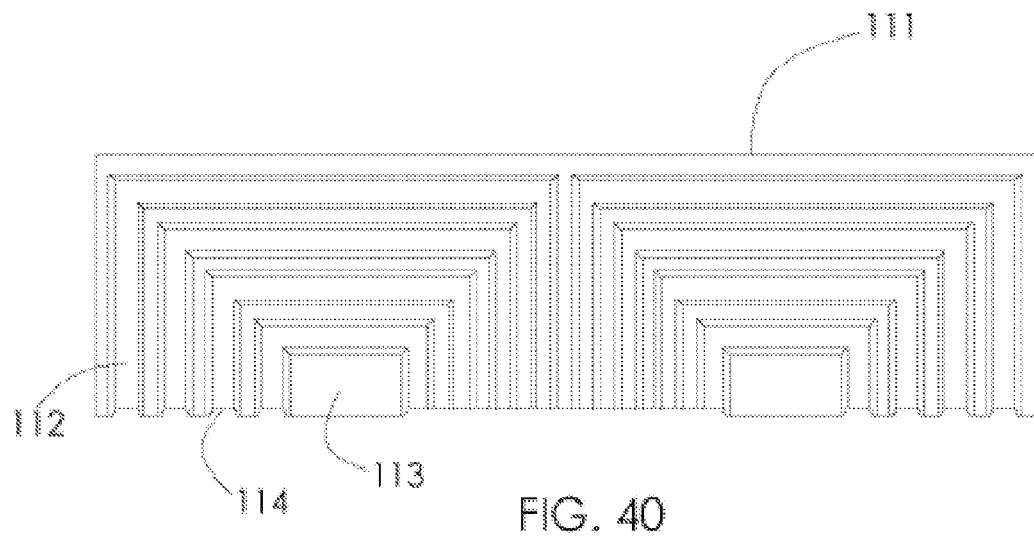
FIG. 40 is a diagram showing a perspective view of a first side of a fin chip having two sets of U-shaped fluid channels according to one non-limiting illustrated embodiment.

FIG. 40 illustrates a perspective view of a first side of a fin chip 111 having two sets of U-shaped fluid channels 112 according to one non-limiting illustrated embodiment. In one embodiment, one of the two primary surfaces of the fin chip 111, primary surface 113, is etched to have recessed portions that form two sets of U-shaped fluid channels 112 having a thin wall, as shown in FIG. 40. The etching process may be a conventional silicon micro-machining method to make deep etched grooves. In one embodiment, the fin chip 111 is chemically etched to have a thin wall thickness where a fluid channel 112 is located. In one embodiment, the thickness of the thin wall at the recessed portions of the fin chip 111 is less than 200 microns. In one embodiment, the thickness of the thin wall at the recessed portions of the fin chip 111 is within the range of 10 microns to 200 microns. Each of the fluid channels 112 has two openings on the peripheral edge 114 of the fin chip 111, with one opening serving as the inlet and the other serving as the outlet. In one embodiment, the peripheral edges of the fin chip 111 have a contour of a half V-notch wedge, a full V-notch wedge, or a trapezoidal wedge formed by a chemical etching process. In one embodiment, at least one of the primary surfaces and the peripheral edges is at least partially metalized. In one embodiment, the metalized surface is coated with a layer of copper. In another embodiment, the metalized surface is coated with a layer of TiW/Ni/Au. The fin chip 111 is made of a non-metal material. In one embodiment, the fin chip 111 is made from a single-crystal silicon wafer, a multi-crystal silicon wafer, another silicon-based material. Although two sets of four fluid channels 112 are shown in FIG. 39, there may be more or fewer fluid channels 112 in each set in other embodiments.

Figure 41:
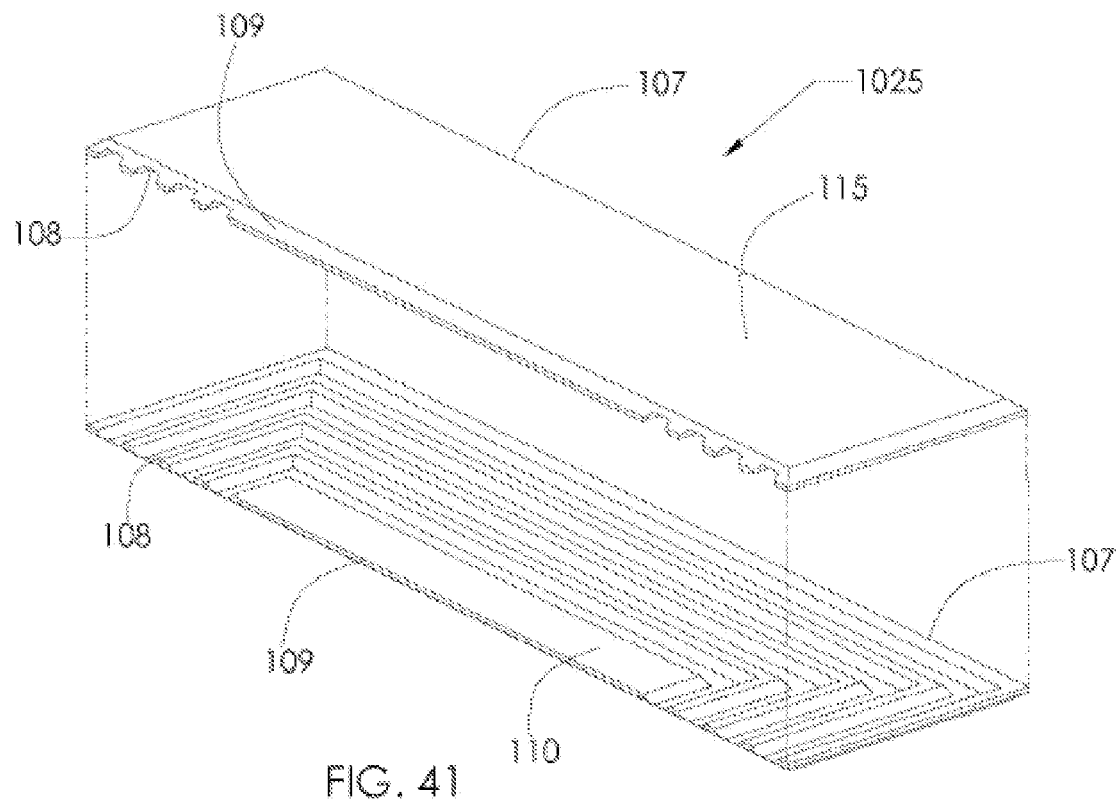
FIGS. 41-42 are each a diagram showing an assembly of two fin chips of FIG. 39 to form a fin module according to one non-limiting illustrated embodiment.
Figure 42:
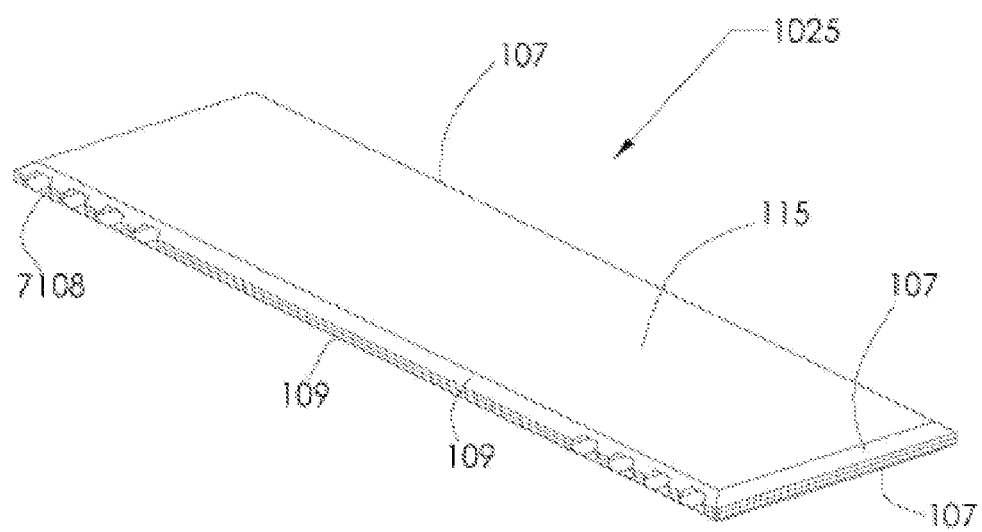

FIGS. 41-42 are each a diagram showing an assembly of two fin chips of FIG. 39 to form a fin structure according to one non-limiting illustrated embodiment. FIG. 41 illustrates an assembly view of two fin chips 107 of FIG. 39 to form a fin module 1025 according to one non-limiting illustrated embodiment. As shown in FIG. 41, two pieces of fin chips 107 are bonded together at the respective primary surface 110, with the respective peripheral edge 109 adjacent to one another, to form the fin module 1025. The bonding of the two fin chips 107 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 42 illustrates a perspective view of the fin module 1025 having internal fluid channels 7108 following the assembly depicted in FIG. 41. Although FIGS. 41-42 illustrate the bonding of two fin chips 107 to form the fin module 1025, in one embodiment, the fin module 1025 is formed by bonding two fin chips 111 of FIG. 40. In one embodiment, each of the internal fluid channels 7108 has a cross-sectional area that ranges between 0.004 square millimeters and 10 square millimeters.

Figure 43:
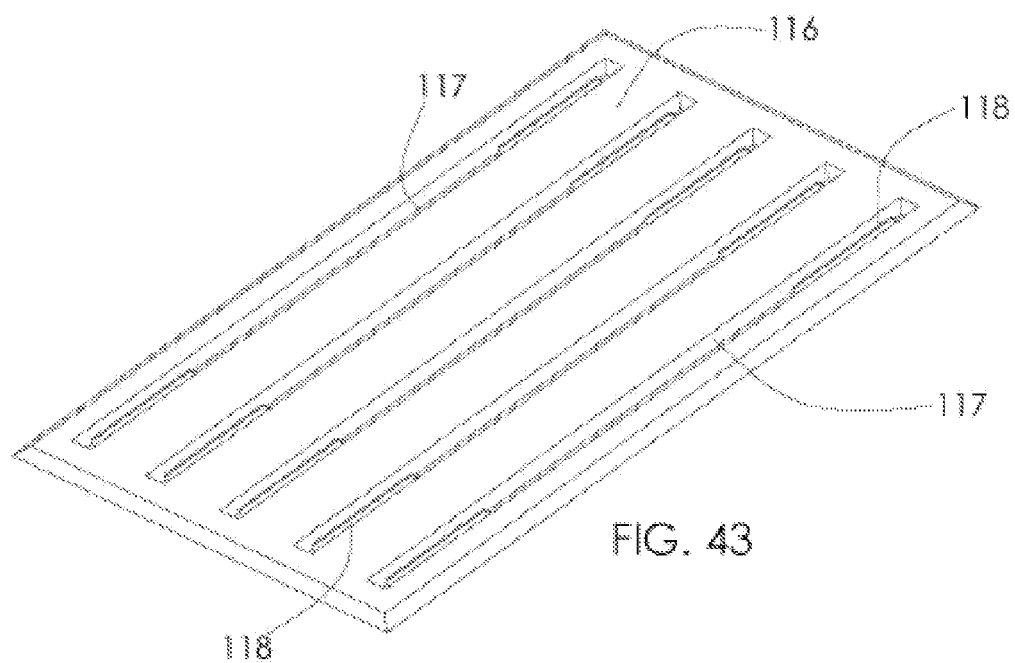
FIGS. 43-44 are each a diagram showing a respective view of a base plate that has multiple grooves and openings in the grooves according to one non-limiting illustrated embodiment.
Figure 44:
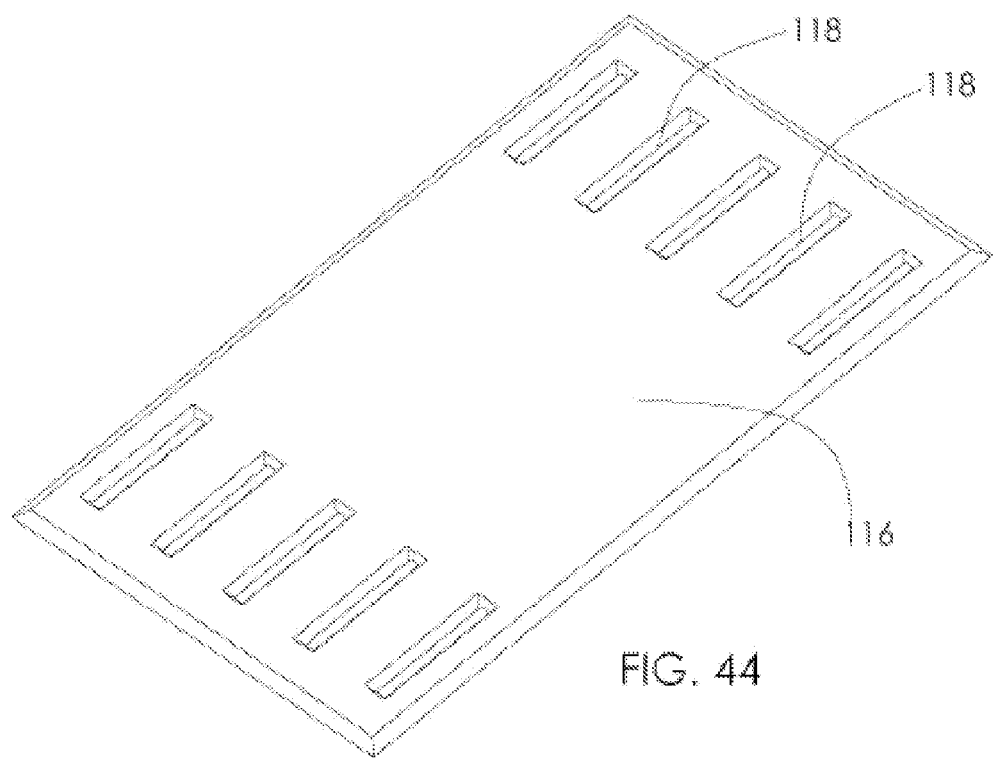

FIGS. 43-44 are each a diagram showing a respective view of a base plate that has multiple grooves and openings in the grooves according to one non-limiting illustrated embodiment. FIG. 43 illustrates a perspective view of a first side of a base plate 116 that has multiple grooves 117 and openings 118 in the grooves 117. The base plate 116 is made of a non-metal material. In one embodiment, the base plate 116 is made from a single-crystal silicon wafer. In another embodiment, the base plate 116 is made from a multi-crystal silicon wafer. In yet another embodiment, the base plate 116 is made of a silicon-based material. Although there are five grooves 117 on the base plate 116 as shown in FIG. 43, the number of the grooves 117 may vary in other embodiments. Although there are two openings 118 in each groove 117 as shown in FIG. 43, the number of the openings 118 in each groove 117 may vary in other embodiments. FIG. 44 illustrates a perspective view of a second side of the base plate 116 of FIG. 43.

Figure 45:
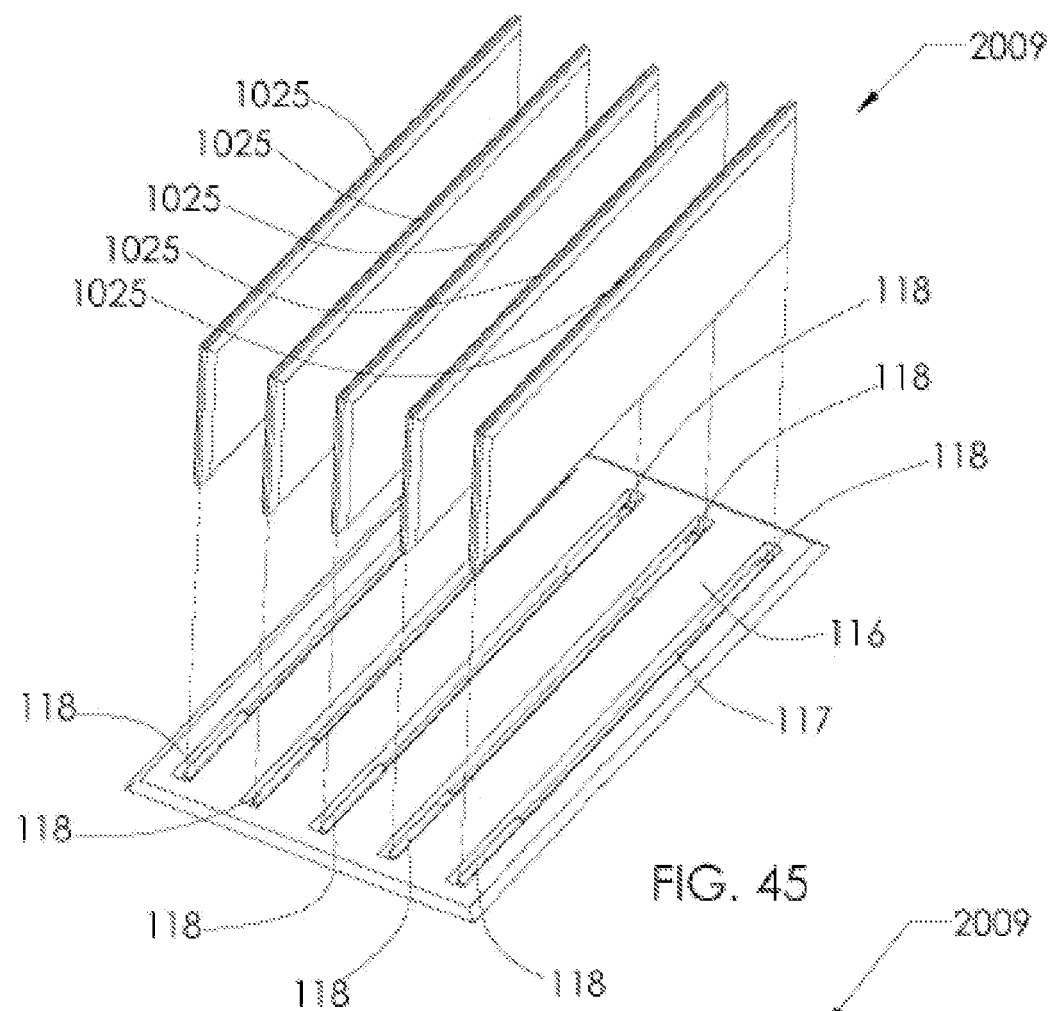
FIGS. 45-46 are each a diagram showing an assembly of a plurality of the fin modules of FIG. 42 attached to the base plate of FIG. 43 according to one non-limiting illustrated embodiment.
Figure 46:
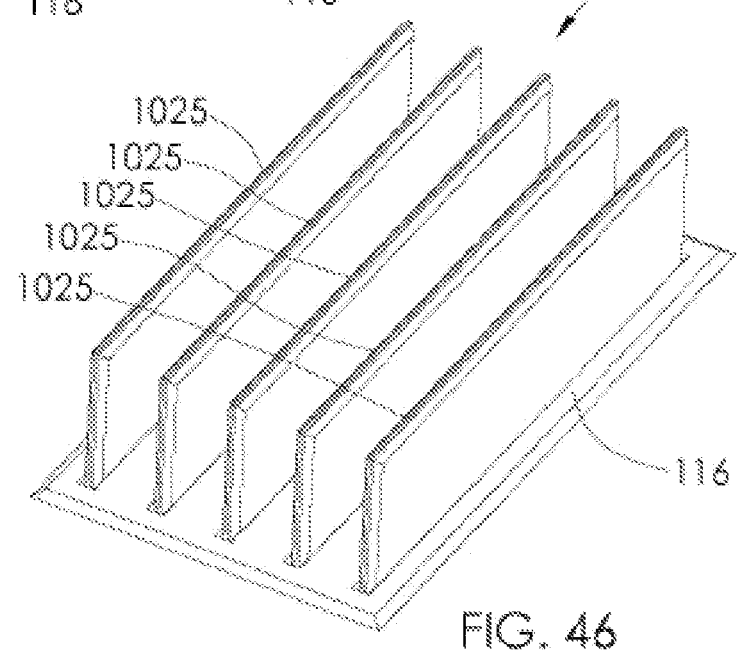

Each of FIGS. 45-46 illustrates an assembly of a plurality of the fin modules of FIG. 42 attached to the base plate of FIG. 43 according to one non-limiting illustrated embodiment. FIG. 45 illustrates an assembly view of a plurality of the fin modules 1025 attached to the base plate 116. In one embodiment, either one or both of the edge of at least one of the fin modules 1025 and the corresponding groove 117 of the base plate 116 are at least partially metalized to facilitate bonding. In one embodiment, the metalized surface is coated with a layer of copper. In another embodiment, the metalized surface is coated with a layer of TiW/Ni/Au. In one embodiment, the bonding between the fin module 1025 and the groove 117 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. FIG. 46 illustrates a perspective view of an assembly 2009 formed by the fin structures 1025 and the base plate 116 following the assembly depicted in FIG. 45.

Each of FIGS. 47-47B illustrates a cross-sectional view of the assembly of FIG. 46 according to one non-limiting illustrated embodiment. FIG. 47 illustrates a cross sectional view of the assembly 2009 along a plane that is parallel to a primary surface of one of the fin modules 1025. A fluid, such as a liquid or gas, can enter a fin module 1025 through one end of the respective internal fluid channels 7108 and exit the fin module 1025 through the other end of the respective internal fluid channels 7108. When a fluid flows through the internal fluid channels 7108, thermal energy contained in the fluid can dissipate, thus cooling down the fluid, at least by convection and radiation through the respective fin module 1025 to an ambient fluid surrounding the fin module 1025, such as ambient air. FIG. 47A illustrates a cross-sectional view of the assembly 2009 along the cross section AA. FIG. 47B illustrates a cross-sectional view of the assembly 2009 along the cross section BB.

Figure 48:
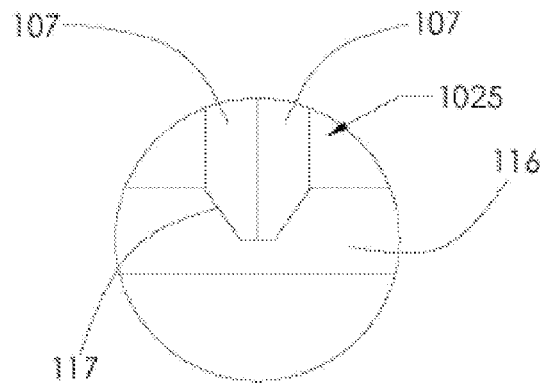
FIGS. 48-51 are each a diagram showing an enlarged view of the interlock between a fin module and a base plate according to one non-limiting illustrated embodiment.
Figure 49:
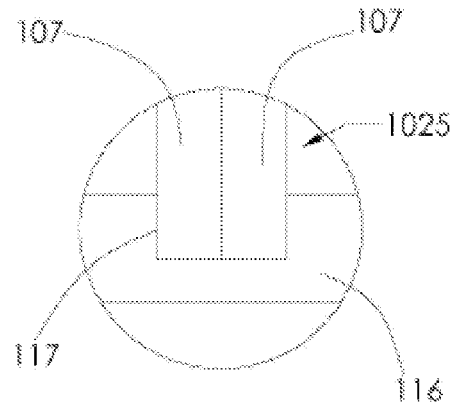
Figure 50:
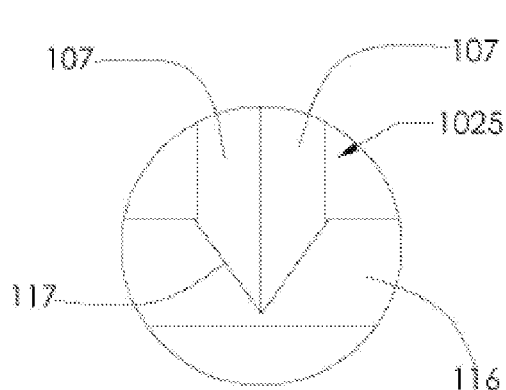
Figure 51:
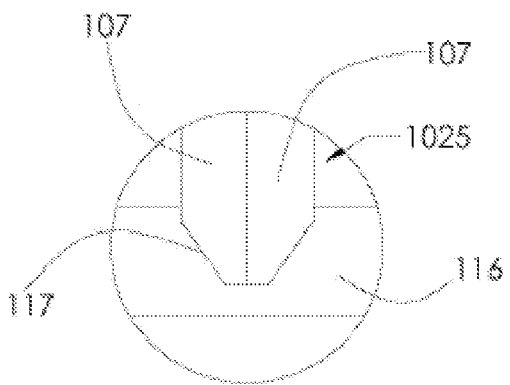

Each of FIGS. 48-51 illustrates an enlarged view of the interlock between a fin module and a base plate according to one non-limiting illustrated embodiment. FIG. 48 illustrates one of the fin modules 1025 interlocked, or attached, to the base plate 116 according to one non-limiting illustrated embodiment. As shown in FIG. 48, the edge of each of the fin chips 107 has a contour of half of a trapezoid to form a trapezoidal wedge contour for the fin module 1025. The groove 117 on the base plate 116 correspondingly has a trapezoidal contour that is substantially complementary to the trapezoidal wedge contour of the edge of the fin module 1025. FIG. 49 illustrates one of the fin modules 1025 attached to the base plate 116 according to another non-limiting illustrated embodiment. As shown in FIG. 49, the edge of each of the fin chips 107 has a contour of half of a rectangle to form a rectangular contour for the fin module 1025. The groove 117 on the base plate 116 correspondingly has a rectangular contour that is substantially complementary to the rectangular wedge contour of the edge of the fin module 1025. FIG. 50 illustrates one of the fin modules 1025 attached to the base plate 116 according to yet another non-limiting illustrated embodiment. As shown in FIG. 50, the edge of each of the fin chips 107 has a contour of half of a V-notch to form a full V-notch wedge contour for the fin module 1025. The groove 117 on the base plate 116 correspondingly has a V-notch contour that is substantially complementary to the V-notch wedge contour of the edge of the fin module 1025. FIG. 51 illustrates one of the fin modules 1025 attached to the base plate 116 according to still another non-limiting illustrated embodiment. As shown in FIG. 51, the edge of each of the fin chips 107 has a contour of half of a trapezoid to form a trapezoidal wedge contour for the fin module 1025. The groove 117 on the base plate 116 correspondingly has a trapezoidal contour that is substantially complementary to the rectangular wedge contour of the edge of the fin module 1025. The difference between FIG. 51 and FIG. 48 is that the groove 117 in FIG. 51 is etched deeper to allow a portion of the primary surfaces of the fin module 1025 to be received in the groove 117 when the fin module 1025 is attached to the base plate 116.

Figure 52:
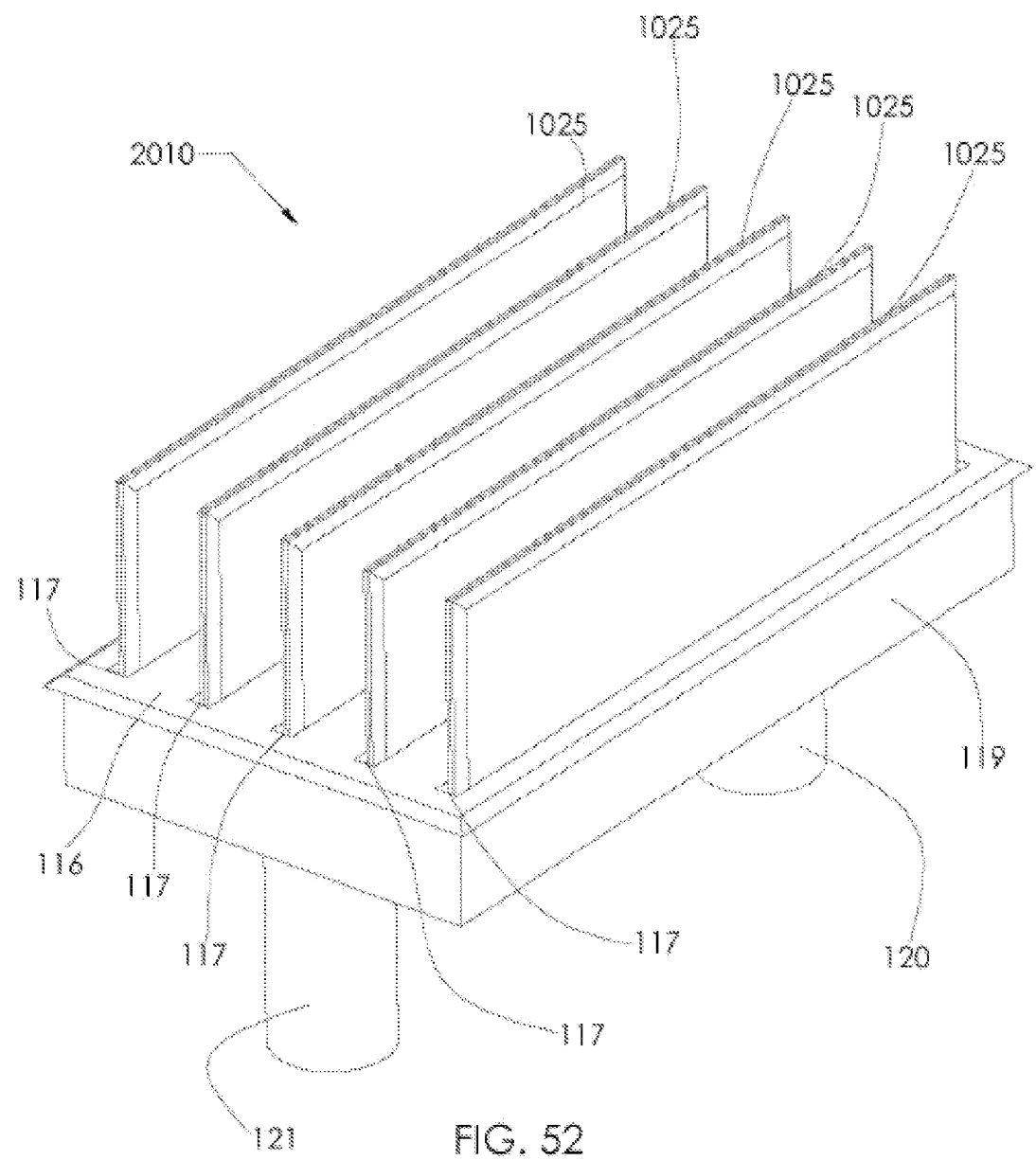
FIG. 52 is a diagram showing a perspective view of a thermal energy transfer apparatus according to one non-limiting illustrated embodiment.

FIG. 52 illustrates a perspective view of a thermal energy transfer apparatus according to one non-limiting illustrated embodiment. As shown in FIG. 52, a thermal energy transfer apparatus 2010 is formed by attaching a plurality of the fin modules 1025 to the base plate 116, which is bonded to a mounting block 119. The mounting block 119 has a plurality of cavities to which connector tubes 120 and 121 are connected to allow a fluid to enter and exit the fin module 1025.

Figure 53:
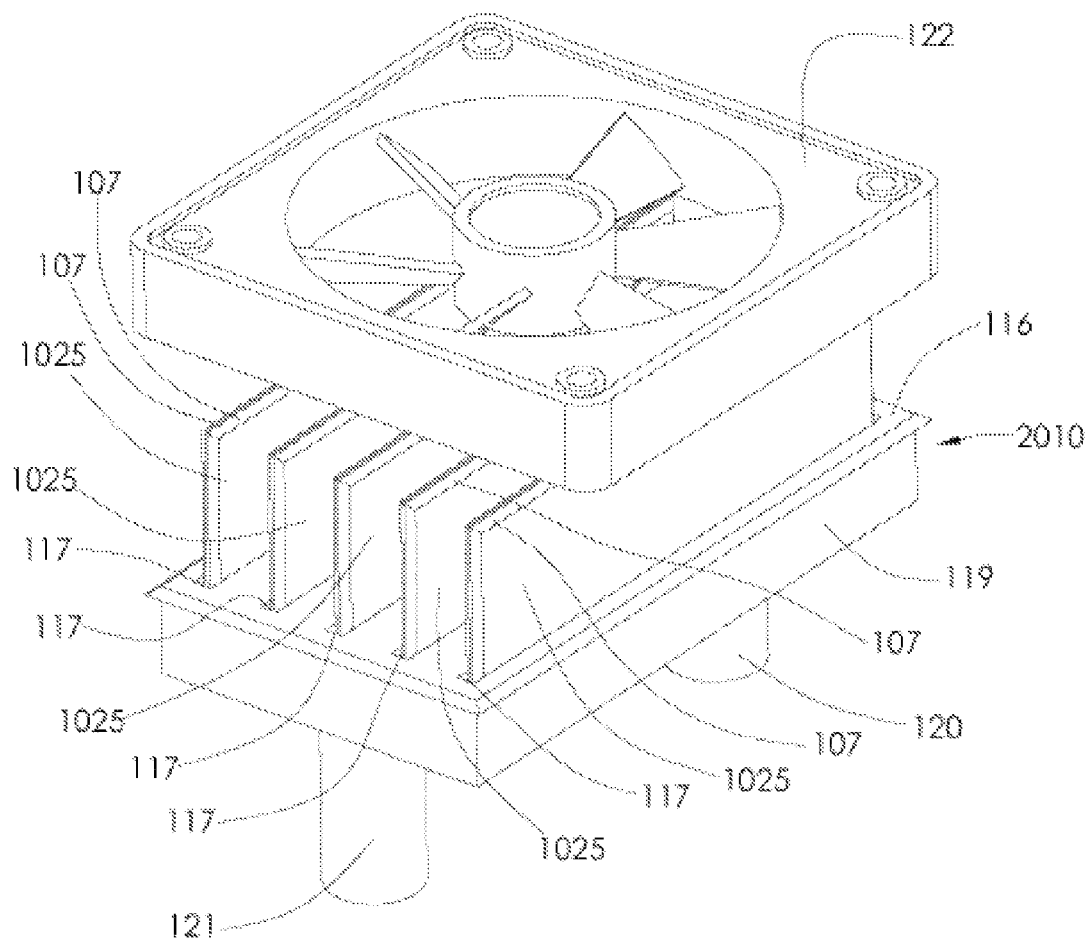
FIG. 53 is a diagram showing a perspective view of the thermal energy transfer apparatus of FIG. 52 with an active cooler according to one non-limiting illustrated embodiment.

FIG. 53 illustrates a perspective view of the thermal energy transfer apparatus 2010 with an active cooler 122 according to one non-limiting illustrated embodiment. In one embodiment, the active cooler 122 is an electric fan. The active cooler 122 is mounted to a fixture and that turbulence in the ambient fluid surrounding the thermal energy transfer apparatus 2010, such as ambient air, caused by the active cooler 122 promotes removal of thermal energy from the fin modules 1025 and the base plate 116 of the thermal energy transfer apparatus 2010. As a result, a fluid is cooled down faster due to the active cooler 122, when the fluid flows through the internal fluid channels of the fin modules 1025, than it would be when there is no active cooler 122.

Figure 54:
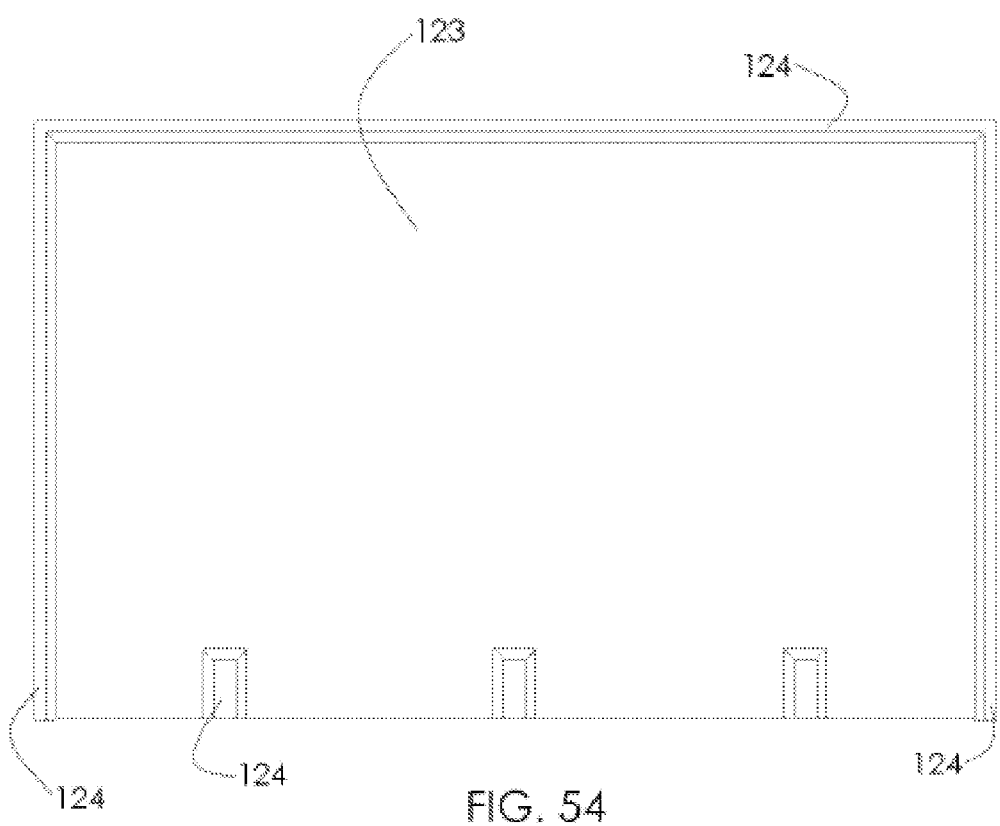
FIG. 54 is a diagram showing a front view of an etched silicon-based fin chip according to one non-limiting illustrated embodiment.

FIG. 54 illustrates a front view of an etched silicon-based fin chip 123 according to one non-limiting illustrated embodiment. As shown in FIG. 54, at least a portion of one of the two primary surfaces of the fin chip 123 is removed, for example, by a deep etching process, leaving a thin wall at the etched portion and a number of non-etched areas 124. In one embodiment, the shape or the size of the non-etched areas 124 depends on the structural strength of the mechanical design of the etched fin chip 123. In another embodiment, the shape or the size of the non-etched areas 124 depends on the cooling geometry of the etched fin chip 123. In one embodiment, the thickness of the thin wall at the etched portion of the fin chip 123 is less than 200 microns. In one embodiment, the thickness of the thin wall at the etched portion of the fin chip 123 is within the range of 10 microns to 200 microns. The primary surface opposite the etched primary surface that is shown in FIG. 54 is not etched. In one embodiment, the fin chip 123 is made from a single-crystal silicon wafer, a multi-crystal silicon wafer, or another silicon-based material.

Figure 55:
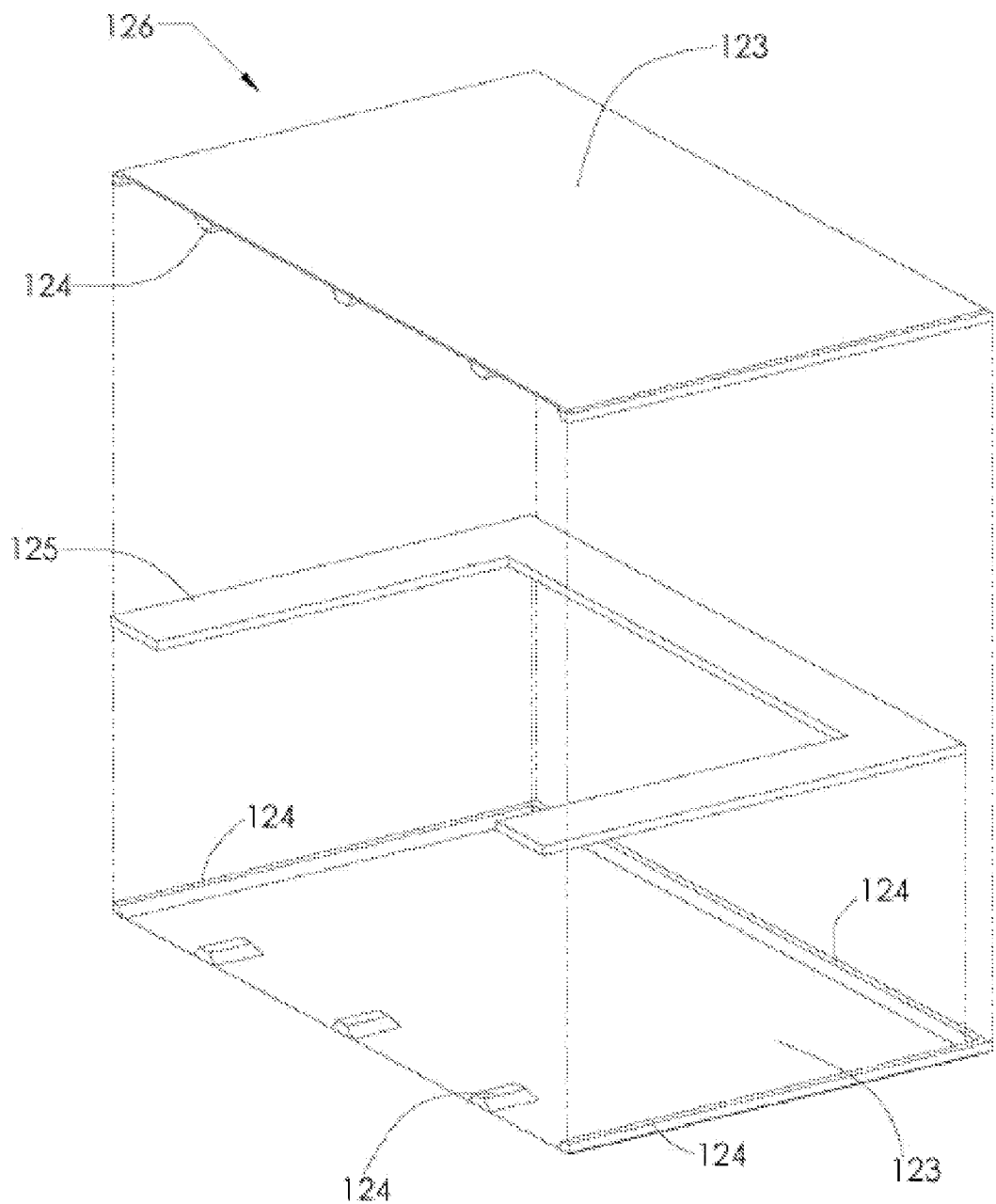
FIG. 55 is a diagram showing an assembly view of two fin chips of FIG. 54 with a wicking structure sandwiched therebetween to form a fin module according to one non-limiting illustrated embodiment.

FIG. 55 illustrates an assembly view of two fin chips 123 of FIG. 54 and a wicking structure 125 according to one non-limiting illustrated embodiment. A fin module 126 is formed by bonding two fin chips 123 at the respective etched primary surface, with the wicking structure 125 sandwiched between the two fin chips 123. The bonding of the two fin chips 123 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding. The wicking structure 125 may be made of a metallic material or a non-metal material. In one embodiment, the wicking structure 125 is a stainless steel mesh. In one embodiment, the wicking structure 125 is a fine groove structure directly etched onto the etched primary surfaces of the two fin chips 123. Accordingly, the fin module 126 has a hollow cavity that can contain a fluid. Thermal energy contained in the fluid can thus be transferred through the fin module 126 to an ambient fluid surrounding the fin module 126, such as ambient air.

Figure 56:
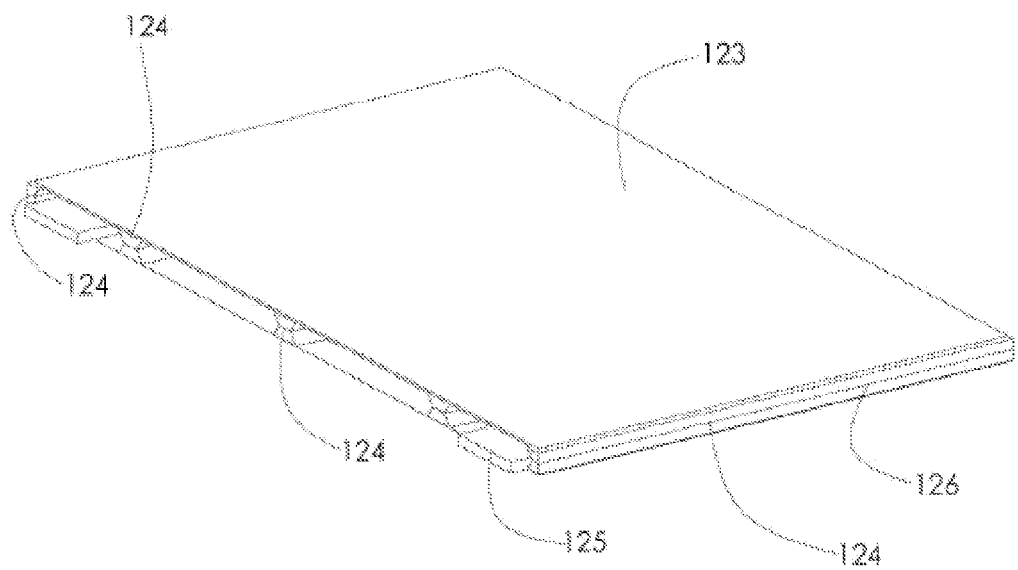
FIG. 56 is a diagram showing a perspective view of an assembly of the fin module following the assembly depicted in FIG. 55 according to one non-limiting illustrated embodiment.

FIG. 56 illustrates a perspective view of the fin module 126 following the assembly depicted in FIG. 55 according to one non-limiting illustrated embodiment. In one embodiment, the non-etched areas 124 of one of the fin chips 123 are bonded to the non-etched areas 124 of the other fin chip 123. In one embodiment, at least a portion of the wicking structure 125 extends out from the hollow cavity of the fin module 126.

Figure 57:
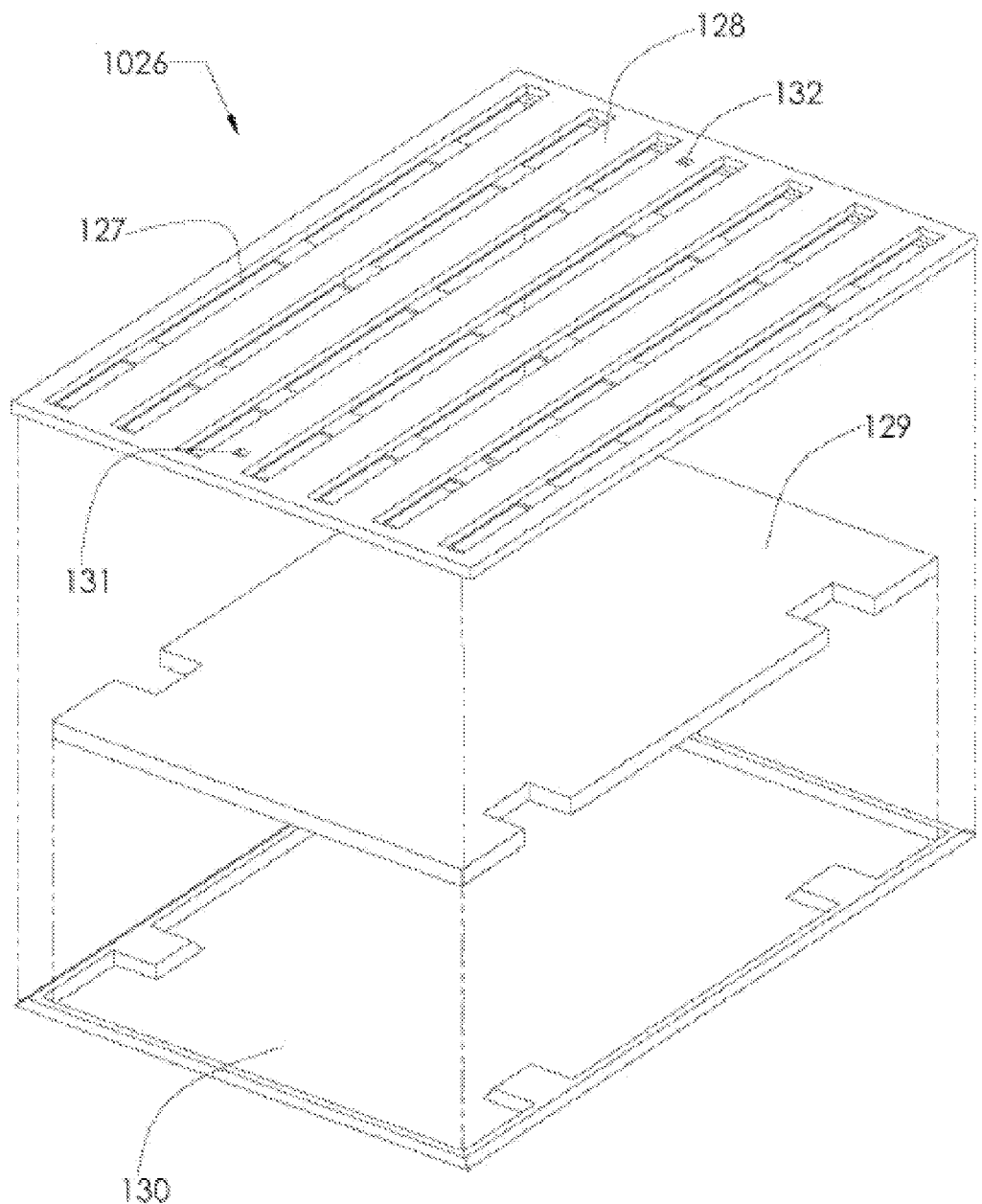
FIG. 57 is a diagram showing an assembly view of an etched silicon-based top plate and an etched silicon-based bottom plate with a wicking structure sandwiched therebetween to form a support module according to one non-limiting illustrated embodiment.

FIG. 57 illustrates an assembly view of an etched silicon-based top plate 128, an etched silicon-based bottom plate 130, and a wicking structure 129 according to one non-limiting illustrated embodiment. A support module 1026 is formed by the top plate 128 bonded with the bottom plate 130 with the wicking structure 129 sandwiched between the top plate 128 and the bottom plate 130. The top primary surface of the top plate 128 is etched to have a plurality of grooves 127, with a number of openings in each of the grooves 127. Although there are seven grooves 127 shown in FIG. 57, there may be more or fewer grooves 127 in other embodiments. At least a portion of the top primary surface of the bottom plate 130 is removed, for example, by a deep etching process, leaving a thin wall at the etched portion. In one embodiment, the thickness of the thin wall at the etched portion of the bottom plate 130 is less than 200 microns. In one embodiment, the thickness of the thin wall at the etched portion of the bottom plate 130 is within the range of 10 microns to 200 microns. In one embodiment, the bottom plate 130 is etched so that the etched portion has a shape to receive the wicking structure 129. The top plate 128 further includes a plurality of filling ports, such as the filling ports 131 and 132, for filling a working fluid, or coolant, into the support module 1026.

In one embodiment, the top plate 128 and the bottom plate 130 are made from a single-crystal silicon wafer, a multi-crystal silicon wafer, or another silicon-based material. The wicking structure 129 may be made of a metallic material or a non-metal material. In one embodiment, the wicking structure 129 is a stainless steel mesh. In one embodiment, the wicking structure 125 is a fine groove structure directly etched onto at least one of the bottom primary surface of the top plate 128 and the top primary surface of the bottom plate 130. The bonding of the top plate 128 and the bottom plate 130 may be done by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding.

Figure 58:
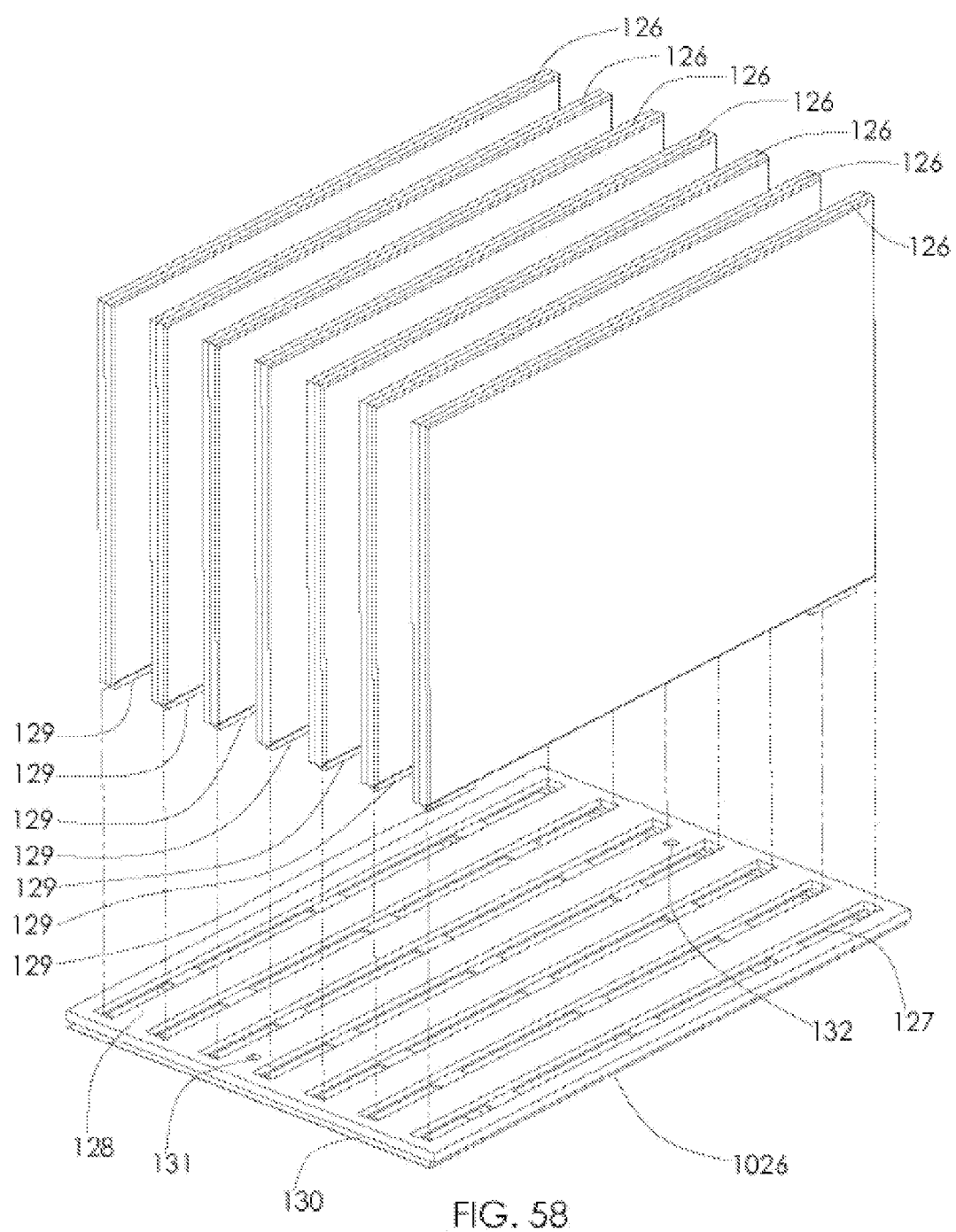
FIG. 58 is a diagram showing an assembly view of a plurality of the fin module of FIG. 56 and the support module of FIG. 57 according to one non-limiting illustrated embodiment.

FIG. 58 illustrates an assembly view of a plurality of the fin modules 126 of FIG. 56 and the support module 1026 of FIG. 57 according to one non-limiting illustrated embodiment. A plurality of fin modules 126 are attached to the support module 1026 by bonding. In particular, each of the fin modules 126 is received in a respective groove 127 of the top plate 128 of the support module 1026. In one embodiment, any portion of the wicking structure 129 that extends out from the fin module 126 is also received in the groove 127. In one embodiment, the fin modules 126 are attached substantially orthogonally to the support module 1026. In one embodiment, either one or both of the edge of at least one of the fin modules 126 and the corresponding groove 127 of the top plate 128 of the support module 1026 are at least partially metalized to facilitate bonding. In one embodiment, the metalized surface is coated with a layer of copper. In another embodiment, the metalized surface is coated with a layer of TiW/Ni/Au. In one embodiment, the bonding between the fin module 126 and the corresponding groove 127 is by at least one of metal soldering, epoxy bonding, diffusion bonding, eutectic bonding or anodic bonding, or any combination thereof. In one embodiment, the bonding is silicon-to-silicon diffusion bonding. In another embodiment, the bonding is silicon-gold-silicon eutectic bonding. In yet another embodiment, the bonding is silicon-glass-silicon anodic bonding.

Figure 59:
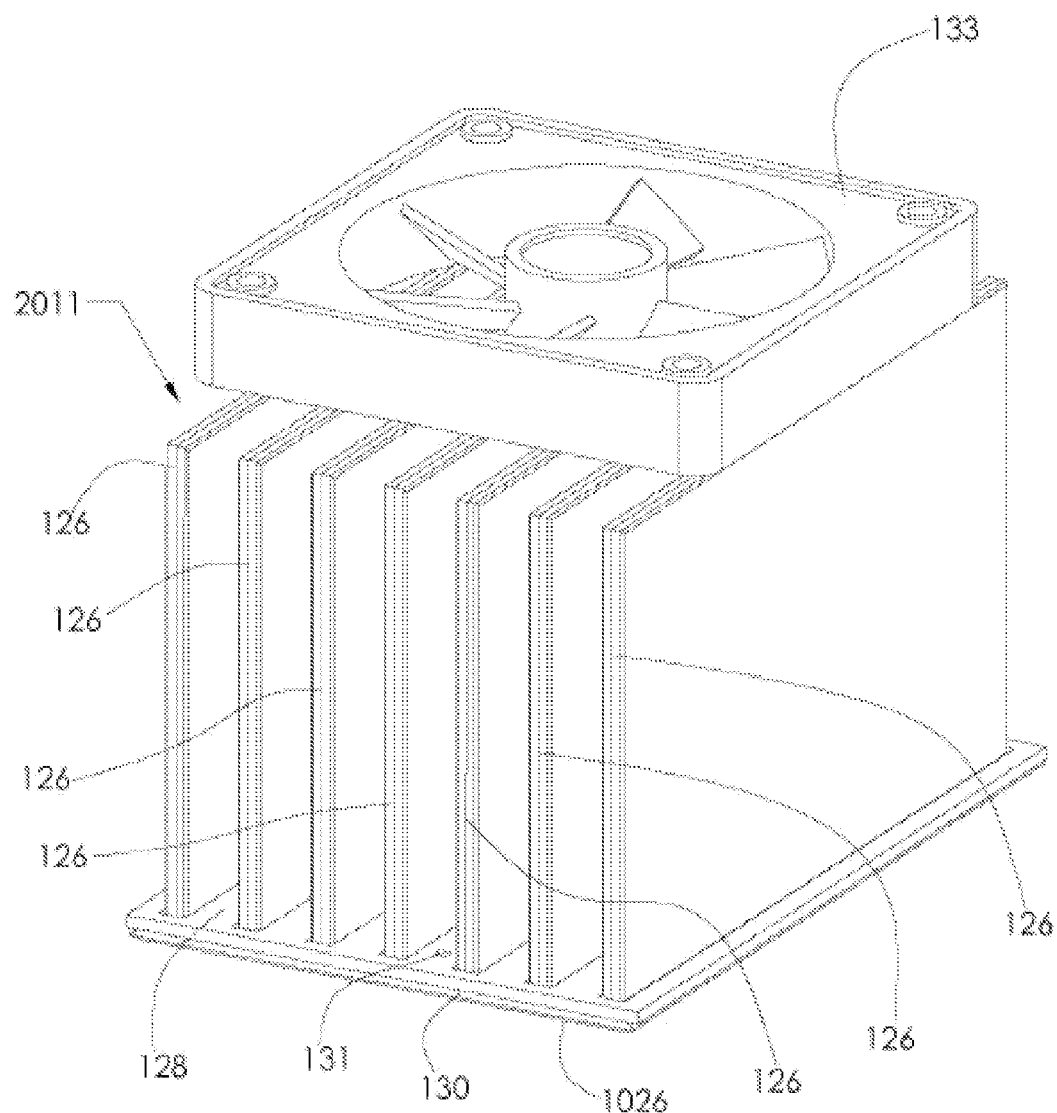
[FIG. 59 is a diagram showing a perspective view of a thermal energy transfer apparatus that includes a silicon-based heat pipe device and an active cooler according to one non-limiting illustrated embodiment.

FIG. 59 illustrates a perspective view of a thermal energy transfer apparatus 2011 according to one non-limiting illustrated embodiment. The thermal energy transfer apparatus 2011 includes an active cooler 133 and a silicon-based heat pipe formed by the assembly of a plurality of fin modules 126 attached to the support module 1026, as shown in FIG. 58. In one embodiment, the active cooler 133 is an electric fan.

Figure 60:
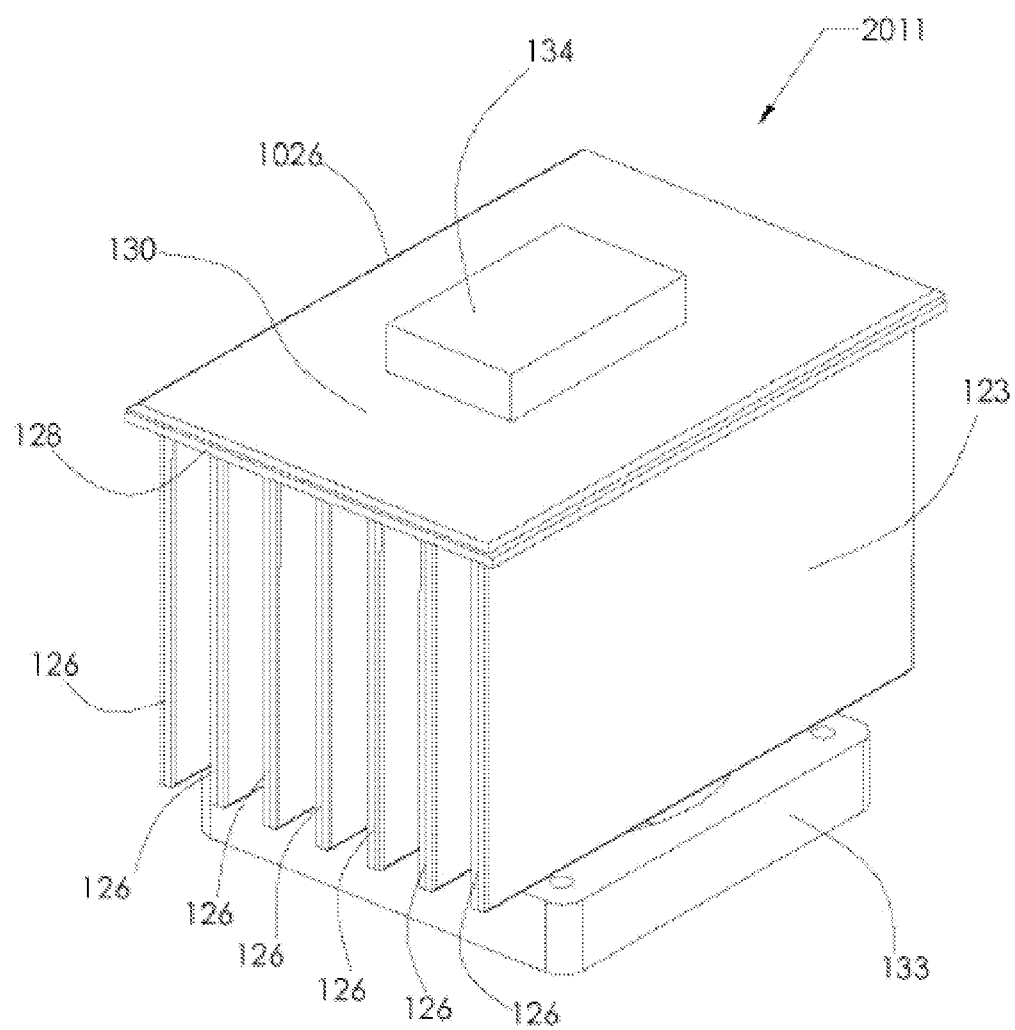
FIG. 60 is a diagram showing a perspective view of the thermal energy transfer apparatus of FIG. 59 with a heat-generating object attached thereto according to one non-limiting illustrated embodiment.

FIG. 60 illustrates a perspective view of the thermal energy transfer apparatus 2011 of FIG. 59 with a heat-generating object 134 attached thereto according to one non-limiting illustrated embodiment. As the heat-generating object 134 is attached to the support module 1026 of the thermal energy transfer apparatus 2011, a majority of the heat generated by the heat-generating object 134 typically propagates through the support module 1026 to the wicking structure 129 in each of the fin modules 126 and to a working fluid contained in the support module 1026. Upon absorbing the heat, at least some the working fluid boils and turns into a gas. The gaseous working fluid is cooled as the heat is transferred to the ambient air through the fin modules 126 with the aid of the active cooler 133. As the working fluid cools, it condenses in the fin modules 126 and turns into a liquid. Thus, the unique and non-obvious design of the silicon-based heat pipe just described advantageously provides a highly-efficient heat transfer system as well as a compact form factor.

Figure 61:
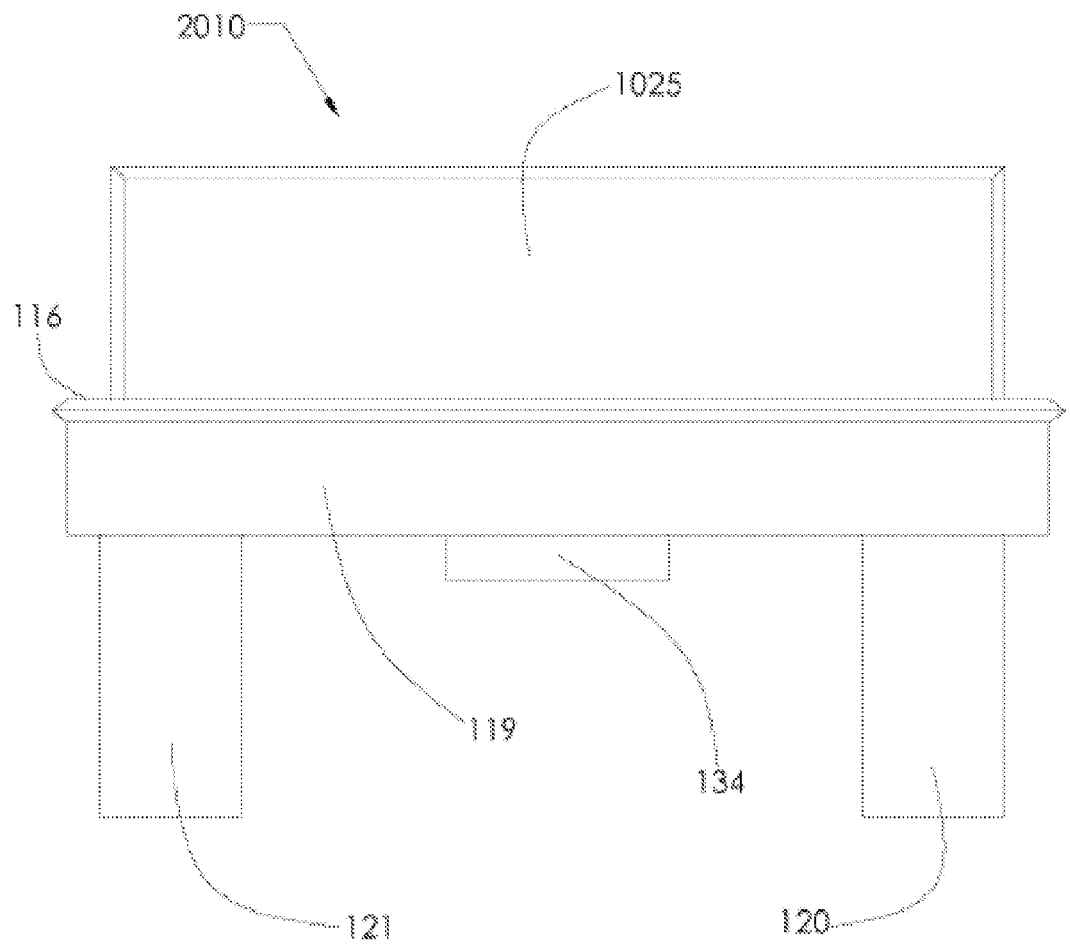
FIG. 61 is a diagram showing a side view of a thermal energy transfer apparatus with a heat-generating object attached thereto according to another non-limiting illustrated embodiment.

FIG. 61 illustrates a side view of the thermal energy transfer apparatus 2010 with the heat-generating object 134 attached thereto according to another non-limiting illustrated embodiment. In one embodiment, the thermal energy transfer apparatus 2010 is a silicon-based heat exchanger in that the fin modules 1025, the base plate 116, and the mounting block 119 are each made of a silicon-based material. A working fluid or coolant is circulated through one of the input port 121 or the exit port 120, vise verse, to remove the thermal energy from the heat generating object 134. The heat-generating object 134 may be attached to at least one of the fin modules 1025 or to the mounting block 119, as shown in FIG. 61. In one embodiment, when the thermal energy transfer apparatus 2010 is a silicon-based heat exchanger, the heat-generating object 134 is attached to at least one of the fin modules 1025. A majority of the heat generated by the heat-generating object 134 is transferred at least conductively to the fin module 1025, and then is transferred at least convectively to the working fluid in the internal fluid channel as the heat propagates through the etched thin wall of the fin module 1025. In one embodiment, when the heat-generating object 134 is attached to the mounting block 119 of the thermal energy transfer apparatus 2010, a majority of the heat generated by the heat-generating object 134 typically propagates to the fin modules 1025 through the mounting block 119 and the base plate 116. Heat in the fin modules 1025 is then dissipated to a working fluid, or coolant, flowing through the fin modules 1025 and to the ambient air.

Figure 62:
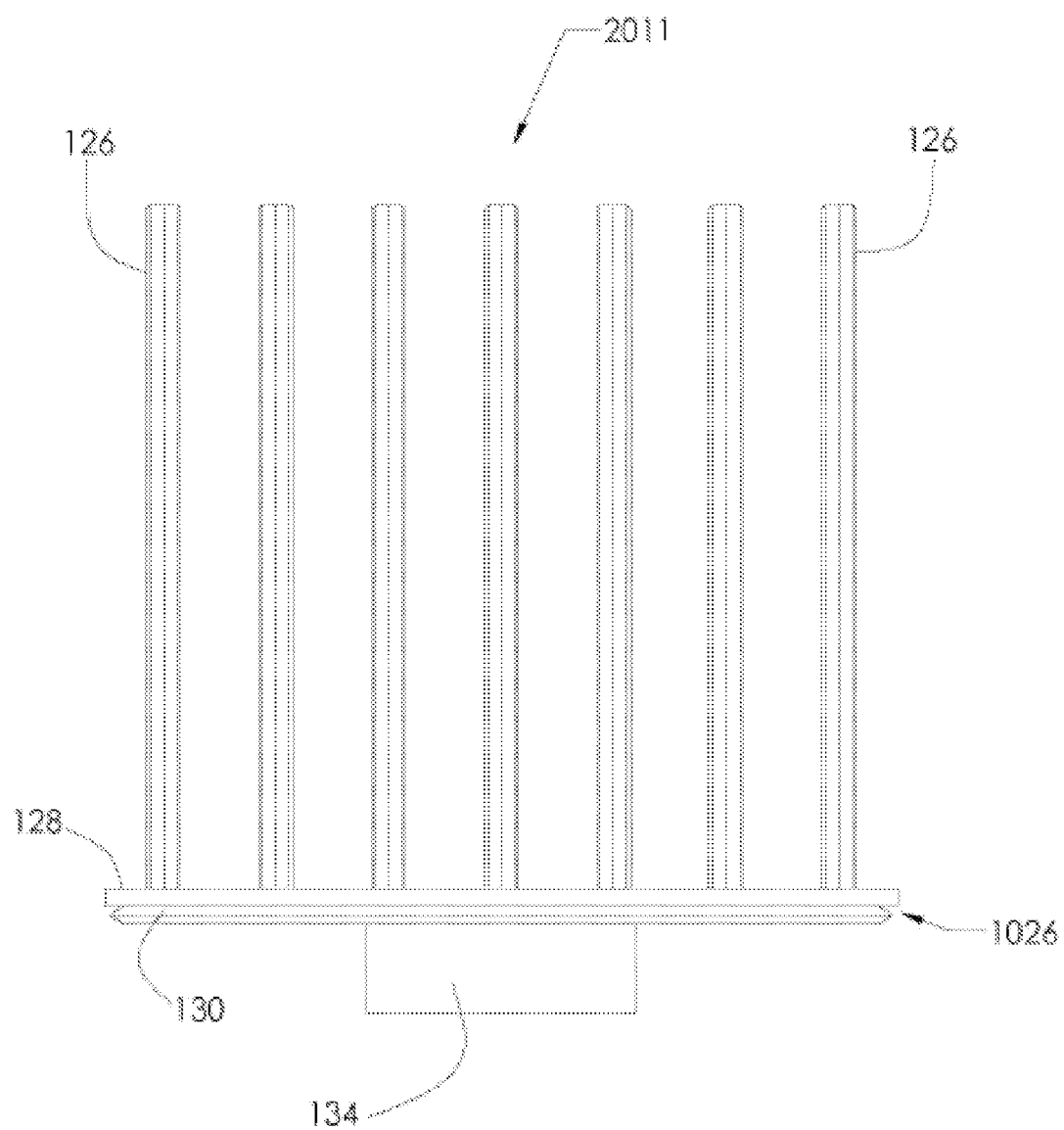
FIG. 62 is a diagram showing a side view of a thermal energy transfer apparatus with a heat-generating object attached thereto according to yet another non-limiting illustrated embodiment.

FIG. 62 illustrates a side view of the thermal energy transfer apparatus 2011 with the heat-generating object 134 attached thereto according to yet another non-limiting illustrated embodiment. In this embodiment, the thermal energy transfer apparatus 2011 includes a heat pipe formed by the fin modules 126 and the support module 1026, but does not include an active cooler.

Thus, embodiments of the present disclosure include design schemes for a three-dimensional stackable non-metal, e.g., silicon-based, structure with interlocking V-notch grooves, with or without internal fluid channels for removal of high-density thermal energy. The proposed structure in some embodiments is precisely etched in a single- or multi-crystal silicon wafer. This scheme allows one to exploit the high accuracy and cost-effectiveness of silicon micromachining technology. The cost-effectiveness of this scheme is due in part to the fact that the V-notch groove structure allows mass production with a large wafer size. The large-size wafer can also be processed in batch mode for high volume production.

The precision alignment tolerance for building V-notch groove, V-notch derived groove or rectangular groove for interlocking also supports the construction of cooling fluid channels. This results in the ability to create multi-layered electronic packages for removing high-density heat from energy intensive devices used in the photonics, microprocessor, graphic chip, memory chip, and solar cell industries, for example. Since the V-notch groove interlocking components can be etched in large numbers, these cooling component packages can also be built in high volume production. This lowers the cost of each component and can yield a high and reliable output due to the high precision manufacturing and simple assembly.

One example of a high heat application is the cooling of laser diode bars in the photonics industry. A typical laser diode bar produces more than 1 kW per centimeter square of thermal energy that needs to be removed. The embodiments proposed herein can be implemented to remove the excess heat from a stack of laser diode bars. Another example involves computer microprocessor chips. As these microprocessor chips operate, a significant amount of thermal energy is generated. Again, the embodiments proposed herein can effectively remove this excess energy. In the solar cell industry, as another example, the embodiments proposed herein can remove the hundreds of watts of solar energy focused per square centimeter, allowing for smaller solar cells and an overall lowering of the cost of each solar cell.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other context, not necessarily the exemplary context of silicon-based heat transfer device generally described above.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. A thermal energy transfer device attached to an object to dissipate thermal energy from the object, comprising:

a non-metal base plate having a first primary surface and a second primary surface opposite the first primary surface, the base plate including at least one groove on the first primary surface; and a non-metal plate structure having a first primary surface, a second primary surface opposite the first primary surface, and a plurality of edges that are between the first and the second primary surfaces, the first plate structure attached to the base plate with a first edge of the plurality of edges received in a first groove of the at least one groove of the base plate, wherein at least one of the primary surfaces of the plate structure has a recessed area configured to receive the object, and wherein the at least one of the primary surfaces of the plate structure having the recessed area has at least one groove extending from the recessed area to one of the edges of the plate structure.

2. The device of claim 1, wherein the plate structure is attached to the base plate by epoxy bonding, eutectic bonding, anodic bonding, or diffusion bonding.

3. The device of claim 1, wherein at least one of the base plate and the plate structure is made from a silicon-based material.

4. The device of claim 1, wherein at least one of the base plate and the plate structure is made from a ceramic material.

5. The device of claim 1, wherein at least one of the first edge of the plate structure and the first groove of the base plate is at least partially metalized.

6. The device of claim 1, wherein at least one of the first primary surface, the second primary surface, and one of the edges of the plate structure is at least partially metalized.

7. The device of claim 1, wherein the first groove of the base plate has a cross-sectional contour resembling a V-notch, and wherein the first edge of the plate structure has a cross-sectional contour that is substantially complementary to the cross-sectional contour of the first groove.

8. The device of claim 1, wherein the first primary surface and the second primary surface of the plate structure are substantially parallel to one another, and wherein the plate structure is attached to the base plate at an angle of substantially 90 degrees between the first primary surface of the plate structure and the first primary surface of the base plate.

9. The device of claim 1, wherein the plate structure includes at least one internal fluid channel through which a fluid enters and exists the plate structure, the at least one internal fluid channel having at least one inlet and at least one outlet on the first edge, and wherein the base plate includes at least one inlet opening and at least one outlet opening in the first groove that are respectively aligned with the at least one inlet and the at least one outlet on the first edge of the plate structure when the first edge of the plate structure is received in the first groove of the base plate.

10. The device of claim 9, wherein a wall thickness between a surface of the internal fluid channel closest to the first primary surface of the plate structure and the first primary surface of the plate structure is less than 200 microns, and a wall thickness between a surface of the internal fluid channel closest to the second primary surface of the plate structure and the second primary surface of the plate structure is less than 200 microns.

11. The device of claim 9, wherein the internal fluid channel has a cross-sectional area that ranges between 0.004 square millimeters and 10 square millimeters.

12. The device of claim 9, wherein the plate structure includes a first chip and a second chip, each of the first chip and the second chip having recessed portions to form the internal fluid channel when the first and the second chips are bonded to form the plate structure.

13. The device of claim 12, wherein the first chip and the second chip are bonded by metal soldering, epoxy bonding, eutectic bonding, anodic bonding, or diffusion bonding.

14. The device of claim 1, further comprising:
a second non-metal plate structure having a first primary surface, a second primary surface opposite the first primary surface, and a plurality of edges that are between the first and the second primary surfaces including a first edge, the second plate structure attached to the base plate with the first edge received in a second groove of the at least one groove of the base plate.

15. The device of claim 14, wherein the plate structure and the second plate structure are spaced apart by a distance when attached to the base plate that allows the object to be sandwiched between and in contact with one of the primary surfaces of the plate structure and one of the primary surfaces of the plate structure.

* * * * *